(12) United States Patent
Shin et al.

(10) Patent No.: US 11,502,084 B2
(45) Date of Patent: Nov. 15, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Joongchan Shin, Seoul (KR); Changkyu Kim, Suwon-si (KR); Hui-Jung Kim, Seongnam-si (KR); Iljae Shin, Seongnam-si (KR); Taehyun An, Seoul (KR); Kiseok Lee, Hwaseong-si (KR); Eunju Cho, Gyeongsangbuk-do (KR); Hyungeun Choi, Suwon-si (KR); Sung-Min Park, Seongnam-si (KR); Ahram Lee, Suwon-si (KR); Sangyeon Han, Suwon-si (KR); Yoosang Hwang, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 9 days.

(21) Appl. No.: 16/986,367

(22) Filed: Aug. 6, 2020

(65) Prior Publication Data
US 2021/0125989 A1    Apr. 29, 2021

(30) Foreign Application Priority Data

Oct. 29, 2019  (KR) .................. 10-2019-0135889

(51) Int. Cl.
*H01L 27/108*     (2006.01)
*H01L 23/528*     (2006.01)
*H01L 21/822*     (2006.01)

(52) U.S. Cl.
CPC .... *H01L 27/10802* (2013.01); *H01L 21/8221* (2013.01); *H01L 23/528* (2013.01);
(Continued)

(58) Field of Classification Search
CPC ............... H01L 21/8221; H01L 23/528; H01L 23/5283; H01L 27/10802; H01L 27/10805; H01L 27/10847; H01L 27/10873
See application file for complete search history.

(56) References Cited

U.S. PATENT DOCUMENTS 8,564,057 B1 * 10/2013 Darwish ............. H01L 29/0847
                                                     257/334
9,230,985 B1 *  1/2016 Wu .................... H01L 29/66742
                        (Continued)

FOREIGN PATENT DOCUMENTS

KR   10-2019-0060251 A    6/2019
KR   10-2020-0015177 A    2/2020
KR   10-2021-0002775 A    1/2021

*Primary Examiner* — Matthew E Warren
(74) *Attorney, Agent, or Firm* — Lee IP Law, P.C.

(57) ABSTRACT

A three-dimensional semiconductor memory device includes first semiconductor patterns, which are vertically spaced apart from each other on a substrate, each of which includes first and second end portions spaced apart from each other, and first and second side surfaces spaced apart from each other to connect the first and second end portions, first and second source/drain regions disposed in each of the first semiconductor patterns and adjacent to the first and second end portions, respectively, a channel region in each of the first semiconductor patterns and between the first and second source/drain regions, a first word line adjacent to the first side surfaces and the channel regions and vertically extended, and a gate insulating layer interposed between the first word line and the first side surfaces. The gate insulating layer may be extended to be interposed between the first source/drain regions.

19 Claims, 73 Drawing Sheets

(52) U.S. Cl.
CPC .... *H01L 23/5283* (2013.01); *H01L 27/10805* (2013.01); *H01L 27/10847* (2013.01); *H01L 27/10873* (2013.01)

(56) References Cited

U.S. PATENT DOCUMENTS

| | | | |
|---|---|---|---|
| 9,490,017 B2* | 11/2016 | Chang | G11C 16/0483 |
| 10,157,926 B2 | 12/2018 | Yang et al. | |
| 10,157,928 B2 | 12/2018 | Colinge et al. | |
| 2014/0340952 A1 | 11/2014 | Ramaswamy et al. | |
| 2015/0054057 A1 | 2/2015 | Hung et al. | |
| 2016/0351722 A1* | 12/2016 | Zhou | H01L 29/66742 |
| 2018/0204835 A1* | 7/2018 | Or-Bach | H01L 27/11551 |
| 2018/0269229 A1 | 9/2018 | Or-Bach et al. | |
| 2018/0366471 A1 | 12/2018 | Harari et al. | |
| 2019/0006015 A1 | 1/2019 | Norman et al. | |
| 2019/0006376 A1 | 1/2019 | Ramaswamy | |
| 2019/0019553 A1 | 1/2019 | Derner et al. | |
| 2019/0043864 A1 | 2/2019 | Takesako et al. | |
| 2019/0103407 A1 | 4/2019 | Kim et al. | |
| 2019/0164985 A1 | 5/2019 | Lee et al. | |
| 2019/0172840 A1 | 6/2019 | Song et al. | |
| 2019/0206869 A1* | 7/2019 | Kim | H01L 29/45 |
| 2020/0006434 A1* | 1/2020 | Kim | H01L 27/2436 |
| 2020/0043941 A1* | 2/2020 | Kim | H01L 27/10891 |
| 2020/0365583 A1* | 11/2020 | Or-Bach | H01L 23/53214 |
| 2020/0411523 A1 | 12/2020 | Shin et al. | |

\* cited by examiner

THREE-DIMENSIONAL SEMICONDUCTOR MEMORY DEVICE

CROSS-REFERENCE TO RELATED APPLICATION

Korean Patent Application No. 10-2019-0135889, filed on Oct. 29, 2019, in the Korean Intellectual Property Office, and entitled: "Three-Dimensional Semiconductor Memory Device," is incorporated by reference herein in its entirety.

BACKGROUND

1. Field

The present disclosure relates to a three-dimensional semiconductor memory device with an increased integration density.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

According to an embodiment, a three-dimensional semiconductor memory device may include first semiconductor patterns, a first source/drain region, a second source/drain region, a channel region, a first word line, and a gate insulating layer. The first semiconductor patterns may be vertically stacked on a substrate and may be spaced apart from each other. Each of the first semiconductor patterns may include a first end portion and a second end portion, which are spaced apart from each other, and a first side surface and a second side surface, which are spaced apart from each other to connect the first end portion to the second end portion. The first and second source/drain regions may be disposed in each of the first semiconductor patterns and may be respectively disposed adjacent to the first and second end portions. The channel region may be disposed in each of the first semiconductor patterns and may be disposed between the first and second source/drain regions. The first word line may be adjacent to the first side surfaces of the first semiconductor patterns and the channel regions and may be extended in a first direction perpendicular to a top surface of the substrate. The gate insulating layer may be interposed between the first word line and the first side surfaces of the first semiconductor patterns. The gate insulating layer may be extended to be interposed between the first source/drain regions.

According to an embodiment, a three-dimensional semiconductor memory device may include a first semiconductor pattern and a second semiconductor pattern, which are disposed on a substrate and are spaced apart from each other in a first direction, a first word line, which is disposed between the first and second semiconductor patterns and adjacent to the first semiconductor pattern, a second word line, which is disposed between the first and second semiconductor patterns and adjacent to the second semiconductor pattern, and a shielding line, which is disposed between the first and second word lines and is electrically disconnected from the first and second word lines.

According to an embodiment, a three-dimensional semiconductor memory device may include interlayered insulating layers and semiconductor patterns, which are alternately stacked on a substrate, and a word line penetrating the semiconductor patterns and the interlayered insulating layers and being adjacent to the substrate. The word line may include a word line portion, which is vertically extended from a top surface of the substrate, and protruding portions, which protrude from a side surface of the word line portion toward the interlayered insulating layers and are spaced apart from each other.

BRIEF DESCRIPTION OF THE DRAWINGS

Features will become apparent to those of skill in the art by describing in detail exemplary embodiments with reference to the attached drawings, in which:

FIGS. 4A, 5A, and 7A to 12A are plan views of stages in a process of fabricating the three-dimensional semiconductor memory device in FIG. 3A.

FIGS. 4B, 5B, and 7B to 12B illustrate cross-sectional views along lines A-A', B-B', and C-C' of FIGS. 4A, 5A, and 7A to 12A, respectively.

FIGS. 15A to 19A illustrate plan views of stages in a process of fabricating the three-dimensional semiconductor memory device in FIG. 14A.

FIGS. 15B to 19B illustrate cross-sectional views along lines A-A', B-B', and C-C' of FIGS. 15A to 19A, respectively.

DETAILED DESCRIPTION

Figure 1:
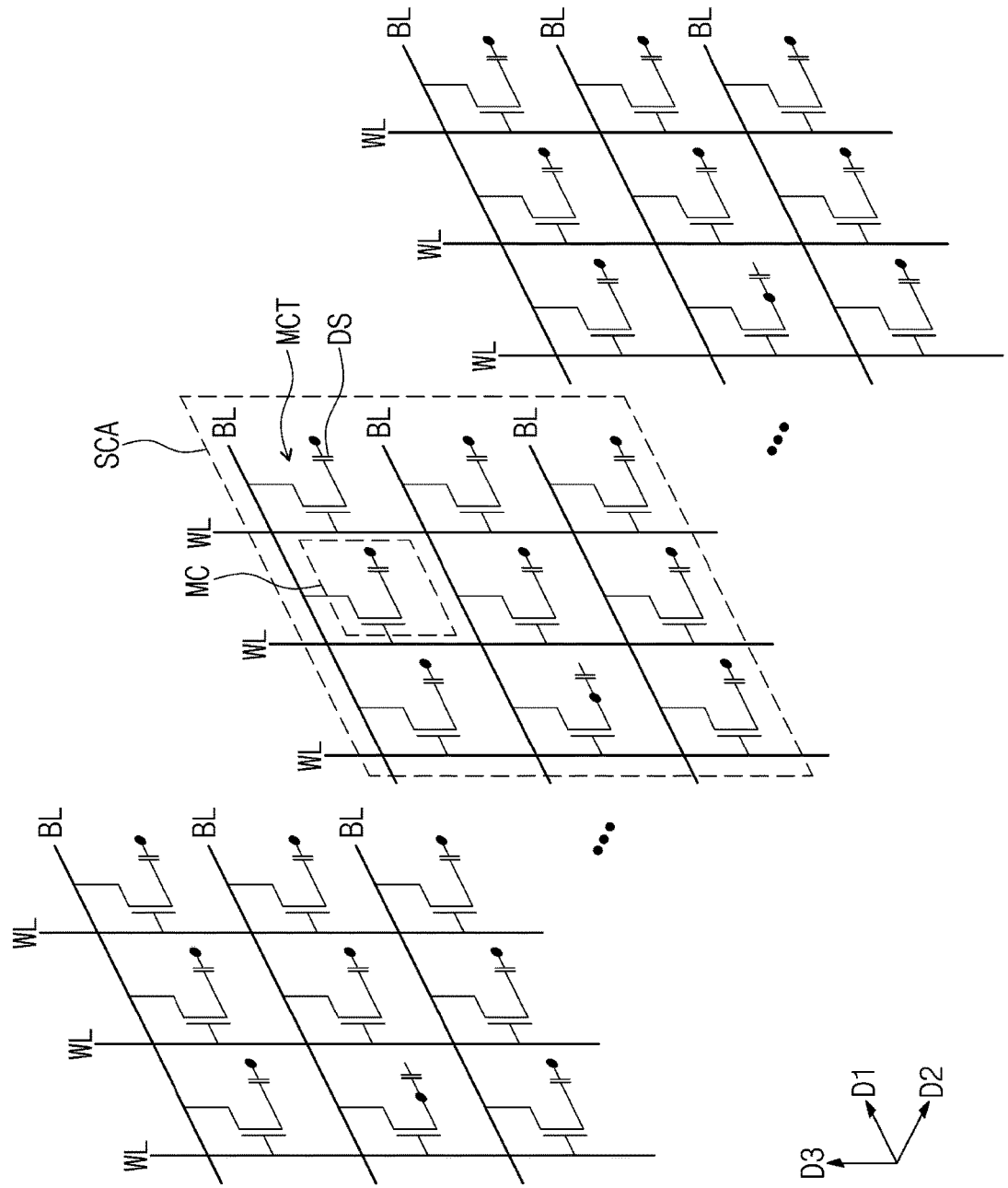
FIG. 1 illustrates a circuit diagram of a cell array of a three-dimensional semiconductor memory device according to an embodiment.

FIG. 1 is a circuit diagram schematically illustrating a cell array of a three-dimensional semiconductor memory device according to an embodiment.

Referring to FIG. 1, the cell array of the three-dimensional semiconductor memory device may include a plurality of sub-cell arrays SCA. The sub-cell arrays SCA may be arranged, e.g., spaced apart from each other, in a second direction D2.

Each of the sub-cell arrays SCA may include a plurality of bit lines BL, a plurality of word lines WL, and a plurality of memory cells MC. In an embodiment, each memory cell MC may be provided between a corresponding one of the word lines WL and a corresponding one of the bit lines BL.

The bit lines BL may be conductive patterns (e.g., metal lines), which are provided over or vertically spaced apart from a substrate. The bit lines BL may extend in a first direction D1. In each sub-cell array SCA, the bit lines BL may be spaced apart from each other in a vertical direction (e.g., a third direction D3) perpendicular to a top surface of the substrate.

The word lines WL may be conductive patterns (e.g., metal lines) extending in the vertical, i.e., the third direction D3. In each sub-cell array SCA, the word lines WL may be spaced apart from each other in the first direction D1.

Each memory cell MC may include a memory cell transistor MCT and a data storing element DS. The gate of the memory cell transistor MCT may be connected to the word line WL, and the source of the memory cell transistor MCT may be connected to the bit line BL. The data storing element DS may be a capacitor, and the drain of the memory cell transistor MCT may be connected to the capacitor.

Figure 2:
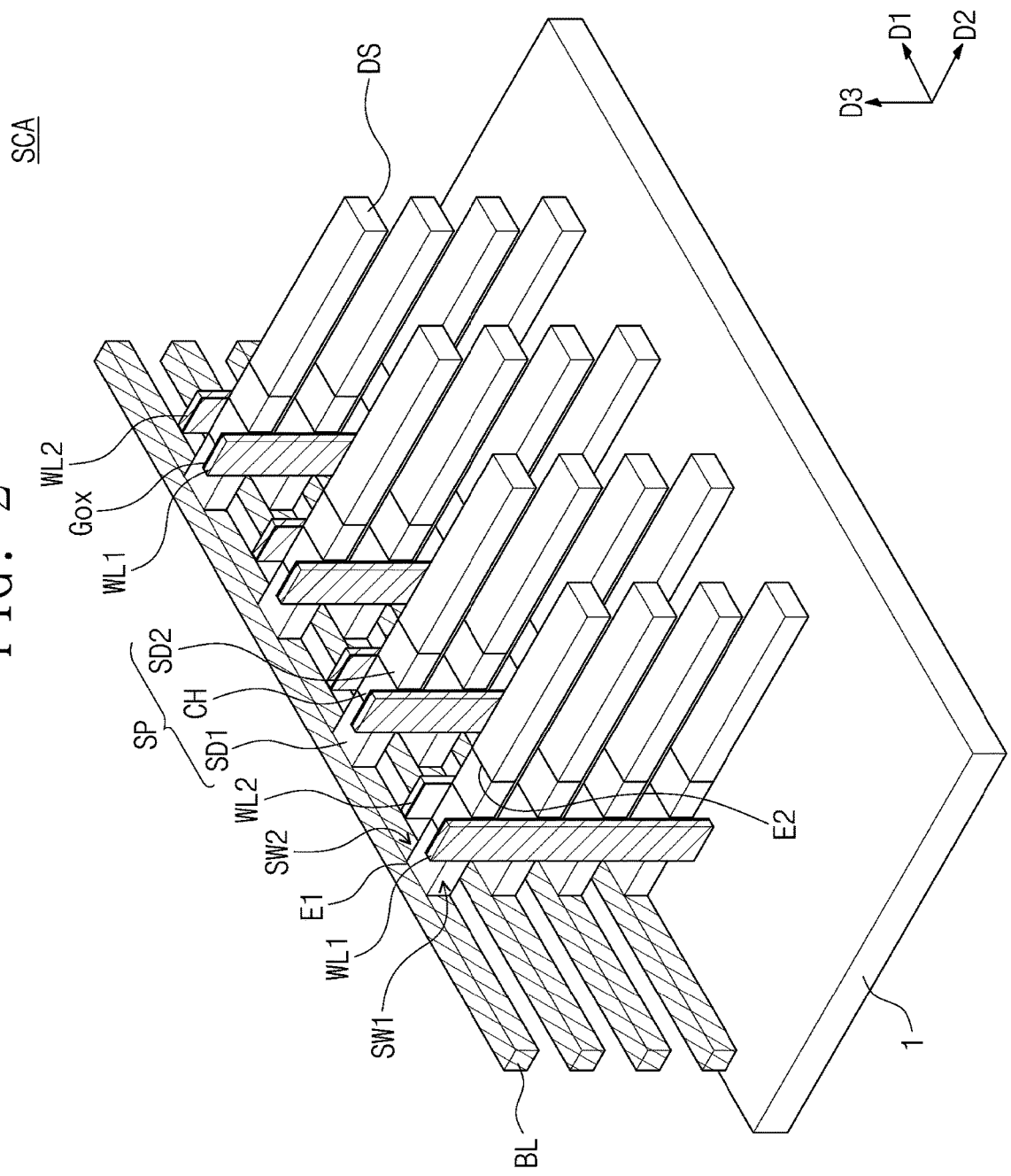
FIG. 2 illustrates a perspective view of a three-dimensional semiconductor memory device according to an embodiment.

FIG. 2 is a perspective view illustrating a three-dimensional semiconductor memory device according to an embodiment.

Referring to FIGS. 1 and 2, one of the sub-cell arrays SCA described with reference to FIG. 1 may be provided on a substrate 1 (FIG. 2). For example, the substrate 1 may be a silicon substrate, a germanium substrate, or a silicon-germanium substrate.

In detail, semiconductor patterns SP may be disposed on the substrate 1 to be spaced apart from each other in the first and third directions D1 and D3 crossing each other. Each of the semiconductor patterns SP may be a bar-shaped pattern, which is elongated in the second direction D2 crossing the first and third directions D1 and D3. The first and second directions D1 and D2 may be parallel to a top surface of the substrate 1. The third direction D3 may be perpendicular to the top surface of the substrate 1. Each of the semiconductor patterns SP may include a first end portion E1 and a second end portion E2, which are spaced apart from each other. For example, as illustrated in FIG. 2, the first and second end portions E1 and E2 may be opposite surfaces of the semiconductor patterns SP that are spaced apart from each other in the second direction D2. In addition, each of the semiconductor patterns SP may include a first side surface SW1 and a second side surface SW2, each of which connects the first end portion E1 to the second end portion E2, and which are spaced apart from each other, e.g., in the first direction D1. The semiconductor patterns SP may be formed of or include, e.g., at least one of silicon or germanium.

Each of the semiconductor patterns SP may include a first source/drain region SD1 adjacent to the first end portion E1, a second source/drain region SD2 adjacent to the second end portion E2, and a channel region CH interposed between the first and second source/drain regions SD1 and SD2. Each of the first and second source/drain regions SD1 and SD2 may be an impurity region, which is formed by doping the semiconductor pattern SP with impurities. In an embodiment, the channel region CH may be doped with impurities. For example, the first and second source/drain regions SD1 and SD2 may be doped to have a first conductivity type, and the channel region CH may be doped to have a second conductivity type different from the first conductivity type.

The bit lines BL may be stacked on the substrate 1 to be spaced apart from each other in the third direction D3. The bit lines BL may be extended in the first direction D1. The first end portions E1 of the semiconductor patterns SP, which are located at the same level, may be connected to a corresponding one of the bit lines BL, e.g., the first end portions E1 of the semiconductor patterns SP may face and contact corresponding side surfaces of the bit lines BL.

The data storing elements DS may be respectively connected to the second end portions E2 of the semiconductor patterns SP. The data storing elements DS may be memory elements, which are used to store data. Each of the data storing elements DS may be, e.g., a memory element using a capacitor, a memory element using a magnetic tunnel junction pattern, or a memory element using a variable resistance material (e.g., a phase-change material). In an embodiment, each of the data storing elements DS may be a capacitor.

First word lines WL1 may be provided near the first side surfaces SW1 of the semiconductor patterns SP. Second word lines WL2 may be provided near the second side surfaces SW2 of the semiconductor patterns SP. The first and second word lines WL1 and WL2 may be extended from the top surface of the substrate 1 in the third direction D3. Each of the first word lines WL1 may be spaced apart from a corresponding one of the second word lines WL2 with the channel region CH of each semiconductor pattern SP interposed therebetween.

Figure 3A:
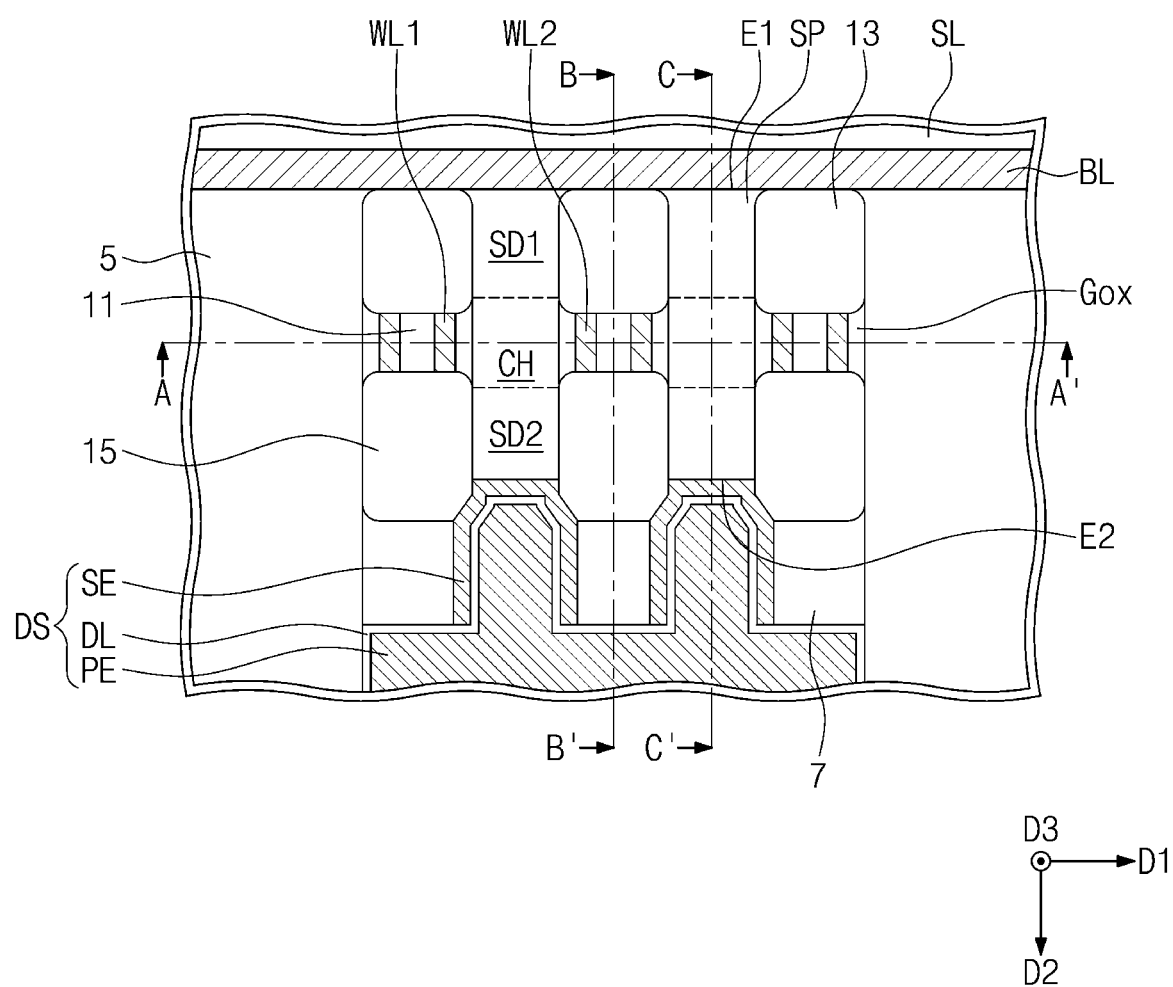
FIG. 3A illustrates a plan view of a three-dimensional semiconductor memory device according to an embodiment.
Figure 3B:
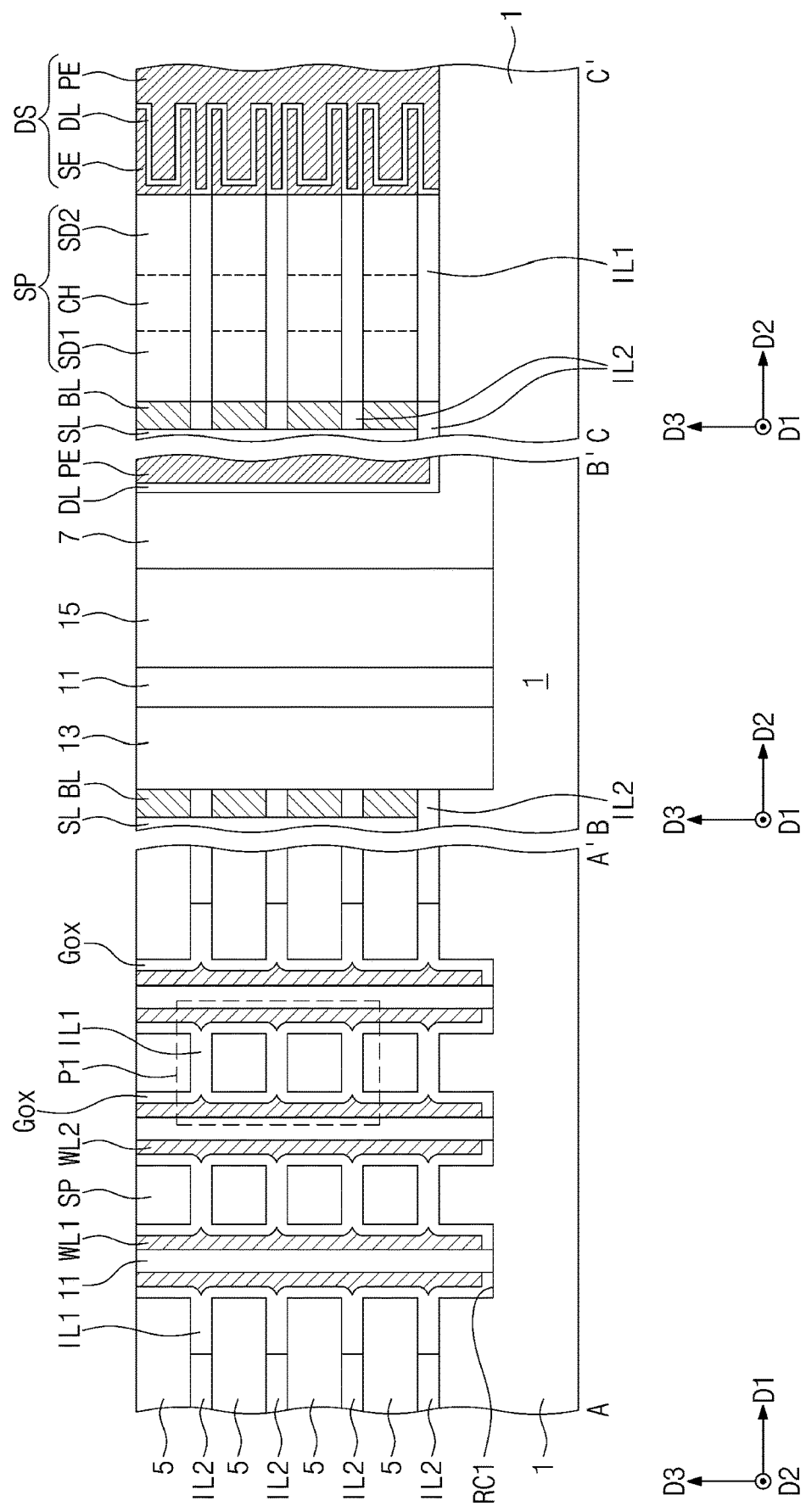
FIG. 3B illustrates a cross-sectional view along lines A-A', B-B', and C-C' of FIG. 3A.

A gate insulating layer Gox may be interposed between each of the first and second word lines WL1 and WL2 and the semiconductor patterns SP (e.g., thick black line in FIG. 2 and FIGS. 3A-3B). The gate insulating layer Gox may be a single- or multi-layered structure and may be formed of or include, e.g., at least one of high-k dielectric materials, silicon oxide, silicon nitride, or silicon oxynitride. In an embodiment, the high-k dielectric materials may include, e.g., at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Each of the bit lines BL and the first and second word lines WL1 and WL2 may be formed of or include a conductive material. For example, the conductive material may be one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), and metal-semiconductor compounds (e.g., tungsten silicide, cobalt silicide, titanium silicide, and so forth).

The bit lines BL may be the bit lines BL described with reference to FIG. 1. The first word lines WL1 may correspond to the word line WL described with reference to FIG. 1. The second word lines WL2 may serve as back gate electrodes, which control the movement of electric charges in the channel regions CH. An insulating layer may be interposed between the bit lines BL and between the semiconductor patterns SP. The word lines WL1 and WL2 may be electrically disconnected from the substrate 1.

Figure 3C:
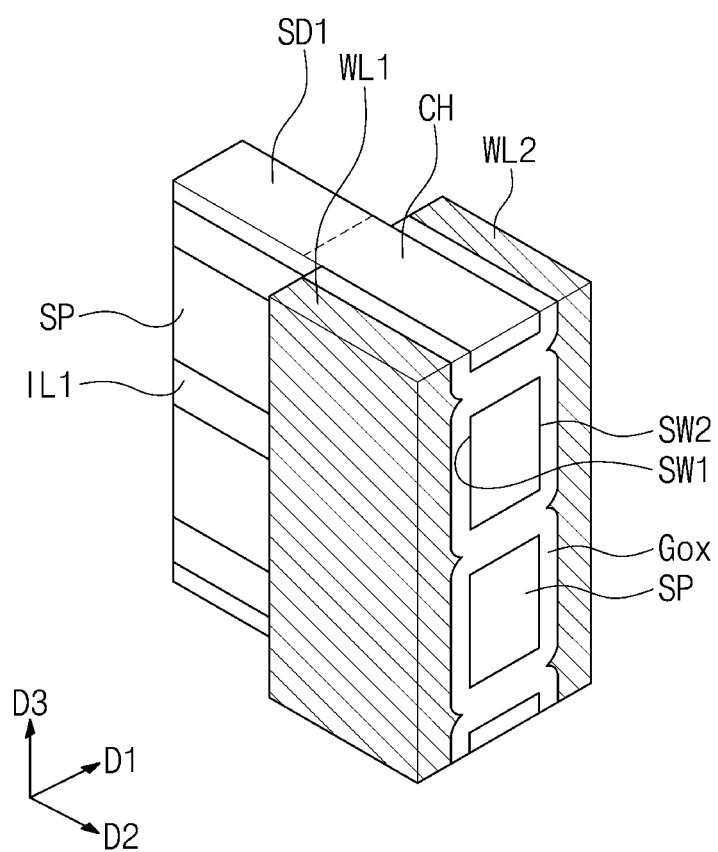
FIG. 3C illustrates a perspective view of portion 'P1' of FIG. 3B.

FIG. 3A is a plan view illustrating a three-dimensional semiconductor memory device according to an embodiment. FIG. 3B is a sectional view illustrating cross-sections along lines A-A', B-B', and C-C' of FIG. 3A. FIG. 3C is a perspective view illustrating portion 'P1' of FIG. 3B.

Referring to FIGS. 3A to 3C, the substrate 1 may be formed of or include a semiconductor material. For example, the substrate 1 may be a single-crystalline silicon wafer or a silicon-on-insulator (SOI) wafer.

The semiconductor patterns SP, which are spaced apart from each other, may be stacked on the substrate 1. Each of the semiconductor patterns SP may include the first end portion E1, the second end portion E2, the first side surface SW1, and the second side surface SW2, as described with reference to FIG. 2. The first and second source/drain regions SD1 and SD2 and the channel region CH may be disposed in each of the semiconductor patterns SP.

The first and second word lines WL1 and WL2 may be extended from the top surface of the substrate 1 in the third direction D3. The first word line WL1 may be adjacent to the first side surface SW1 of the semiconductor patterns SP, and the second word line WL2 may be adjacent to the second side surface SW2 of the semiconductor patterns SP. The first word line WL1 may be spaced apart from the second word line WL2 with the channel regions CH interposed therebetween. A first recess region RC1 may be formed in the substrate 1, and the first and second word lines WL1 and WL2 may be partially inserted in the first recess region RC1.

The gate insulating layer Gox may be interposed between each of the first and second word lines WL1 and WL2 and the semiconductor patterns SP. The gate insulating layer Gox may be extended and may be interposed between the semiconductor patterns SP, e.g., the gate insulating layer Gox may extend between semiconductor patterns SP adjacent to each other along the third direction D3. Furthermore, the gate insulating layer Gox may be provided to fill a space between the semiconductor patterns SP (e.g., between semiconductor patterns SP adjacent to each other along the third direction D3), thereby constituting a first interlayered insulating layer IL1. In other words, the first interlayered insulating layer IL1 may be a portion of the gate insulating layer Gox. The gate insulating layer Gox may be extended to cover a plurality of the semiconductor patterns SP. The gate insulating layer Gox may be continuous between each of the first and second word lines WL1 and WL2 and the semiconductor patterns SP. Side surfaces of each of the first and second word lines WL1 and WL2, which are in contact with the gate insulating layer Gox, may have a concavo-convex structure. Since each of the first and second word lines WL1 and WL2 is adjacent to top and bottom surfaces of the semiconductor patterns SP, the channel controllability by each of the first and second word lines WL1 and WL2 may be improved. Accordingly, it may be possible to improve the reliability of the three-dimensional semiconductor memory device.

The gate insulating layer Gox may be extended and may be interposed between a bottom surface of the first recess region RC1 and the first and second word lines WL1 and WL2. At least one of a high-k dielectric pattern, a work function control pattern, a ferroelectric pattern, a diffusion barrier pattern, or a charge storing pattern may be interposed between each of the first and second word lines WL1 and WL2 and the gate insulating layer Gox. The high-k dielectric pattern may be formed of or include at least one of metal oxides (e.g., hafnium oxide and aluminum oxide) whose dielectric constant is higher than a dielectric constant of a silicon oxide layer. The diffusion barrier pattern may include a metal nitride layer, e.g., a tungsten nitride layer, a titanium nitride layer, and a tantalum nitride layer. The charge storing pattern may include, e.g., a silicon nitride layer or a polysilicon layer.

Second interlayered insulating layers IL2 and semiconductor layers 5 may be alternately stacked on an edge region of the substrate 1. The second interlayered insulating layer IL2 may be formed of or include a material, which is different from or the same as the gate insulating layer Gox.

Each of the semiconductor layers 5 may be located at the same level as a corresponding one of the semiconductor patterns SP. Side surfaces of the semiconductor layers 5 may protrude toward the word lines WL1 and WL2, compared with the second interlayered insulating layer IL2, e.g., the semiconductor layers 5 may extend beyond the second interlayered insulating layers IL2 in a direction oriented toward corresponding ones of the word lines WL1 and WL2. The first interlayered insulating layer IL1 may be extended into regions between the semiconductor layers 5 and may be in, e.g., direct, contact with the second interlayered insulating layer IL2.

The first end portions E1 of the semiconductor patterns SP may be in contact with the bit lines BL. Each of the second interlayered insulating layers IL2 may be interposed between the bit lines BL. The bit lines BL may be extended in the first direction D1. The bit lines BL may be in contact with an insulating isolation pattern SL. The insulating isolation pattern SL may be in contact with side surfaces of the bit lines BL and the second interlayered insulating layers IL2. When viewed in a plan view, as illustrated in FIG. 3A, the insulating isolation pattern SL may also be a line-shaped pattern, e.g., having a linear or curved shape, which is extended in the first direction D1.

The second end portions E2 of the semiconductor patterns SP may be in contact with data storage electrodes SE, respectively. The data storage electrode SE may have a letter 'C'-shaped section. The data storage electrode SE may have a hollow cup shape or a cylinder shape. The data storage electrodes SE may be conformally covered with a dielectric layer DL. The dielectric layer DL may be extended to be in contact with a side surface of the first interlayered insulating layer IL1 interposed between the semiconductor patterns SP. The dielectric layer DL may be covered with a plate electrode PE. The data storage electrode SE, the dielectric layer DL, and the plate electrode PE may constitute the data storing element DS, e.g., a capacitor. Each of the data storage electrode SE and the plate electrode PE may be formed of or include a conductive material. The conductive material may be one of doped semiconductor materials (e.g., doped silicon, doped silicon-germanium, and so forth), conductive metal nitrides (e.g., titanium nitride, tantalum nitride, and so forth), metallic materials (e.g., tungsten, titanium, tantalum, and so forth), and metal-semiconductor compounds (e.g., tungsten silicide, cobalt silicide, titanium silicide, and so forth). The dielectric layer DL may be formed of or include at least one of silicon oxide, metal oxides (e.g., hafnium oxide, zirconium oxide, aluminum oxide, lanthanum oxide, tantalum oxide, and titanium oxide) or perovskite dielectric materials (e.g., $SrTiO_3$ (STO), $(Ba, Sr)TiO_3$ (BST), $BaTiO_3$, PZT, and PLZT).

A first insulating gap-filling pattern 7 may be interposed between adjacent ones of the data storage electrodes SE, and between the data storage electrodes SE and the semiconductor layers 5. A second insulating gap-filling pattern 11 may be interposed between the first and second word lines WL1 and WL2. A third insulating gap-filling pattern 13 may be interposed between the first and second word lines WL1 and WL2 and the bit lines BL, between the second insulating gap-filling pattern 11 and the bit lines BL, and between the gate insulating layer Gox and the bit lines BL. A fourth insulating gap-filling pattern 15 may be interposed between the first and second word lines WL1 and WL2 and the first insulating gap-filling pattern 7. Each of the first to fourth insulating gap-filling patterns 7, 11, 13, and 15 may be independently formed of or include, e.g., at least one of silicon oxide, silicon nitride, or silicon oxynitride, and may have a single- or multi-layered structure. The semiconductor layers 5 may be provided to include end portions, which form a staircase structure. The bit lines BL may be provided to include end portions, which form a staircase structure.

FIGS. 4A, 5A, and 7A to 12A are plan views illustrating a process of fabricating a three-dimensional semiconductor memory device having the planar structure shown in FIG. 3A. FIGS. 4B, 5B, and 7B to 12B are sectional views, each of which illustrates cross-sections of a three-dimensional semiconductor memory device, taken along lines A-A', B-B', and C-C' of FIGS. 4A, 5A, and 7A to 12A, respectively. FIG. 6 is a sectional view illustrating a stage (e.g., between the stages of FIGS. 5B and 7B) in the process of fabricating the three-dimensional semiconductor memory device in FIG. 3B.

Figure 4A:
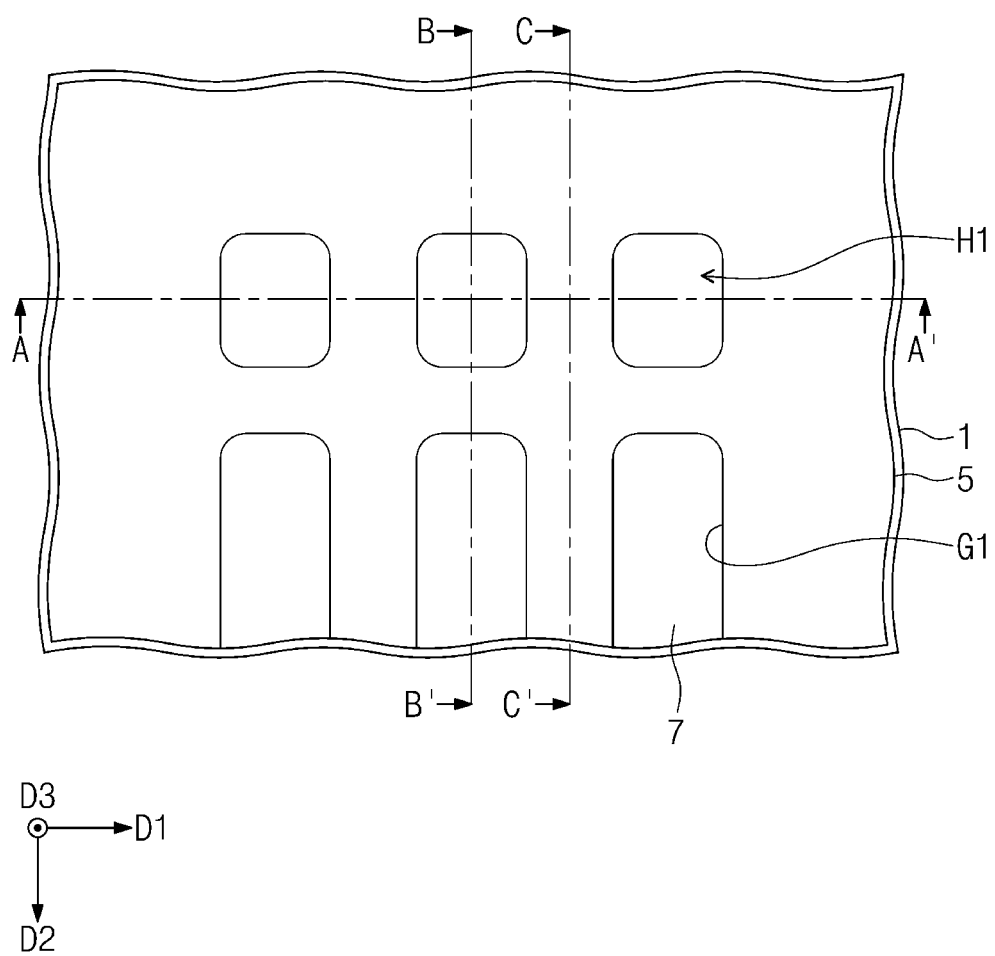
Figure 4B:
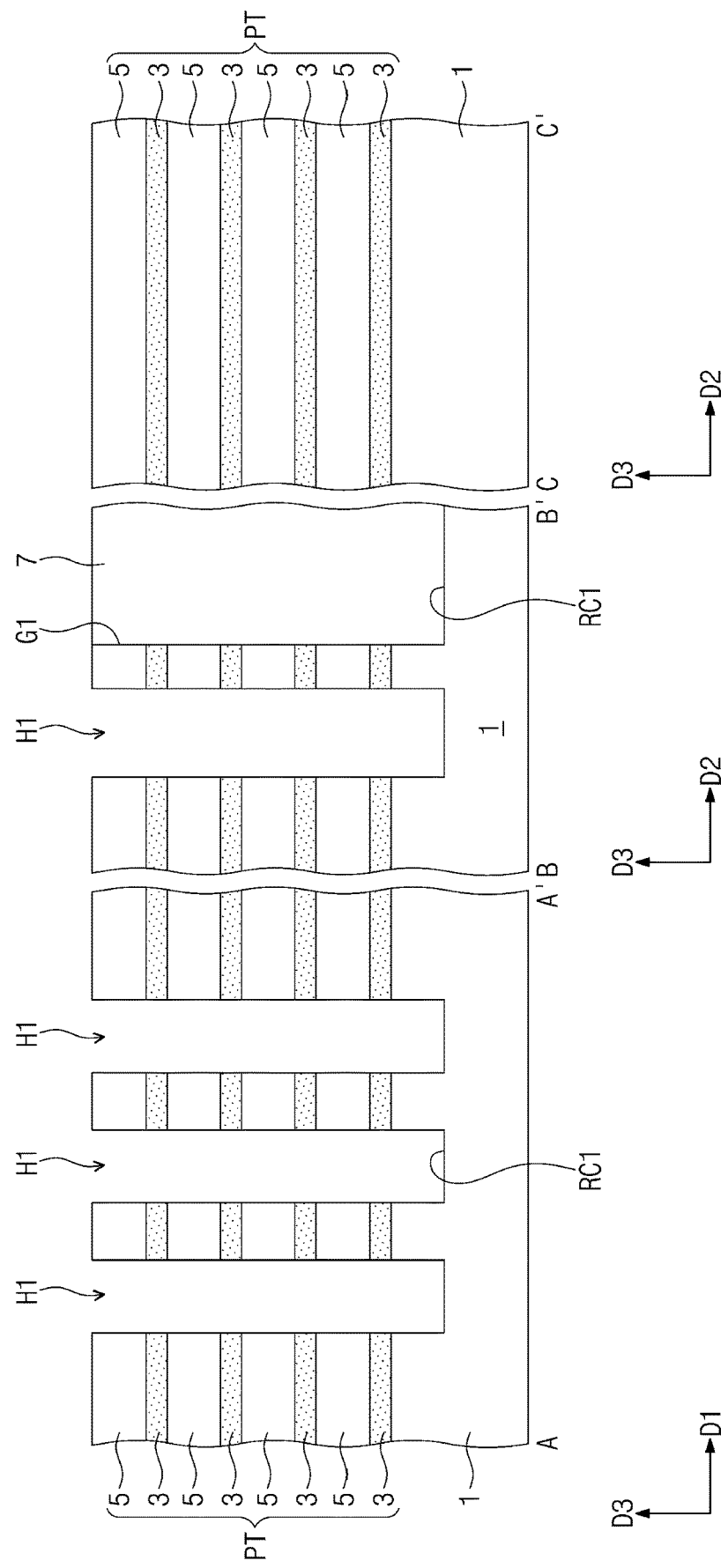

Referring to FIGS. 4A and 4B, sacrificial layers 3 and the semiconductor layers 5 may be alternately stacked on the substrate 1 to form a preliminary stack structure PT. The semiconductor layers 5 may be formed of or include a semiconductor material (e.g., silicon). The sacrificial layers 3 may be formed of or include a material having an etch selectivity with respect to the semiconductor layers 5. For example, the sacrificial layers 3 may be formed of or include, e.g., at least one of silicon germanium, silicon oxide, silicon nitride, or silicon oxynitride. The preliminary stack structure PT may be etched to form first holes H1 and first grooves G1, which expose the substrate 1 and are spaced apart from each other. The first holes H1 may be spaced apart from each other in the first direction D1. The first grooves G1 may be spaced apart from each other in the first direction D1. The first grooves G1 may be spaced apart from the first holes H1 in the second direction D2. During the etching of the preliminary stack structure PT, an upper portion of the substrate 1 may be etched to form the first recess region RC1. The first insulating gap-filling pattern 7 may be formed in the first grooves G1, and the formation of the first insulating gap-filling pattern 7 may include forming an insulating layer to fill the first grooves G1 and anisotropically etching the insulating layer.

Figure 5A:
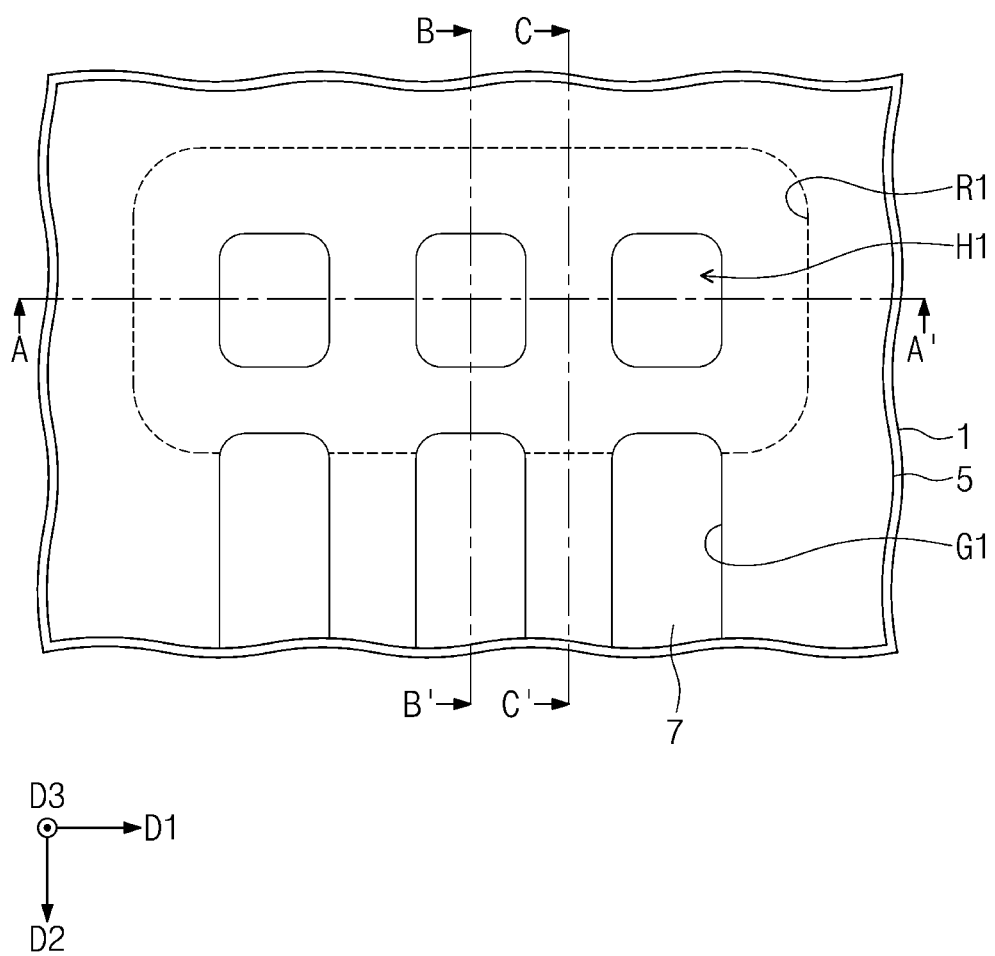
Figure 5B:
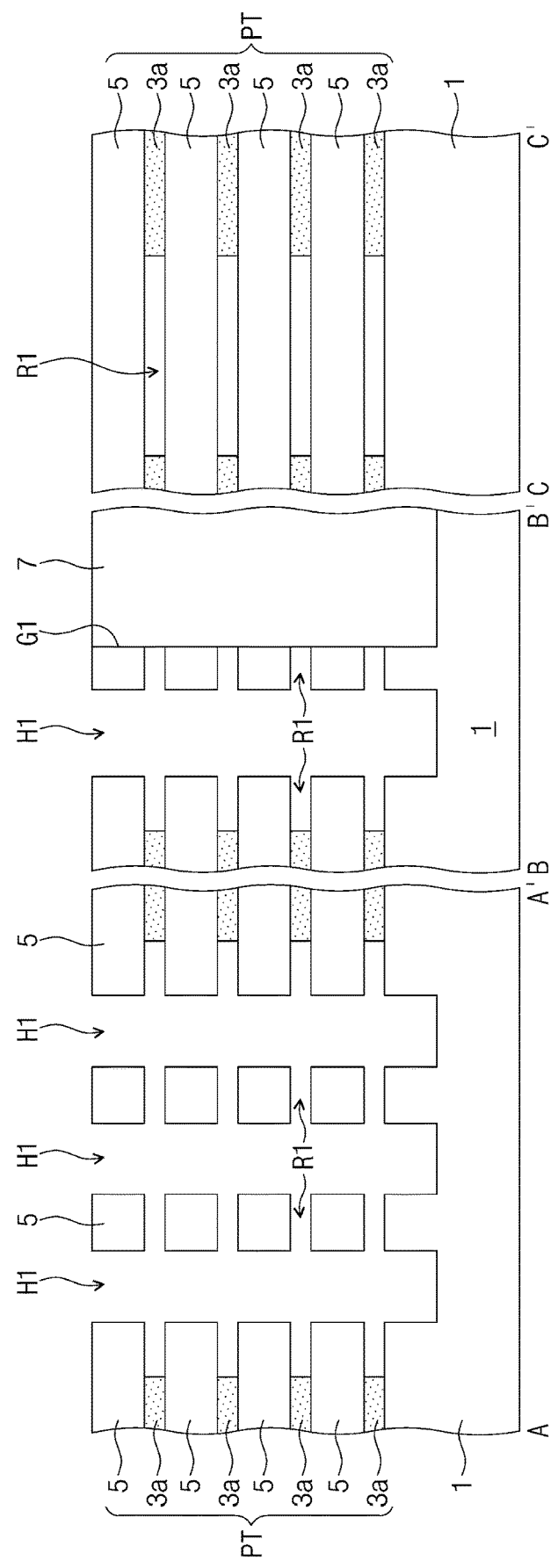
Figure 6:
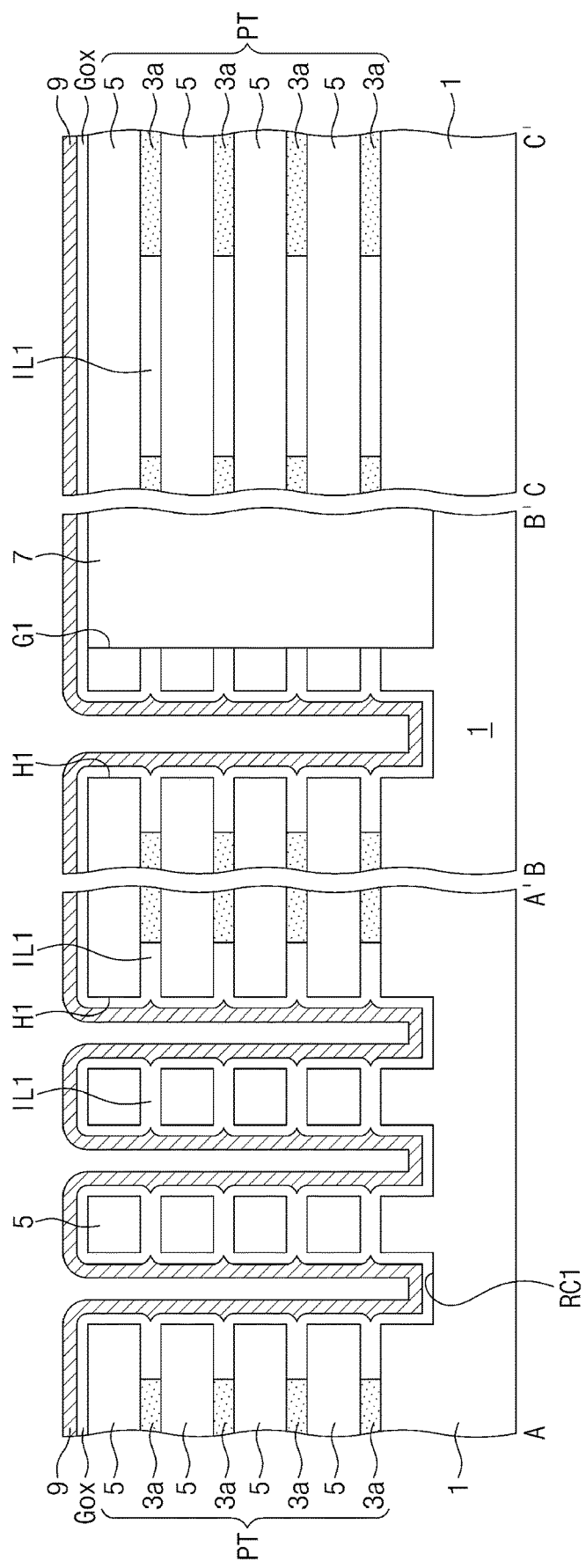
FIG. 6 illustrates a cross-sectional view of a process of fabricating the three-dimensional semiconductor memory device in FIG. 3B.

Referring to FIGS. 5A and 5B, an isotropic etching process may be performed to partially remove the sacrificial layers 3 exposed through the first holes H1. As a result, first regions R1 may be formed to expose top and bottom surfaces of the semiconductor layers 5, and the sacrificial patterns 3a may be left on the edge region of the substrate 1. When the sacrificial layers 3 are partially removed, the first insulating gap-filling pattern 7 and the sacrificial patterns 3a may prevent the preliminary stack structure PT from leaning or collapsing. The sacrificial patterns 3a may be portions of the sacrificial layers 3. Side surfaces of the sacrificial patterns 3a may also be exposed through the first regions R1.

Referring to FIG. 6, a thermal oxidation process or a deposition process may be performed to form the gate insulating layer Gox on the exposed surfaces of the semiconductor layers 5. Here, the gate insulating layer Gox may be formed to have a thickness that is thick enough to fill the first regions R1 between the semiconductor layers 5. In the case where the gate insulating layer Gox is formed by the thermal oxidation process, the etch damage in the semiconductor layers 5 may be cured. This makes it possible to prevent a leakage current from occurring during operations of the three-dimensional semiconductor memory device and to improve the reliability of the three-dimensional semiconductor memory device. The gate insulating layer Gox between the semiconductor layers 5 may be referred to as the first interlayered insulating layer IL1. The first interlayered insulating layer IL1 may be in contact with the sacrificial patterns 3a. The gate insulating layer Gox may also be formed on the surface of the substrate 1. The gate insulating layer Gox may also be formed on the bottom and side surfaces of the first recess region RC1. The gate insulating layer Gox in the first hole H1 may have an uneven profile near and between the semiconductor layers 5. A word line layer 9 may be conformally formed on the gate insulating layer Gox. The word line layer 9 may be formed of at least one of conductive materials.

Figure 7A:
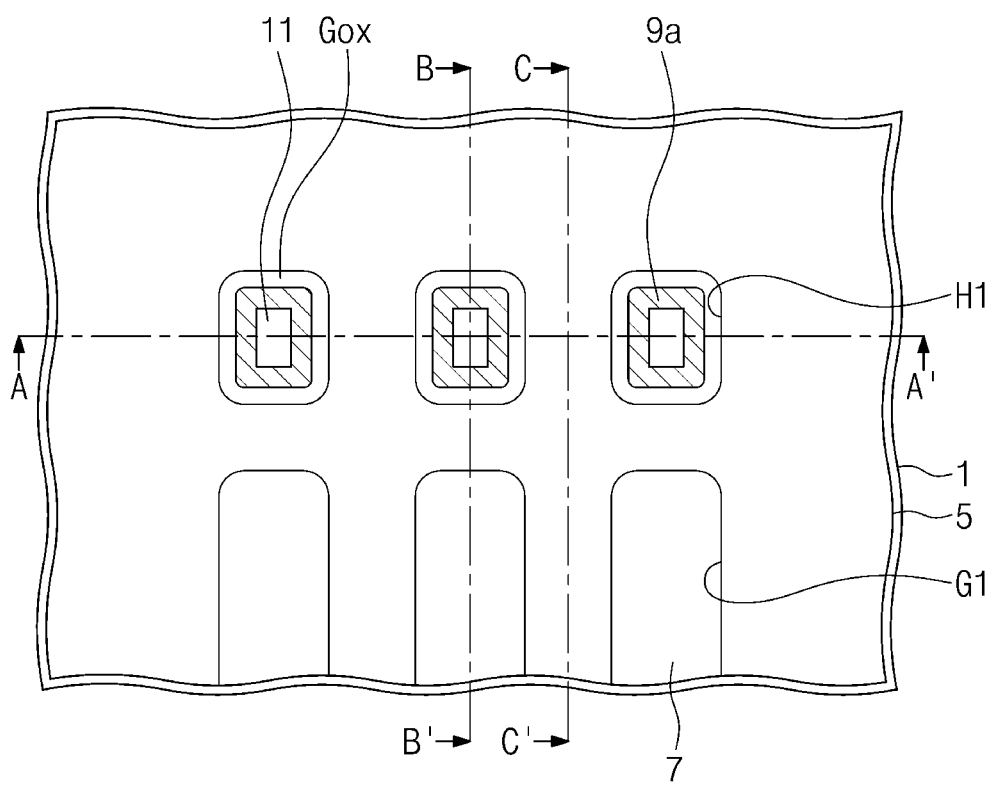
Figure 7A:
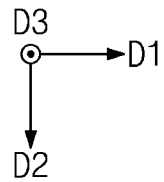
Figure 7B:
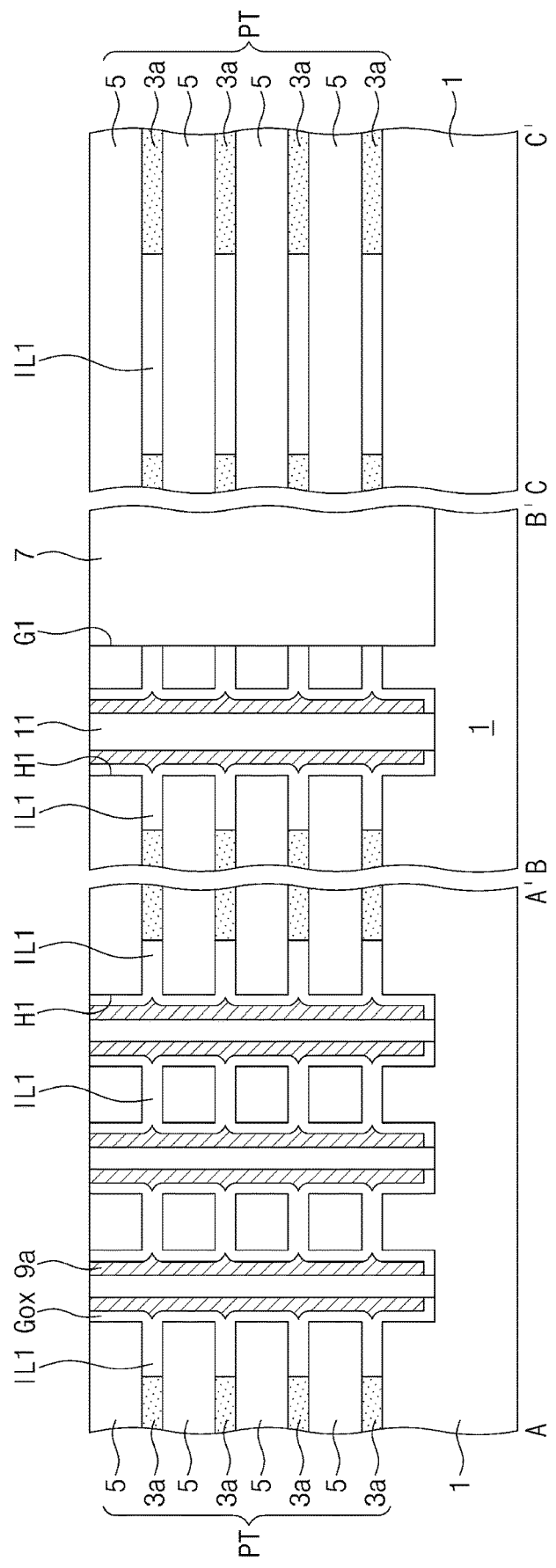

Referring to FIGS. 7A and 7B, an anisotropic etching process may be performed on the word line layer 9 and the gate insulating layer Gox to form a preliminary word line pattern 9a and the gate insulating layer Gox in the first holes H1. For example, the anisotropic etching process may be performed to remove portions of the gate insulating layer Gox and the word line layer 9, which are located on the topmost one of the semiconductor layers 5 and on the bottom of the first recess region RC1, e.g., to expose top surfaces of uppermost semiconductor layers 5 and a portion of the substrate 1 in the first recess region RC1. In this case, the preliminary word line pattern 9a and the gate insulating layer Gox may be left in the first holes H1. The preliminary word line pattern 9a may have a closed loop shape, when viewed in a plan view. Thereafter, the second insulating gap-filling pattern 11 may be formed in the first hole H1 to be in contact with the preliminary word line pattern 9a.

Referring to FIGS. 7A, 7B, 8A, and 8B, a second hole H2 and a third hole H3, which are spaced apart from each other, may be formed by removing a portion of the preliminary stack structure PT adjacent to the preliminary word line pattern 9a and by removing portions of the preliminary word line pattern 9a and the gate insulating layer Gox. The third holes H3 may be positioned between the first holes H1 and the first grooves G1, e.g., along the second direction D2. The second holes H2 may be spaced apart from the third holes H3 with the second insulating gap-filling patterns 11 interposed therebetween. The second holes H2 may be partially overlapped with the first holes H1, e.g., in top view of FIG. 8A. The third holes H3 may be partially overlapped with the first holes H1 and the first grooves G1, e.g., in top view of FIG. 8A. As a result of the formation of the second and third holes H2 and H3, the preliminary word line pattern 9a (e.g., which has a loop shape in the top of view of FIG. 7A) may be divided into the first and second word lines WL1 and WL2 (e.g., top view of FIG. 8A), which are spaced apart from each other. The third and fourth insulating gap-filling patterns 13 and 15 may be formed by filling the second and third holes H2 and H3 with an insulating layer. The second insulating gap-filling patterns 11 may be partially etched by the etching process.

Referring to FIGS. 8A, 8B, 9A, and 9B, the preliminary stack structure PT adjacent to the third insulating gap-filling pattern 13 may be etched to form a second groove G2. When viewed in a plan view, the second groove G2 may have a line shape extending in the first direction D1. The second groove G2 may expose a top surface of the lowermost one of the sacrificial patterns 3a.

Referring to FIGS. 9A, 9B, 10A, and 10B, the semiconductor layers 5 exposed through the second groove G2 may be partially removed to form second recess regions RC2. The second recess regions RC2 may expose a side surface of the third insulating gap-filling pattern 13. An ion implantation process may be performed to form the first source/drain regions SD1 in the semiconductor layers 5 adjacent to the second recess regions RC2. A conductive layer may be deposited to fill the second recess regions RC2 and then may be anisotropically etched to form the bit lines BL in the second recess regions RC2.

Thereafter, the sacrificial patterns 3a exposed through the second groove G2 may be removed to evacuate regions between the bit lines BL. The second interlayered insulating layer IL2 may be deposited to fill the regions between the bit lines BL and then may be anisotropically etched to form the second interlayered insulating layer IL2 between the bit lines BL. In an embodiment, during this process, all of the sacrificial patterns 3a may be replaced with the second interlayered insulating layer IL2. In certain embodiments, the sacrificial patterns 3a may be partially left. The left portions of the sacrificial patterns 3a may be replaced with the second interlayered insulating layer IL2 in a subsequent process, which will be described with reference to FIGS. 11A and 11B. An insulating isolation layer may be deposited to fill the second groove G2 and then may be anisotropically etched to form the insulating isolation pattern SL in the second groove G2.

Figure 11A:
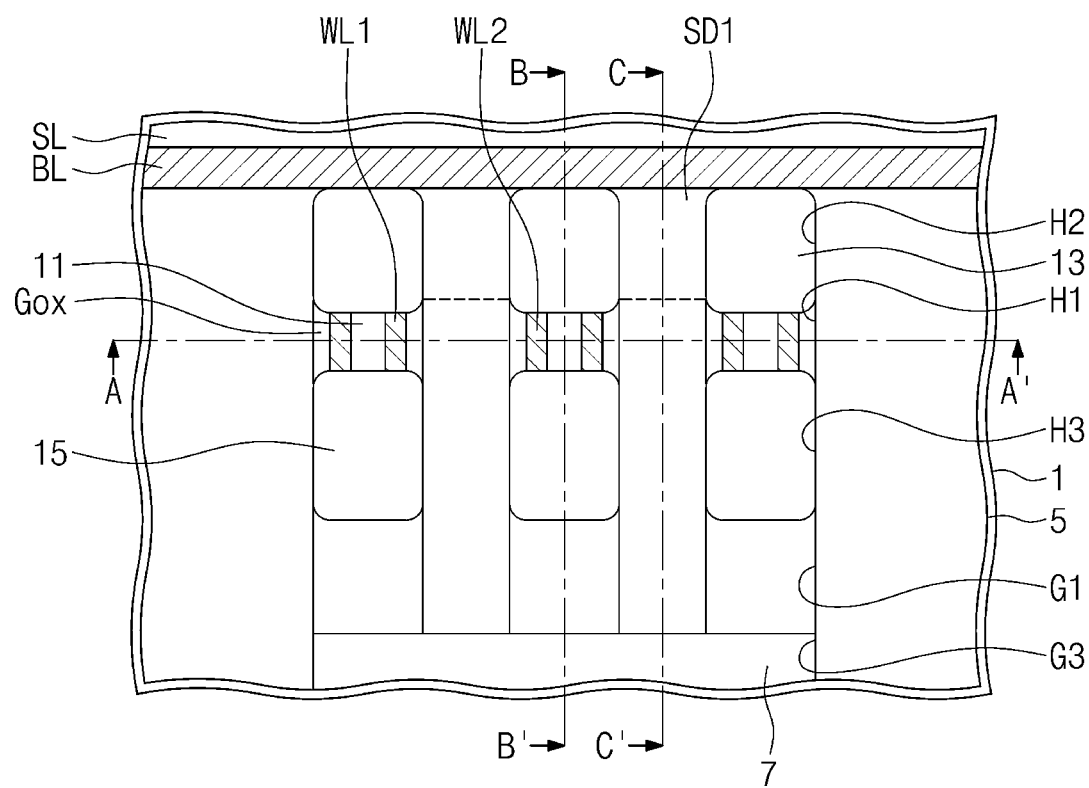
Figure 11A:
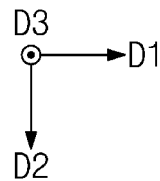
Figure 11B:
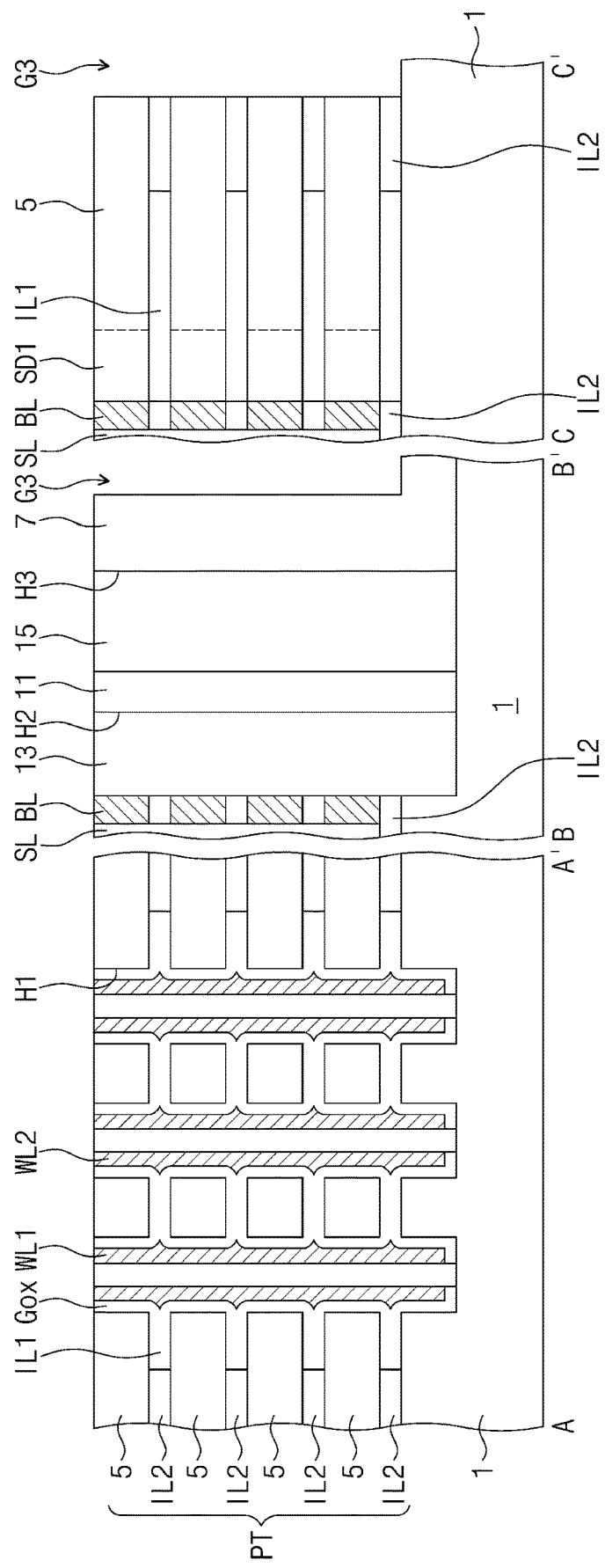
Figure 12A:
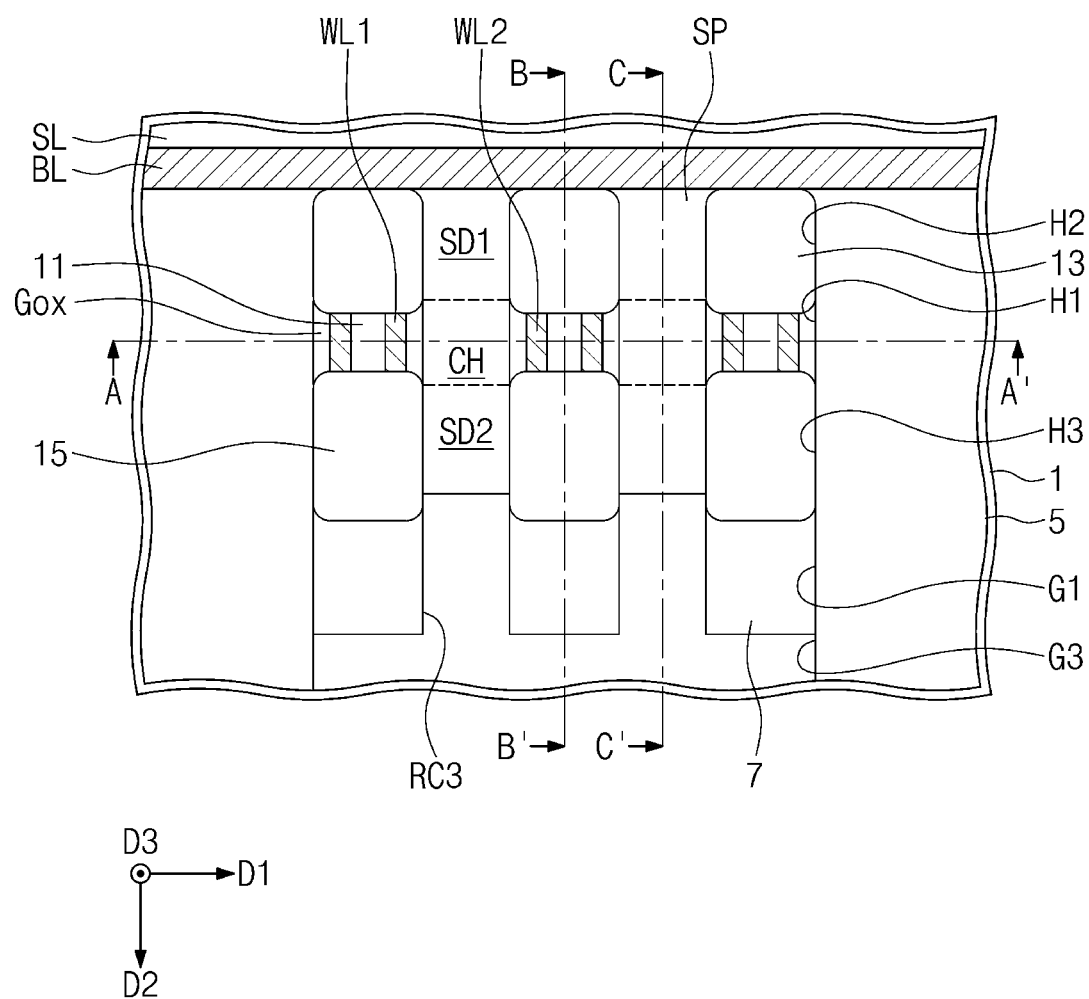
Figure 12B:
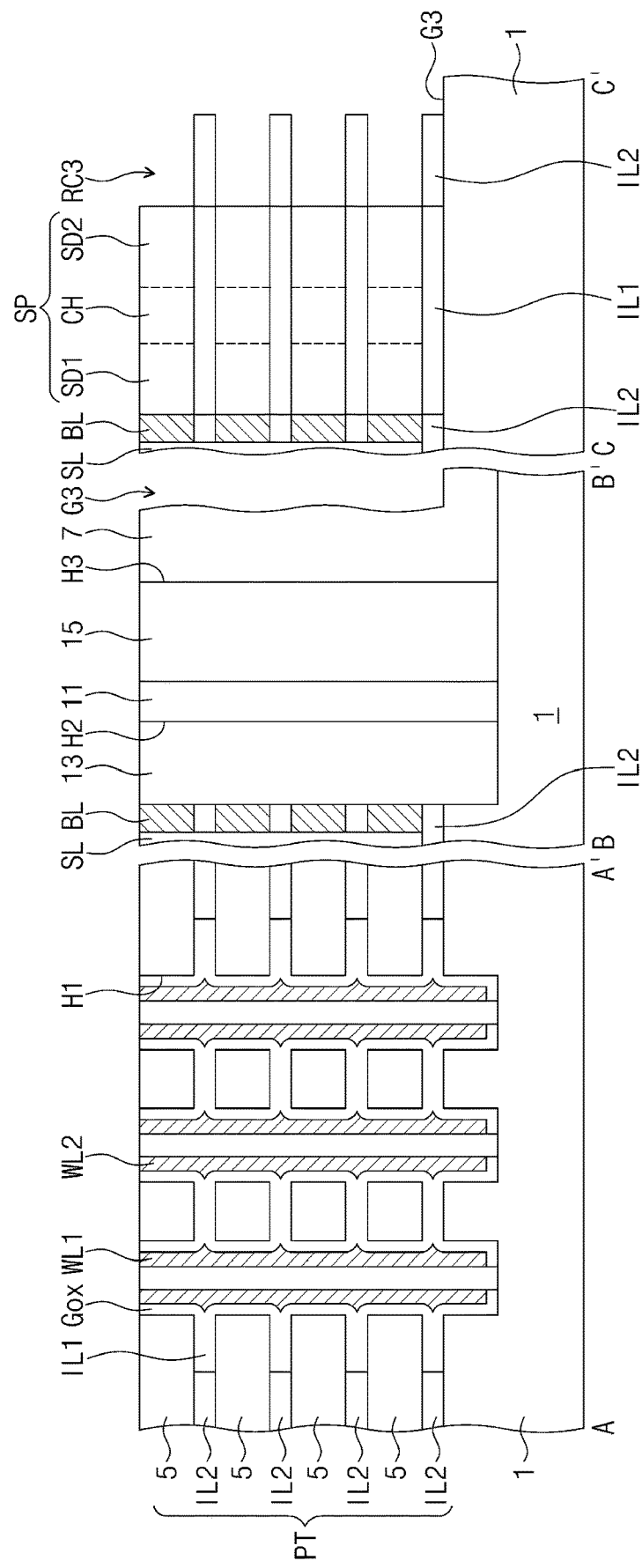

Referring to FIGS. 11A and 11B, the first insulating gap-filling pattern 7, the semiconductor layers 5 adjacent thereto, and the second interlayered insulating layers IL2 interposed between the semiconductor layers 5 may be etched to form a third groove G3. The third groove G3 may have a line shape extending in the first direction D1. In the case where the sacrificial patterns 3a are left after the process of FIGS. 10A and 10B, the sacrificial patterns 3a may be removed through the third groove G3, and the second interlayered insulating layers IL2 may be formed in regions, from which the sacrificial patterns 3a are removed.

Referring to FIGS. 11A, 11B, 12A, and 12B, the semiconductor layers 5 exposed through the third groove G3 may be partially removed by an isotropic etching process to form third recess regions RC3 and the semiconductor patterns SP. The third recess regions RC3 may be disposed to expose top and bottom surfaces of the second interlayered insulating layers IL2 and a side surface of the first insulating gap-filling pattern 7. An ion implantation process may be performed to form the second source/drain regions SD2 in the semiconductor patterns SP.

Thereafter, referring to FIGS. 12A, 12B, 3A, and 3B, an isotropic etching process may be performed to etch the side surfaces of the first insulating gap-filling patterns 7 exposed through the third recess regions RC3, and as a result of the isotropic etching process, the third recess regions RC3 may have an increased width. A conductive layer may be deposited to conformally fill the third recess regions RC3 and then may be anisotropically etched to form the data storage electrodes SE. The second interlayered insulating layers IL2 exposed through the third recess regions RC3 may be removed and then the dielectric layer DL and the plate electrode PE constituting the data storing element DS may be formed, e.g., the data storing element DS may be a capacitor, as shown in FIG. 3B.

In the present embodiment, since the gate insulating layer Gox is used to constitute the first interlayered insulating layer IL1, it may be possible to omit an additional process of forming the first interlayered insulating layer IL1 and to simplify the overall fabrication process.

FIGS. 13A to 13E are perspective views, each of which illustrates a portion of a three-dimensional semiconductor memory device according to an embodiment.

Figure 13A:
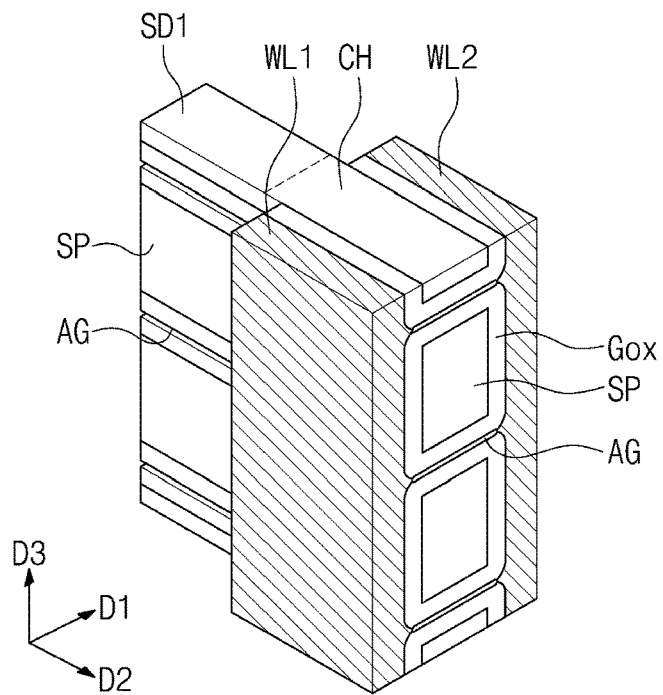
FIGS. 13A to 13E illustrate perspective views of three-dimensional semiconductor memory devices according to embodiments.

Referring to FIG. 13A, the gate insulating layers Gox may be interposed between the channel region CH and each of the first and second word lines WL1 and WL2, e.g., the gate insulating layers Gox may extend only along the channel region CH without overlapping the first and second source/drain regions SD1 and SD2. The gate insulating layers Gox may be interposed between the channel regions CH of the semiconductor patterns SP, e.g., between channels regions CH adjacent to each other along the third direction D3. The gate insulating layers Gox, which surround the semiconductor patterns SP, respectively, may not be connected to each other and may be spaced apart from each other, e.g., along the third direction D3, by an air gap region AG. The gate insulating layers Gox may be extended into regions between the first source/drain regions SD1 of the semiconductor patterns SP, thereby constituting the first interlayered insulating layer IL1. The air gap region AG may be formed in the first interlayered insulating layer IL1. Due to the presence of the air gap region AG, it may be possible to reduce interference between adjacent ones of the channel regions CH. The gate insulating layer Gox in the embodiment of FIG. 13A may be thinner than that in the previous embodiment of FIG. 3C. Except for the afore-described differences, the three-dimensional semiconductor memory device according to the present embodiment may have substantially the same features as those described with reference to FIGS. 3A to 3C. The three-dimensional semiconductor memory device of FIG. 13A may be fabricated by forming the gate insulating layer Gox to a reduced thickness in the step of FIG. 6 and performing the subsequent process steps.

Figure 13B:
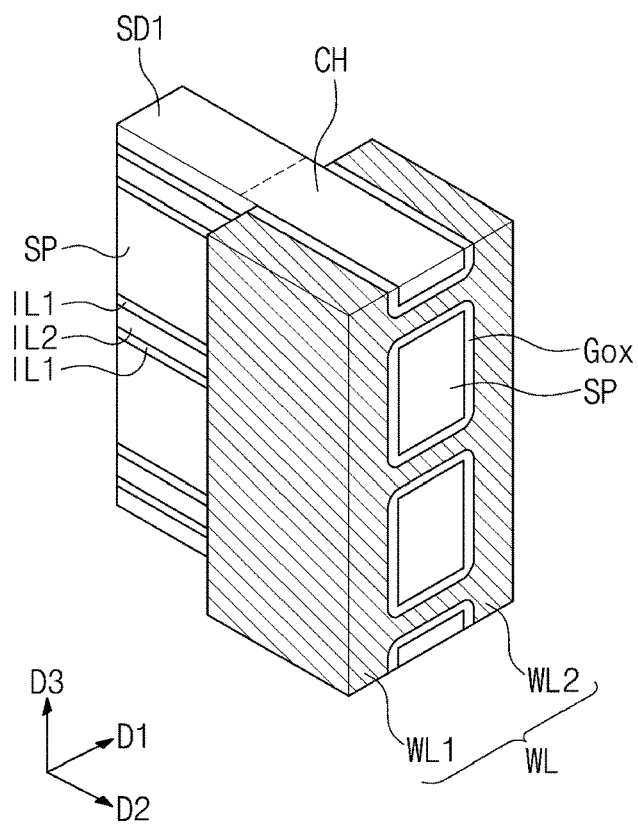

In an alternative example shown in FIG. 13B, the first and second word lines WL1 and WL2 may be extended into regions between the semiconductor patterns SP to be in contact with each other. In other words, the first and second word lines WL1 and WL2 may be connected to form a single object serving as the word line WL. The gate insulating layer Gox in the embodiment of FIG. 13B may be thinner than that in the previous embodiment of FIG. 13A. The gate insulating layer Gox may include a portion, which is interposed between the first source/drain regions SD1 of the semiconductor patterns SP and constitutes the first interlayered insulating layer IL1. In addition, the second interlayered insulating layer IL2 may also be interposed between the first source/drain regions SD1 to be in contact with the first interlayered insulating layer IL1. Except for the afore-described differences, the three-dimensional semiconductor memory device according to the present embodiment may have substantially the same features as those described with reference to FIGS. 3A to 3C.

Figure 13C:
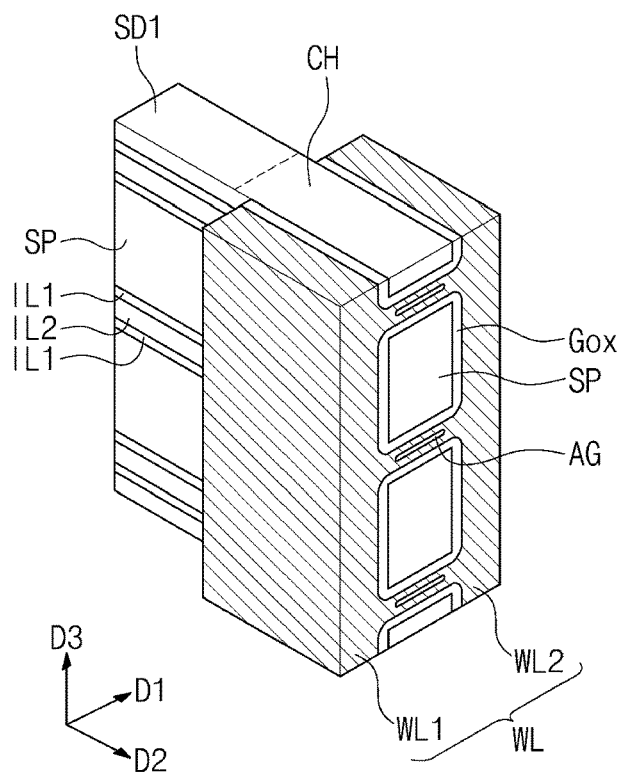

In an alternative example shown in FIG. 13C, the word line WL may be provided to have the air gap region AG between the channel regions CH of the semiconductor patterns SP and may have substantially the same structure as that of FIG. 13B, except for this. In this structure, the air gap region AG may be referred to as a void. Except for the afore-described differences, the three-dimensional semiconductor memory device according to the present embodiment may have substantially the same features as those described with reference to FIG. 13B. In FIG. 13B or 13C, the channel regions CH of the semiconductor patterns SP are surrounded by the word line WL, the channel controllability may be increased.

Figure 13D:
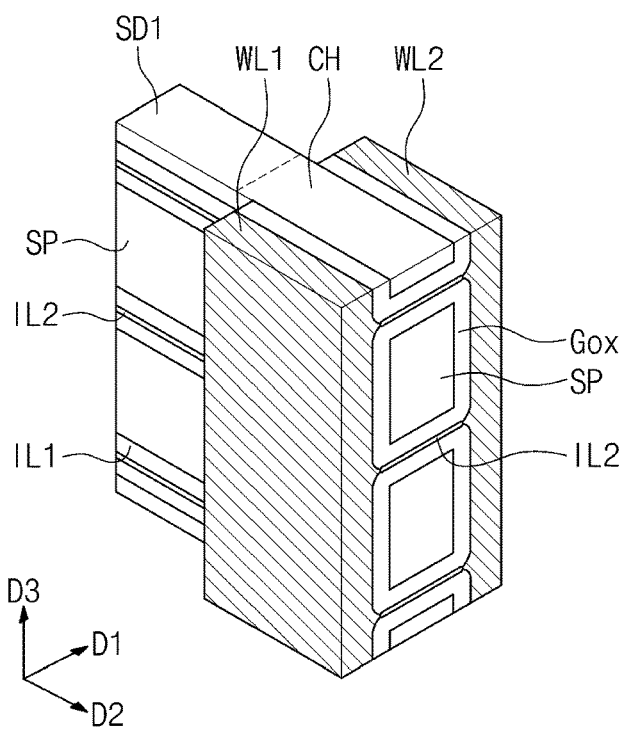

In an alternative example shown in FIG. 13D, the air gap region AG of FIG. 13A may be filled with the second interlayered insulating layer IL2. The second interlayered insulating layer IL2 may be formed of or include a material that is the same as or different from the gate insulating layer Gox.

Figure 13E:
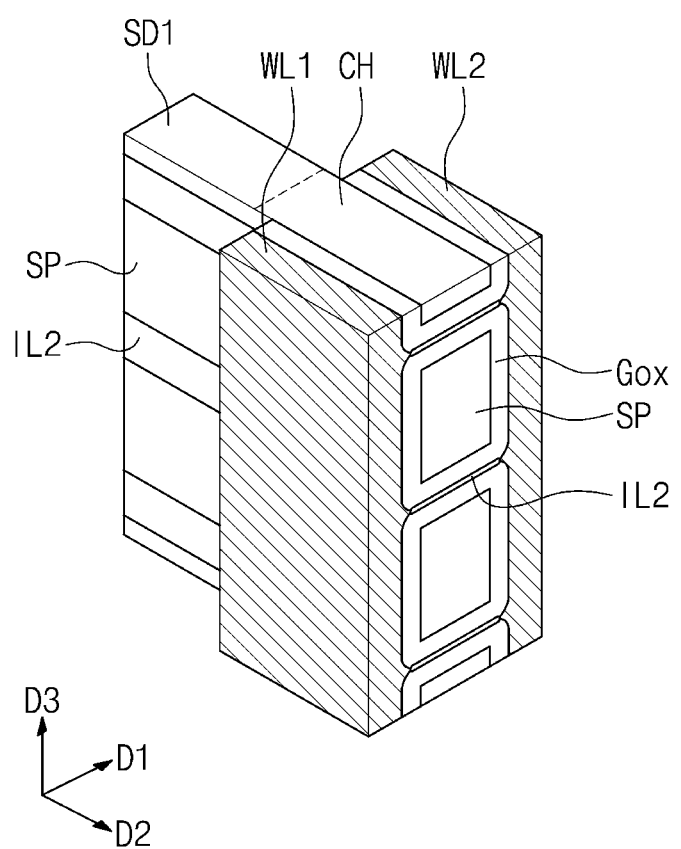

In an alternative example shown in FIG. 13E, only the second interlayered insulating layer IL2 may be interposed between the first source/drain regions SD1 of the semiconductor patterns SP, and except for this, the structure of FIG. 13E may be substantially the same as that of FIG. 13D.

The three-dimensional semiconductor memory devices of FIGS. 13B to 13E may be fabricated by using or modifying the fabrication method described with reference to FIGS. 3A to 12B.

Figure 14A:
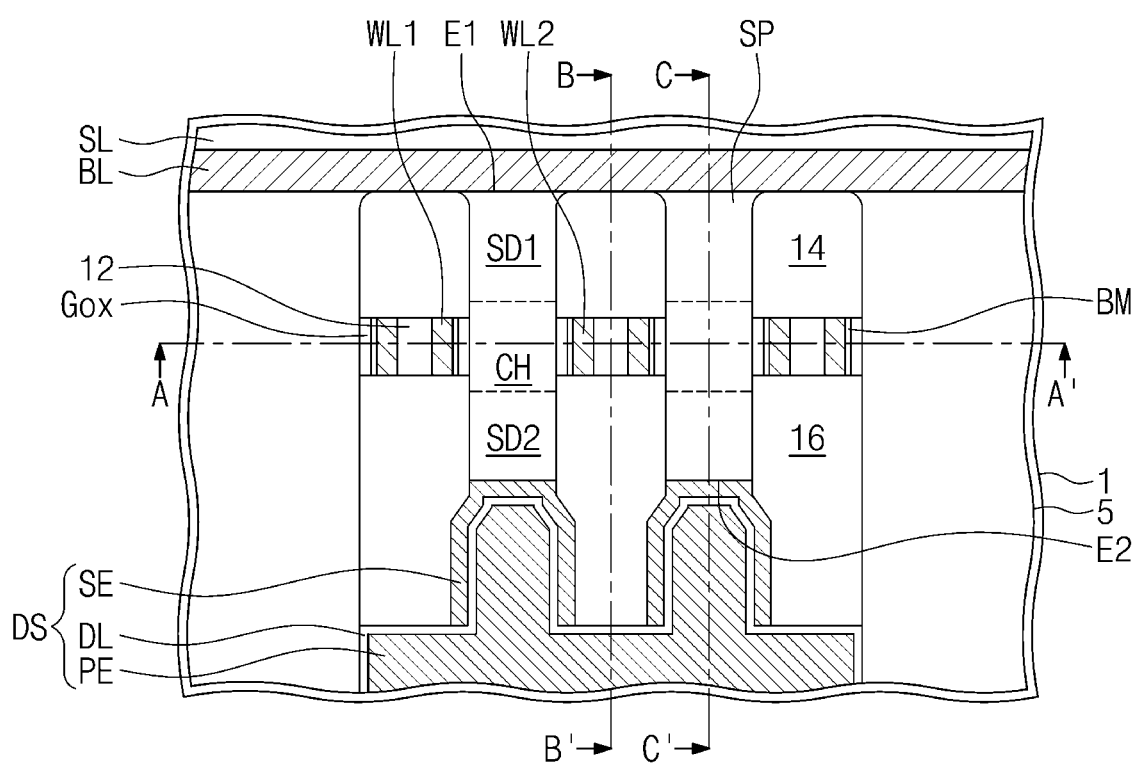
FIG. 14A illustrates a plan view of a three-dimensional semiconductor memory device according to an embodiment.
Figure 14B:
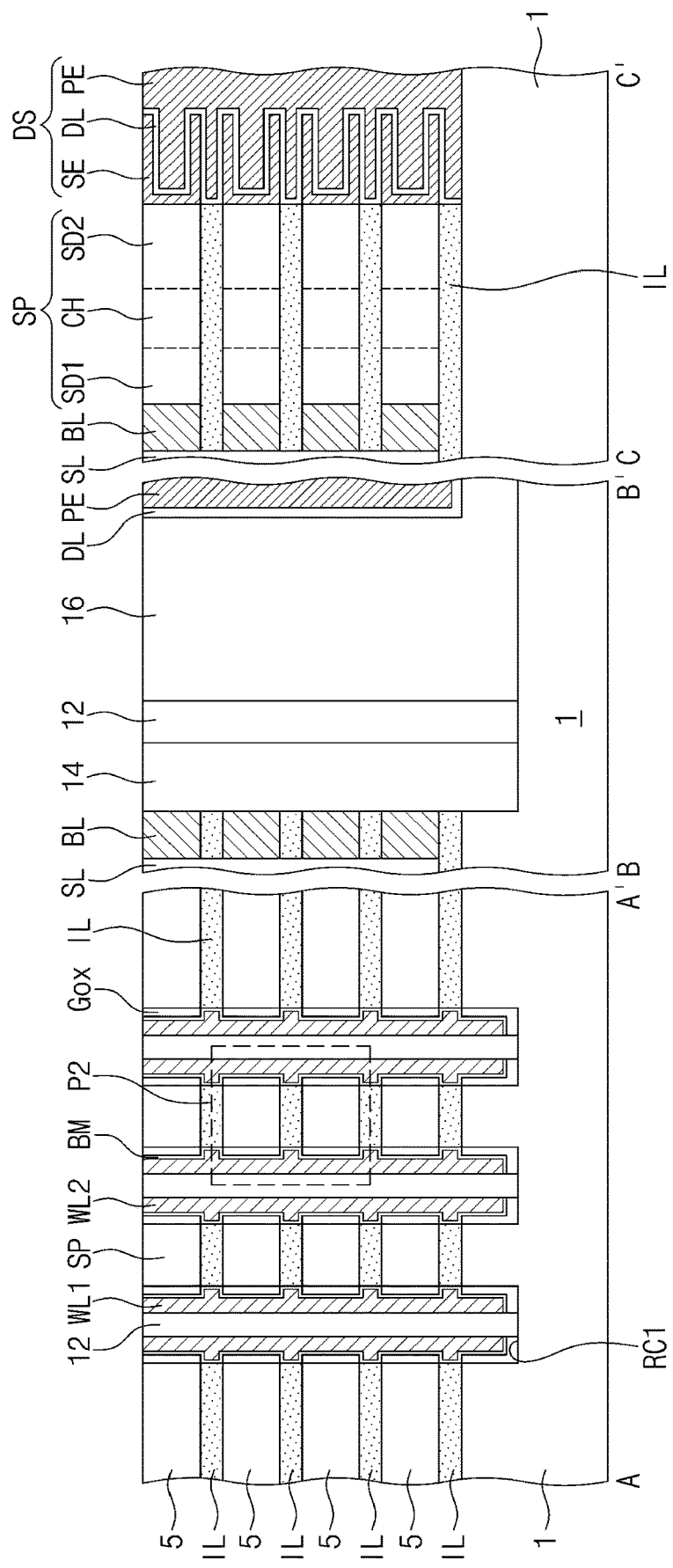
FIG. 14B illustrates a cross-sectional view along lines A-A', B-B', and C-C' of FIG. 14A.
Figure 14C:
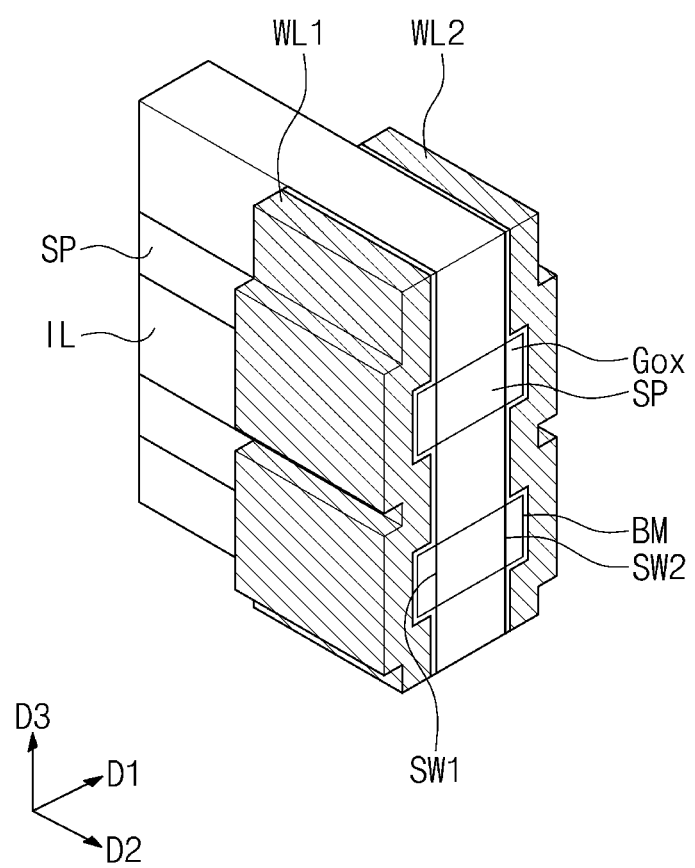
FIG. 14C illustrates a perspective view of a portion (e.g., 'P2' of FIG. 14B) of a three-dimensional semiconductor memory device according to an embodiment.

FIG. 14A is a plan view illustrating a three-dimensional semiconductor memory device according to an embodiment. FIG. 14B is a sectional view illustrating cross-sections of a three-dimensional semiconductor memory device, taken along lines A-A', B-B', and C-C' of FIG. 14A. FIG. 14C is a perspective view illustrating a portion (e.g., 'P2' of FIG. 14B) of a three-dimensional semiconductor memory device according to an embodiment.

Referring to FIGS. 14A to 14C, the semiconductor patterns SP and interlayered insulating layers IL may be alternately stacked on a center region of the substrate 1. The semiconductor layers 5 and the interlayered insulating layers IL may be alternately stacked on an edge region of the substrate 1. Each pair of the semiconductor layer 5 and the semiconductor pattern SP, which are located at the same height, may have the same thickness and may be formed of the same material.

Each of the semiconductor patterns SP may include the first end portion E1, the second end portion E2, the first side surface SW1, and the second side surface SW2, as described with reference to FIG. 2. The first and second source/drain regions SD1 and SD2 and the channel region CH may be disposed in each of the semiconductor patterns SP.

The first and second word lines WL1 and WL2 may be extended from the top surface of the substrate 1 in the third direction D3. The first word line WL1 may be adjacent to the first side surface SW1 of the semiconductor patterns SP, and the second word line WL2 may be adjacent to the second side surface SW2 of the semiconductor patterns SP. The first word line WL1 may be spaced apart from the second word line WL2 with the channel regions CH interposed therebetween.

The gate insulating layers Gox may be respectively interposed between the semiconductor patterns SP and each of the first and second word lines WL1 and WL2. The gate insulating layers Gox may be separated from each other. A diffusion barrier layer BM may be interposed between the gate insulating layers Gox and each of the first and second word lines WL1 and WL2, and between the first interlayered insulating layers IL1 and each of the first and second word lines WL1 and WL2. The diffusion barrier layer BM may include a metal nitride layer, e.g., a tungsten nitride layer, a titanium nitride layer, and a tantalum nitride layer. At least one of a charge storing layer, a ferroelectric layer, a variable resistance layer, or a work function control layer may be interposed between the gate insulating layers Gox and each of the first and second word lines WL1 and WL2. In the present embodiment, the gate insulating layer Gox may not be extended into a region between the semiconductor patterns SP. The interlayered insulating layers IL may not be portions of the gate insulating layer Gox. The interlayered insulating layers IL and the gate insulating layer Gox may be independently formed through different processes and may include the same material or different materials.

Side surfaces of the semiconductor patterns SP may be aligned to a side surface of the interlayered insulating layer IL. A side surface of the gate insulating layer Gox may protrude toward the first and second word lines WL1 and WL2, compared with the side surface of the interlayered insulating layer IL. Side surfaces of the first and second word lines WL1 and WL2 contacting the diffusion barrier layer BM may have an uneven shape.

A first interlayer insulating gap-filling pattern 12 may be disposed between the first and second word lines WL1 and WL2, which are adjacent to each other. A second interlayer insulating gap-filling pattern 14 may be disposed between the bit lines BL and the first and second word lines WL1 and WL2. A third interlayer insulating gap-filling pattern 16 may be interposed between the data storing element DS and the first and second word lines WL1 and WL2. Each of the first to third interlayer insulating gap-filling patterns 12, 14, and 16 may be formed of or include, e.g., at least one of silicon oxide, silicon nitride, or silicon oxynitride. Except for the afore-described differences, the three-dimensional semiconductor memory device according to the present embodiment may have substantially the same features as those described with reference to FIGS. 3A and 3B.

FIGS. 15A to 19A are plan views illustrating a process of fabricating a three-dimensional semiconductor memory device having the planar structure shown in FIG. 14A. FIGS. 15B to 19B are sectional views, each of which illustrates cross-sections of a three-dimensional semiconductor memory device, taken along lines A-A', B-B', and C-C' of FIGS. 15A to 19A, respectively.

Figure 15A:
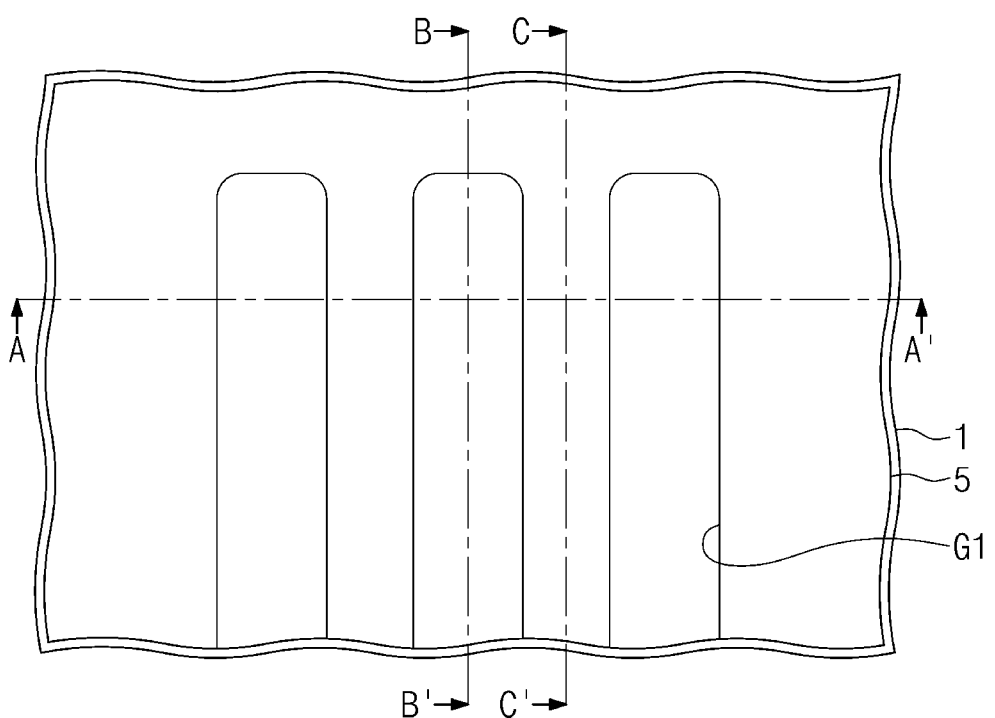
Figure 15A:
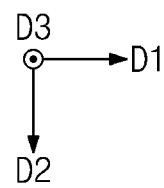
Figure 15B:
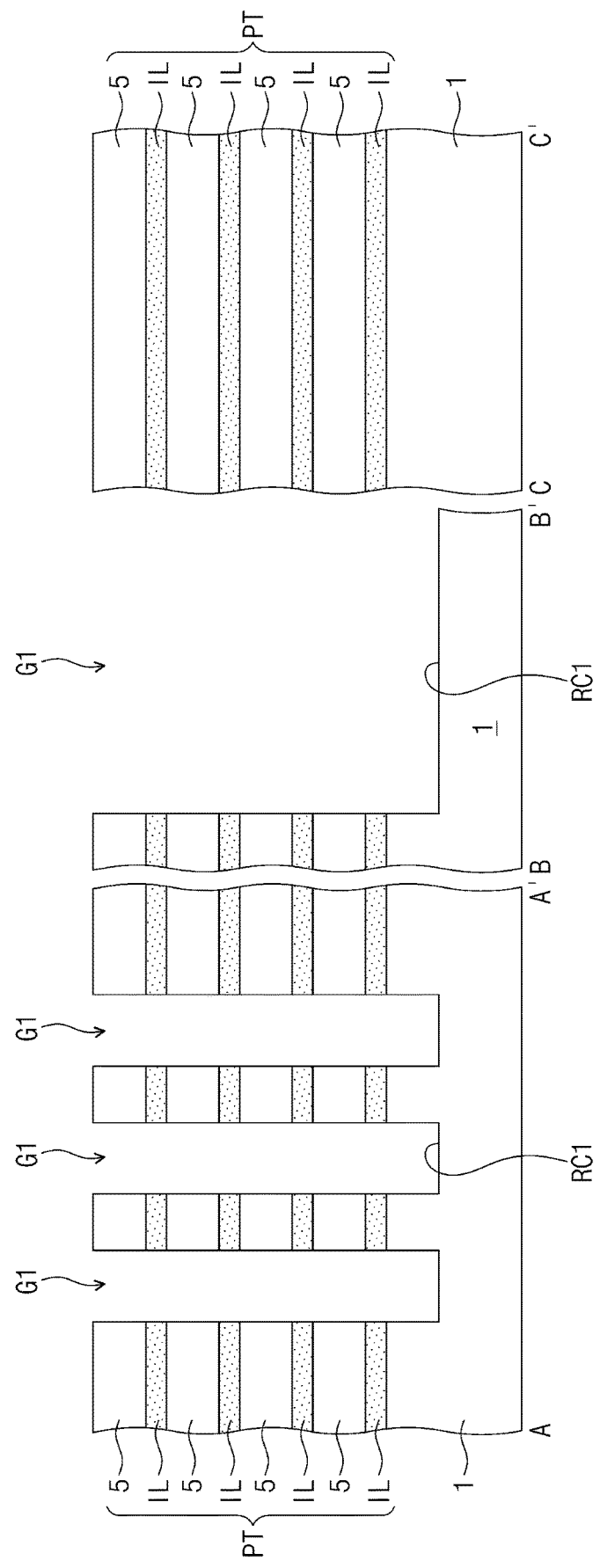

Referring to FIGS. 15A and 15B, the interlayered insulating layers IL and the semiconductor layers 5 may be alternately stacked on the substrate 1 to form the preliminary stack structure PT. The semiconductor layers 5 may be formed of a semiconductor material, e.g., silicon, germanium, silicon germanium, and indium gallium zinc oxide (IGZO). The interlayered insulating layers IL may be formed of an insulating material having an etch selectivity with respect to the semiconductor layers 5. For example, the interlayered insulating layers IL may be formed of, e.g., at least one of silicon oxide, silicon nitride, or silicon oxynitride.

The preliminary stack structure PT may be etched to form the first grooves G1 exposing the substrate 1. The first grooves G1 may be spaced apart from each other in the first direction D1. During the etching of the preliminary stack structure PT, an upper portion of the substrate 1 may be etched to form the first recess region RC1.

Figure 16A:
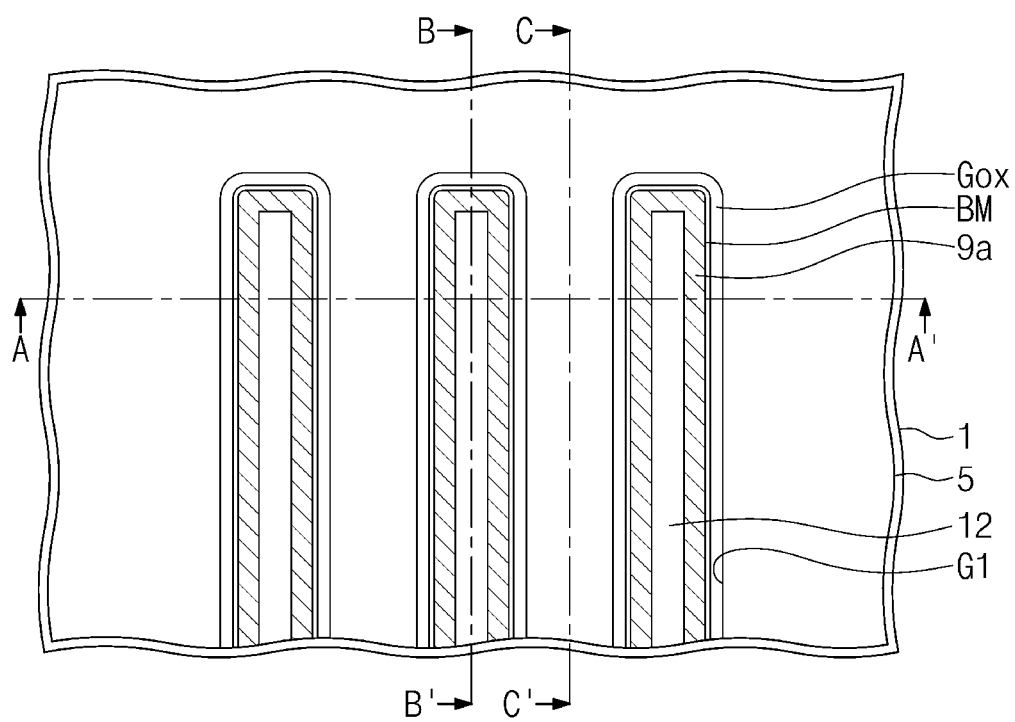
Figure 16A:
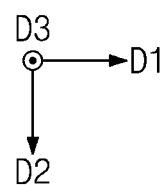
Figure 16B:
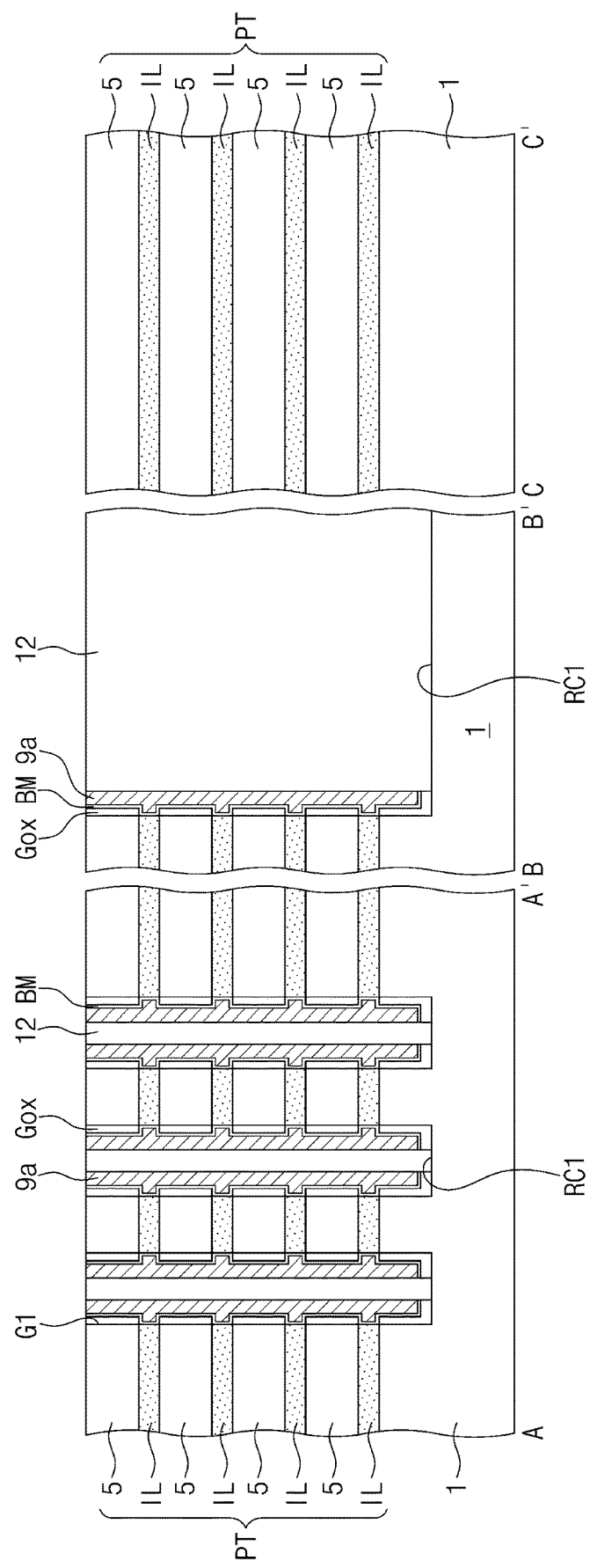

Referring to FIGS. 16A and 16B, a thermal oxidation process may be performed to form the gate insulating layers Gox on exposed surfaces of the semiconductor layers 5, respectively. The gate insulating layer Gox may not be formed on exposed surfaces of the interlayered insulating layers IL. Since the gate insulating layers Gox are formed through the thermal oxidation process, the etch damage of the semiconductor layers 5 may be cured, and this makes it possible to improve the reliability of the three-dimensional semiconductor memory device. The diffusion barrier layer BM and a word line layer may be sequentially formed on the substrate 1, and then, an anisotropic etching process may be performed to form the preliminary word line pattern 9a and to expose the bottom surface of the first recess region RC1. An insulating layer may be deposited on the substrate 1 and may be anisotropically etched to form the first interlayer insulating gap-filling pattern 12 filling the first groove G1.

Figure 17A:
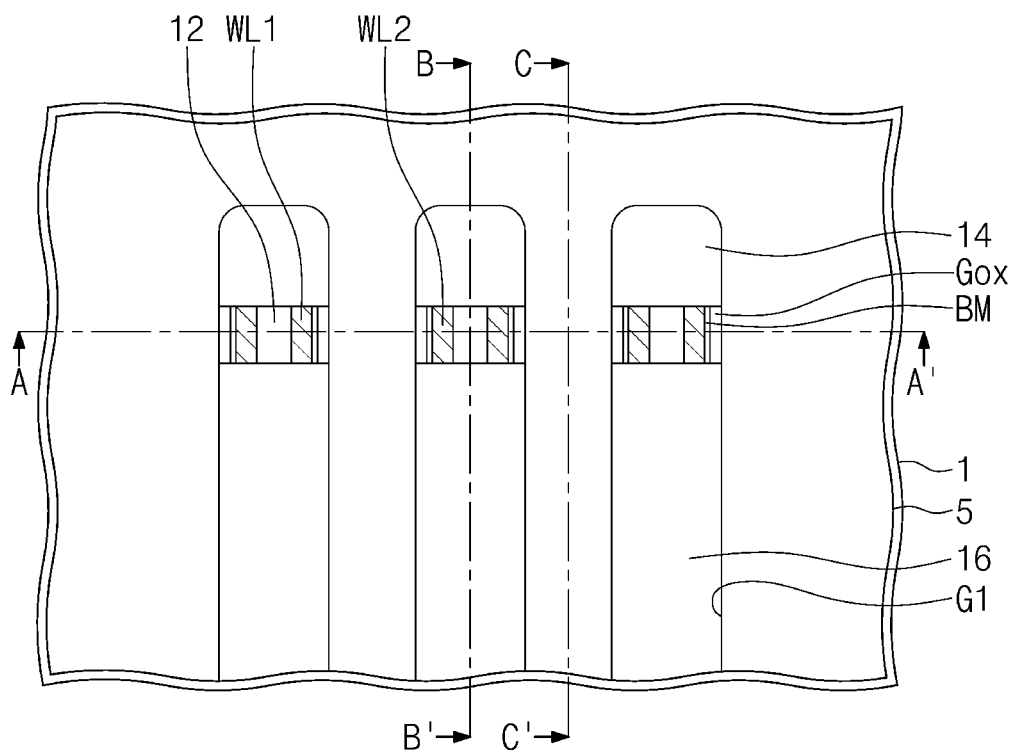
Figure 17A:
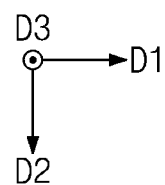
Figure 17B:
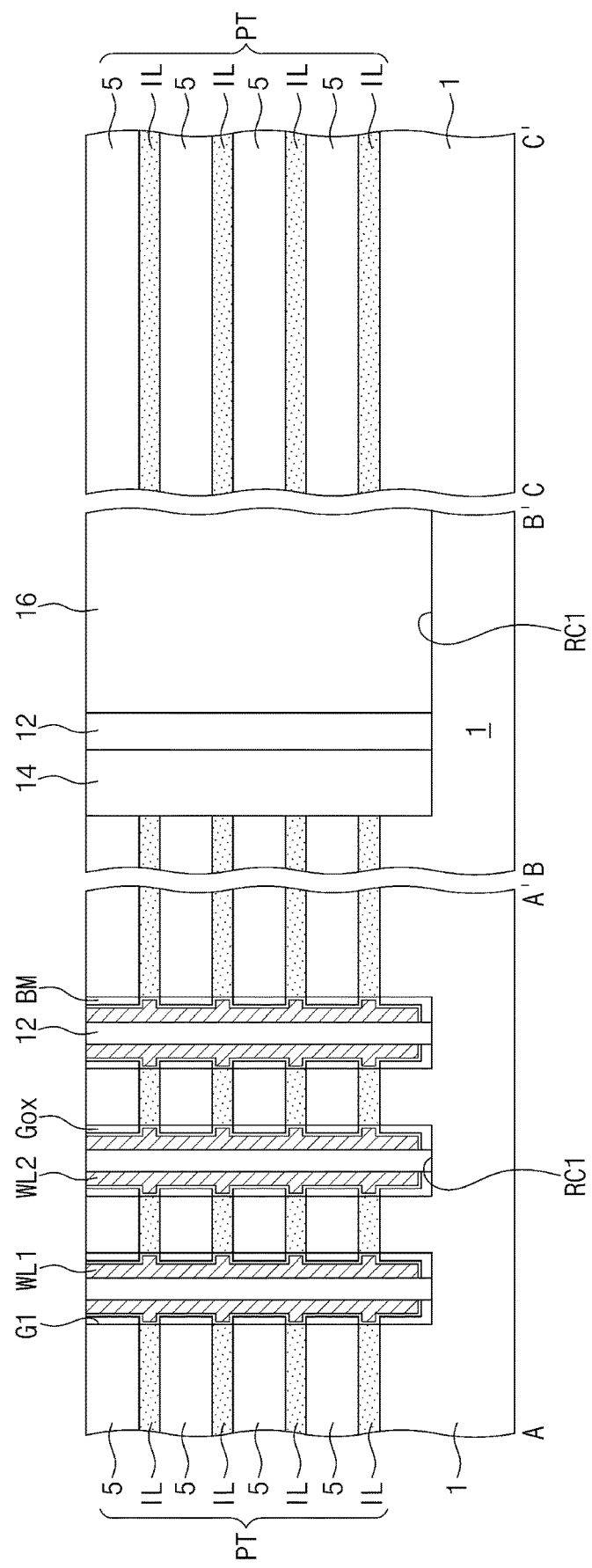

Referring to FIGS. 17A and 17B, the first and second word lines WL1 and WL2, which are spaced apart from each other, may be formed by etching at least the preliminary word line pattern 9a in the first groove G1. Here, the first interlayer insulating gap-filling pattern 12, the diffusion barrier layer BM, and the gate insulating layer Gox in the first groove G1 may be etched. An insulating layer may be deposited and then an etch-back process may be performed on the insulating layer to form the second and third interlayer insulating gap-filling patterns 14 and 16, which fill the first groove G1 and are spaced apart from each other.

Figure 18A:
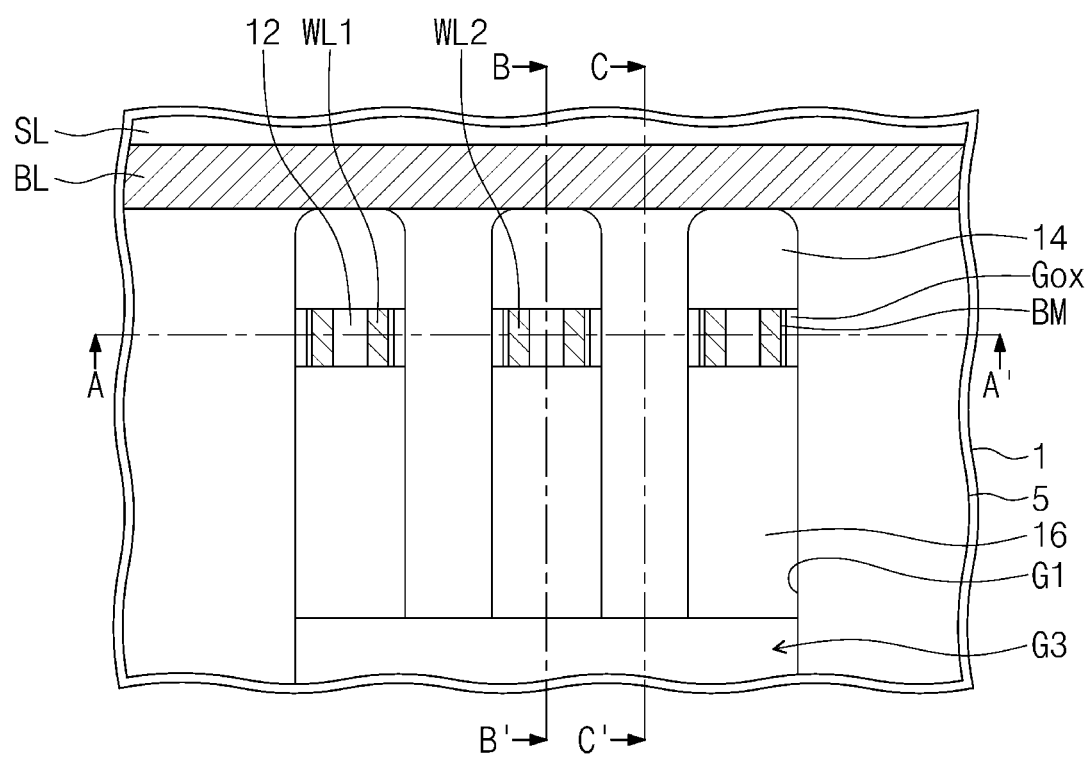
Figure 18A:
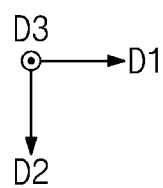
Figure 18B:
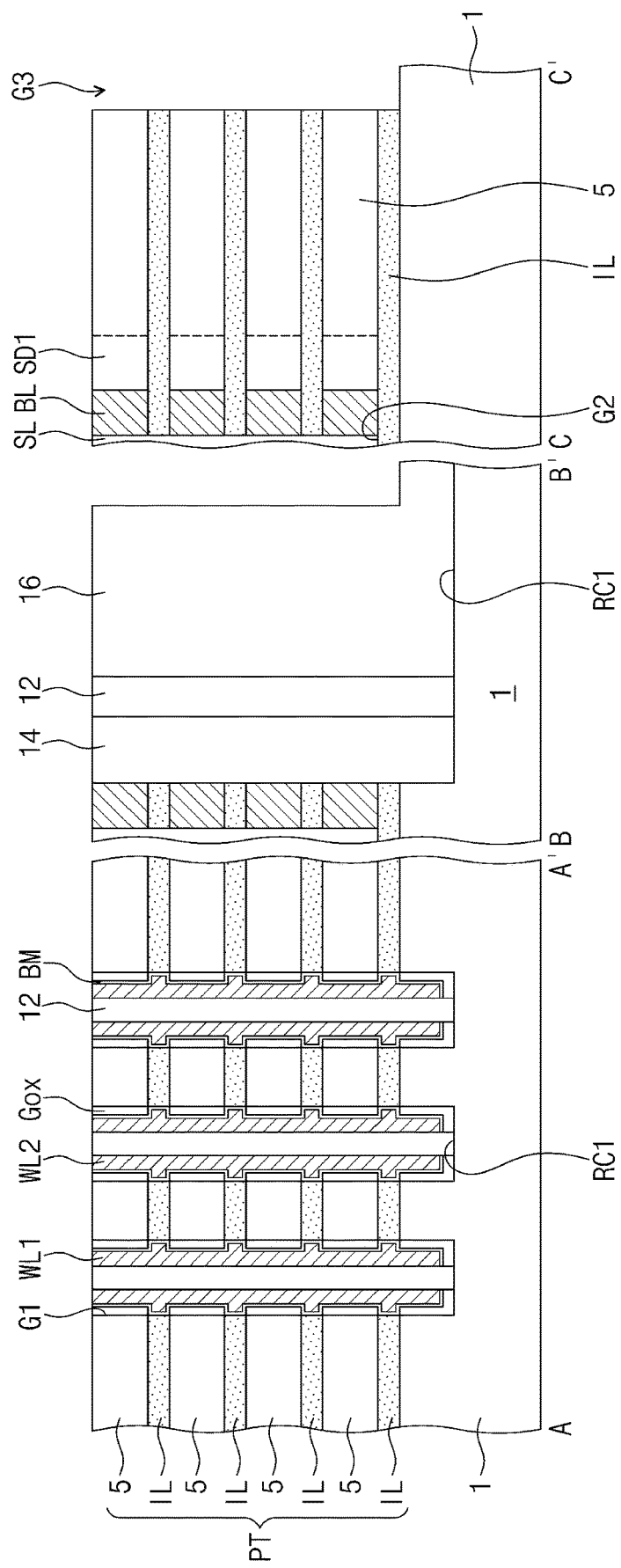

Referring to FIGS. 18A and 18B, the preliminary stack structure PT adjacent to the second interlayer insulating gap-filling pattern 14 may be etched to form the second groove G2. The semiconductor layers 5 exposed through the second groove G2 may be partially removed, and an ion implantation process may be performed to form the first source/drain regions SD1 in the semiconductor layers 5. A conductive layer may be deposited and then may be anisotropically etched to form the bit lines BL. An insulating isolation layer may be deposited to fill the second groove G2 and then may be anisotropically etched to form the insulating isolation pattern SL in the second groove G2. The third interlayer insulating gap-filling pattern 16, the semiconductor layers 5 adjacent thereto, and the interlayered insulating layers IL interposed between the semiconductor layers 5 may be etched to form the third groove G3. The third groove G3 may have a line shape extending in the first direction D1.

Figure 19A:
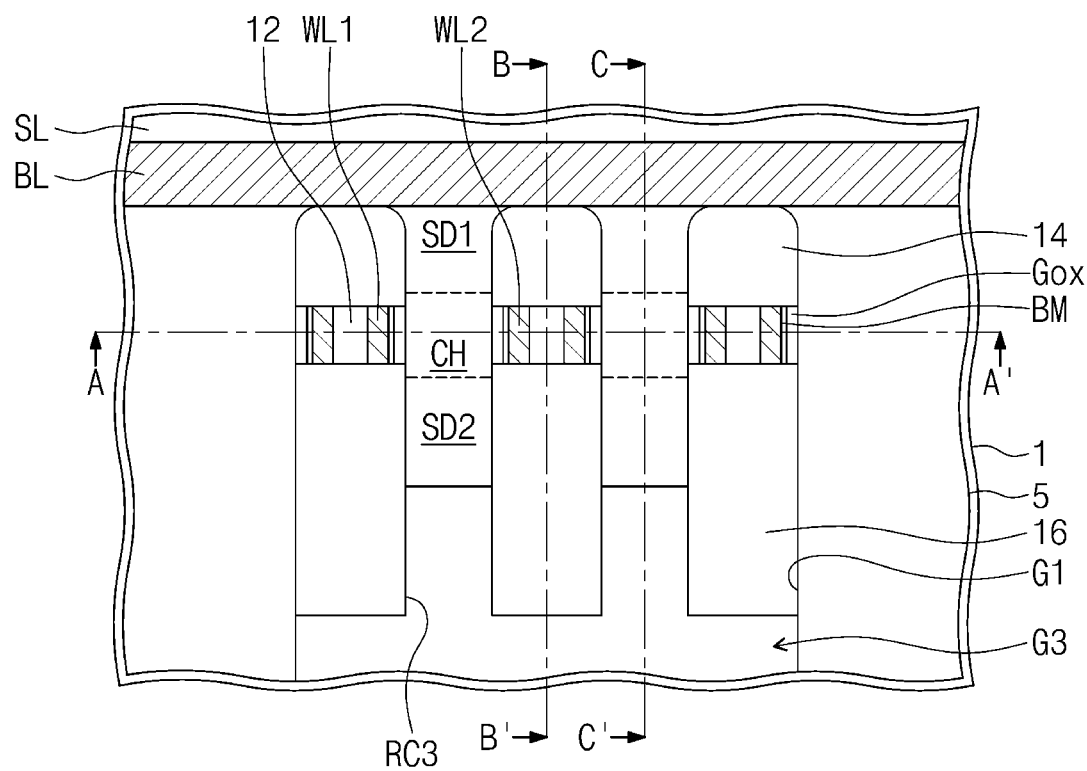
Figure 19A:
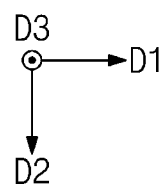
Figure 19B:
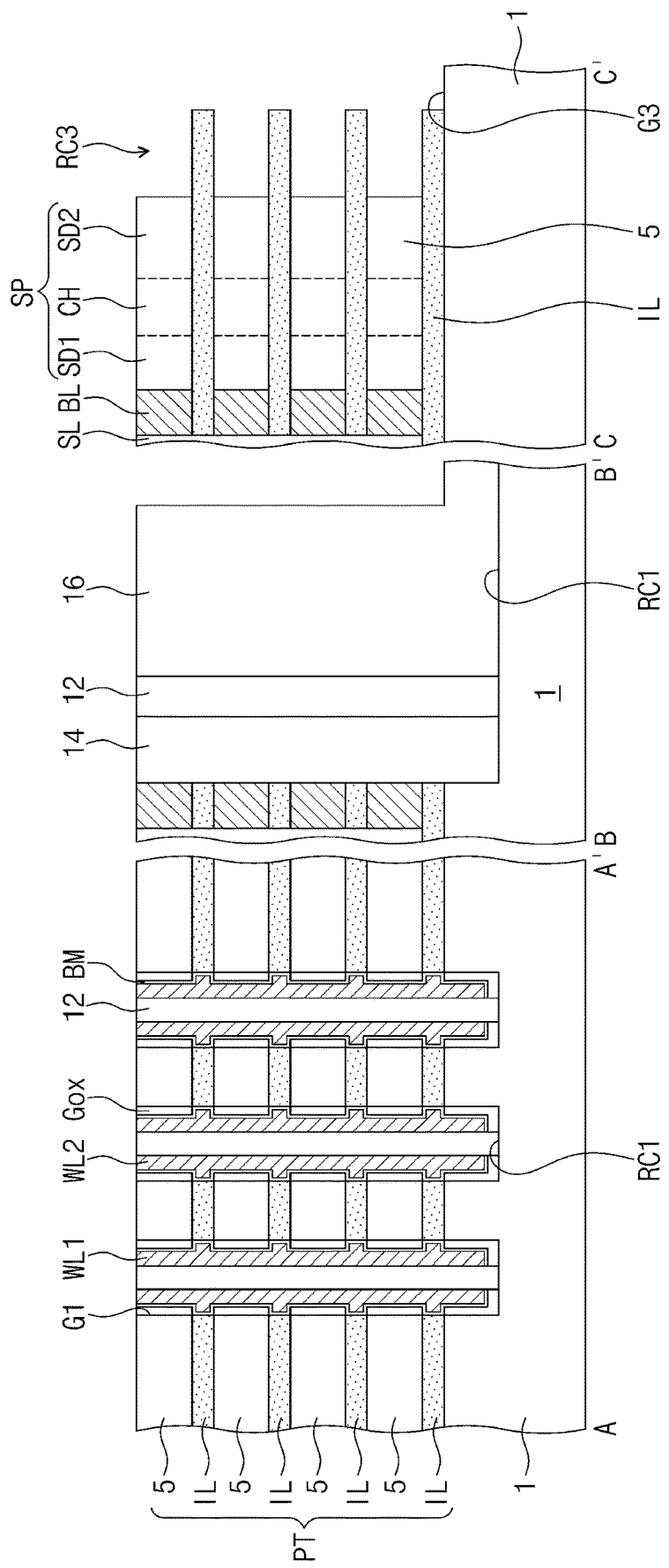

Referring to FIGS. 19A and 19B, the semiconductor layers 5 exposed through the third groove G3 may be partially removed by an isotropic etching process to form the third recess regions RC3 and the semiconductor patterns SP. The third recess regions RC3 may expose top and bottom surfaces of the interlayered insulating layers IL and a side surface of the third interlayer insulating gap-filling pattern 16. An ion implantation process may be performed to form the second source/drain regions SD2 in the semiconductor patterns SP.

Thereafter, the isotropic etching process described with reference to FIGS. 19A, 19B, 14A, and 14B may be performed to laterally etch the side surface of the third interlayer insulating gap-filling pattern 16 exposed through the third recess regions RC3, and as a result of the isotropic etching process, the third recess regions RC3 may have an increased width. A conductive layer may be conformally deposited and then may be anisotropically etched to form the data storage electrode SE. Thereafter, the dielectric layer DL and the plate electrode PE constituting the data storing element DS, e.g., a capacitor, may be formed.

Figure 20A:
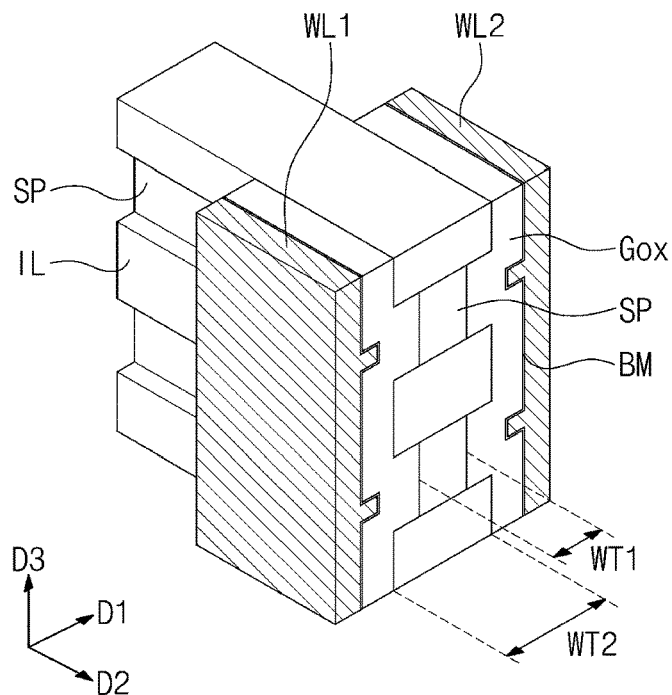
FIG. 20A to 20C illustrate perspective views of a portion of a three-dimensional semiconductor memory device according to an embodiment.
Figure 20B:
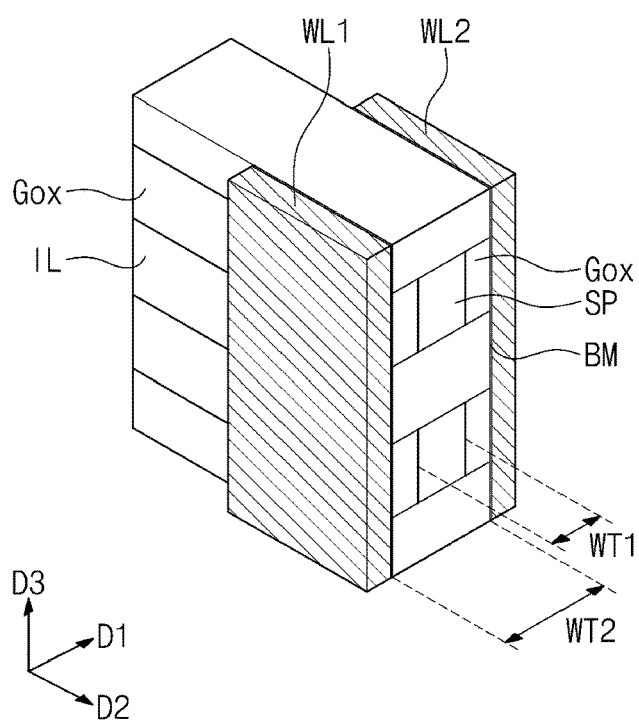
Figure 20C:
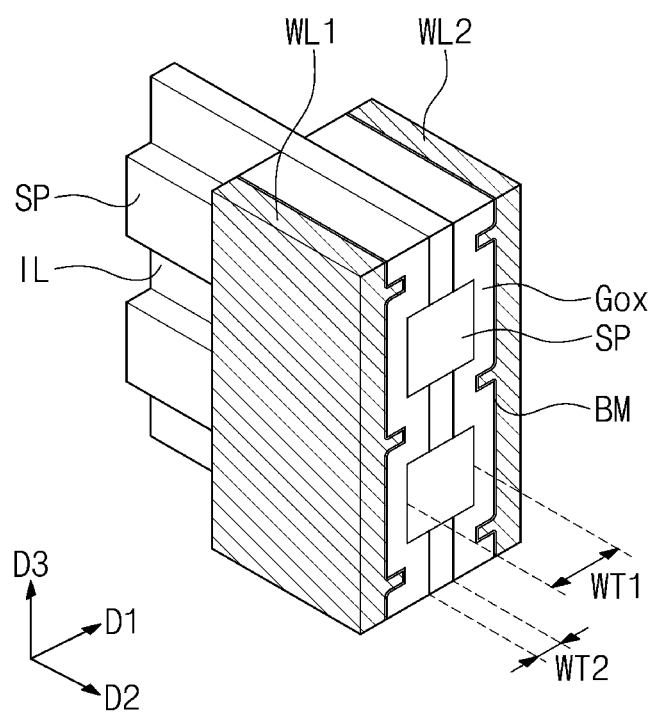

FIG. 20A to 20C are perspective views, each of which illustrates a portion of a three-dimensional semiconductor memory device according to an embodiment.

Referring to FIG. 20A, the semiconductor patterns SP according to the present embodiment may have a first width WT1 in the first direction D1, and the interlayered insulating layer IL may have a second width WT2 in the first direction D1. The first width WT1 may be smaller than the second width WT2. In other words, the side surface of the interlayered insulating layer IL may protrude toward each of the first and second word lines WL1 and WL2, compared with the side surface of the semiconductor patterns SP. The gate insulating layer Gox may be continuously interposed between each of the first and second word lines WL1 and WL2 and the semiconductor patterns SP and between each of the first and second word lines WL1 and WL2 and the interlayered insulating layer IL and may have substantially a constant thickness. The diffusion barrier layer BM may be interposed between the gate insulating layer Gox and each of the first and second word lines WL1 and WL2. The gate insulating layer Gox and the diffusion barrier layer BM may have a concavo-convex structure. Each of the first and second word lines WL1 and WL2 may include protruding portions, which are extended toward the semiconductor patterns SP. The diffusion barrier layer BM may be omitted. Except for the afore-described differences, the three-dimensional semiconductor memory device according to the present embodiment may have substantially the same features as those described with reference to FIGS. 14A and 14B.

In an alternative example shown in FIG. 20B, the gate insulating layers Gox according to the present embodiments may be spaced apart from each other. The gate insulating layers Gox may be interposed only between each of the first and second word lines WL1 and WL2 and the semiconductor patterns SP. The side surfaces of the gate insulating layers Gox may be aligned to the side surface of the interlayered insulating layer IL. The diffusion barrier layer BM may be in contact with both of the interlayered insulating layer IL and the gate insulating layer Gox. The first and second word lines WL1 and WL2 may not include the protruding portion. Except for the afore-described differences, the three-dimensional semiconductor memory device according to the present embodiment may have substantially the same features as those described with reference to FIG. 20A.

In an alternative example shown in FIG. 20C, the semiconductor patterns SP may have a first width WT1 in the first direction D1, and the interlayered insulating layer IL may have a second width WT2 in the first direction D1. The first width WT1 may be larger than the second width WT2. In other words, the side surfaces of the semiconductor patterns SP may protrude toward each of the first and second word lines WL1 and WL2, compared with the side surface of the interlayered insulating layer IL. The gate insulating layer Gox may be continuously interposed between each of the first and second word lines WL1 and WL2 and the semiconductor patterns SP, and between each of the first and second word lines WL1 and WL2 and the interlayered insulating layer IL, and may have substantially a constant thickness. Portions of each of the first and second word lines WL1 and WL2 between the semiconductor patterns SP may protrude toward the interlayered insulating layer IL. The side surfaces of each of the first and second word lines WL1 and WL2 adjacent to the gate insulating layer Gox may have a concave-convex structure. Since each of the first and second word lines WL1 and WL2 is adjacent to the side surfaces of the semiconductor patterns SP as well as the top and bottom surfaces of the semiconductor patterns SP, the channel controllability by each of first and second word lines WL1 and WL2 may be improved. This makes it possible to improve the reliability of the three-dimensional semiconductor memory device. Except for the afore-described differences, the three-dimensional semiconductor memory device according to the present embodiment may have substantially the same features as those described with reference to FIG. 20A.

Figure 21:
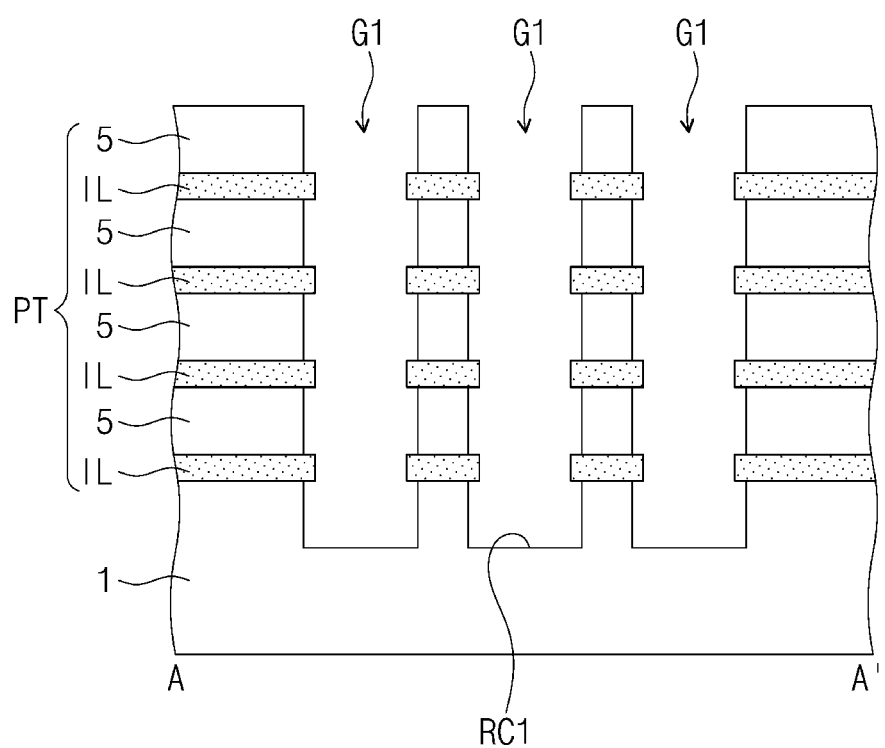
FIG. 21 illustrates a cross-sectional view of a process of fabricating the three-dimensional semiconductor memory device of FIG. 20A or 20B.

FIG. 21 is a sectional view illustrating a process of fabricating the three-dimensional semiconductor memory device of FIG. 20A or 20B.

Referring to FIG. 21, an isotropic etching process may be performed on a structure, which has the same section A-A' as shown in FIG. 15B, to laterally etch the semiconductor layers 5 and to partially expose the top and bottom surfaces of the interlayered insulating layers IL. As a result, the first groove G1 may have an increased width, and the first recess region RC1 may have an increased depth. Thereafter, a deposition process (e.g., chemical vapor deposition (CVD) or atomic layer deposition (ALD)) may be performed to form the gate insulating layer Gox to a uniform thickness, and then, the subsequent process steps described with reference to FIGS. 16A to 19B may be performed to obtain the structure shown in FIG. 20A. Alternatively, a thermal oxidation process may be performed to form the gate insulating layer Gox on only the exposed surfaces of the semiconductor layers 5, and then, the subsequent process steps described with reference to FIGS. 16A to 19B may be performed to obtain the structure shown in FIG. 20B.

The semiconductor device of FIG. 20C may be fabricated by the following fabrication process. An isotropic etching process may be performed on a structure, which has the same section A-A' as shown in FIG. 15B, to laterally etch the interlayered insulating layers IL and to partially expose the top and bottom surfaces of the semiconductor layers 5. Thereafter, a deposition process may be performed to form the gate insulating layer Gox to a uniform thickness, and then, the subsequent process steps described with reference to FIGS. 16A to 19B may be performed to obtain the structure shown in FIG. 20C.

Figure 22:
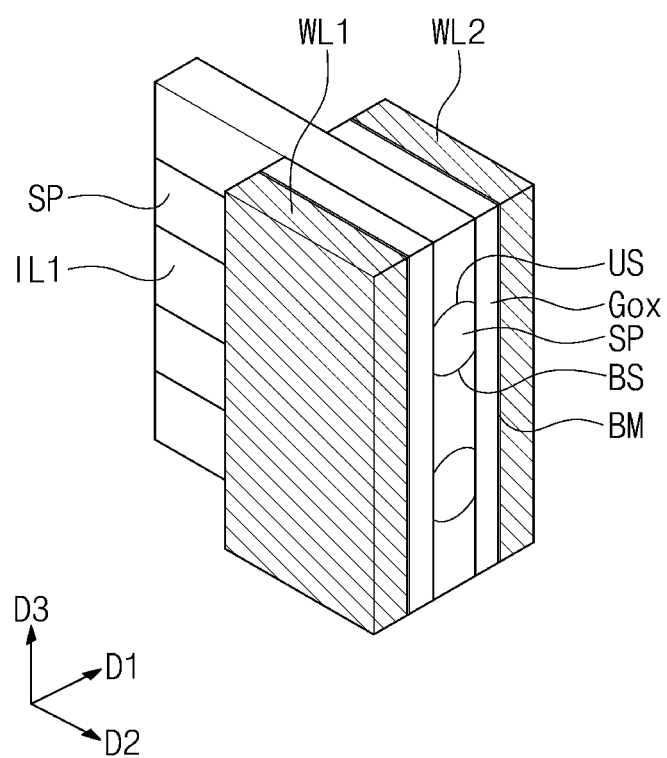
FIG. 22 illustrates a perspective view of a portion of a three-dimensional semiconductor memory device according to an embodiment.

FIG. 22 is a perspective view illustrating a portion of a three-dimensional semiconductor memory device according to an embodiment.

Referring to FIG. 22, each of the semiconductor patterns SP according to the present embodiment may include a top surface US and a bottom surface BS. The top surface US and the bottom surface BS may have a non-flat (e.g., rounded) shape. The top surface US and the bottom surface BS may protrude in upward and downward directions, respectively. The first interlayered insulating layers IL1 may be respectively interposed between the semiconductor patterns SP. The side surfaces of the semiconductor patterns SP may be aligned to the side surfaces of the first interlayered insulating layers IL1. The side surfaces of the semiconductor patterns SP and the first interlayered insulating layers IL1 may be covered with the gate insulating layer Gox. The side surface of the gate insulating layer Gox may be covered with the diffusion barrier layer BM. The diffusion barrier layer BM may be in contact with the first and second word lines WL1 and WL2. Except for the afore-described differences, the three-dimensional semiconductor memory device according to the present embodiment may have substantially the same features as those described with reference to FIG. 20A.

Figure 23A:
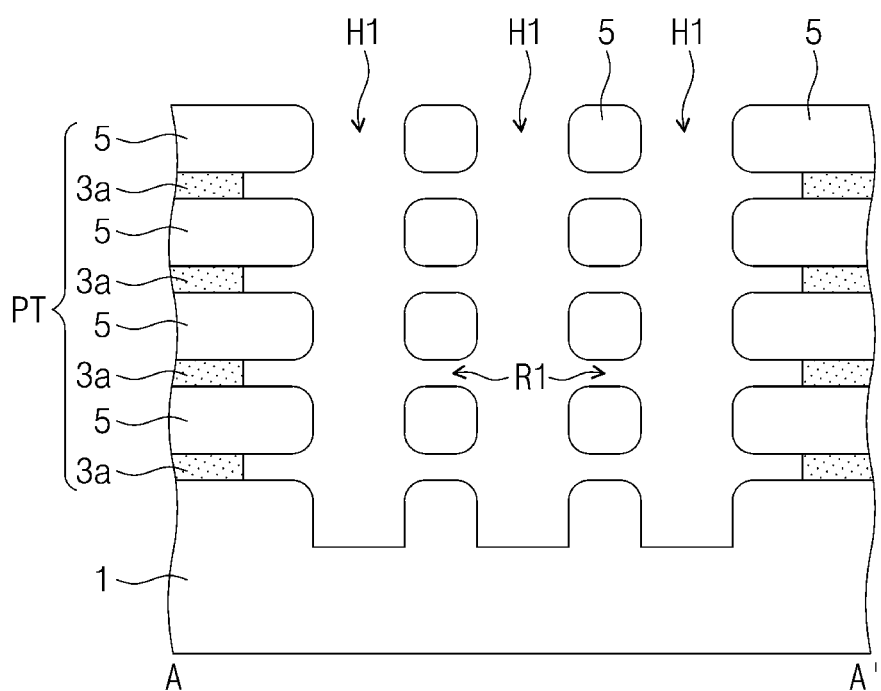
FIGS. 23A and 23B illustrate cross-sectional views of stages in a process of fabricating the three-dimensional semiconductor memory device of FIG. 22.
Figure 23B:
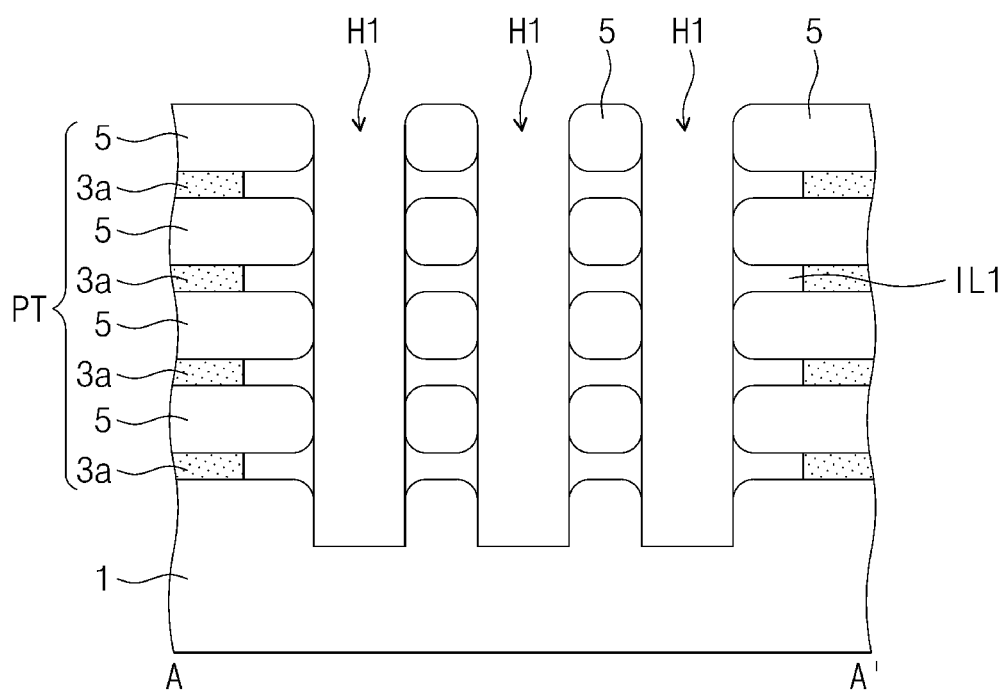

FIGS. 23A and 23B are sectional views illustrating a process of fabricating the three-dimensional semiconductor memory device of FIG. 22.

As shown in FIG. 5B, the sacrificial layers 3 may be partially removed through the first holes H1 to form the first regions R1 and to leave the sacrificial patterns 3a. Next, as shown in FIG. 23A, an isotropic etching process may be performed on the resulting structure, which has substantially the same section as that of FIG. 5B, and thus, corners of the semiconductor layers 5 may be rounded.

Next, referring to FIG. 23B, an insulating layer may be deposited on the substrate 1 and may be anisotropically etched to form the first interlayered insulating layers IL1 in the first regions R1 or between the semiconductor layers 5. Thereafter, the gate insulating layer Gox, the diffusion barrier layer BM, and the word line layer may be conformally deposited on the substrate 1 and then may be anisotropically etched. Next, the process steps described with reference to FIGS. 7A to 12B may be performed to fabricate the three-dimensional semiconductor memory device of FIG. 22.

Figure 24A:
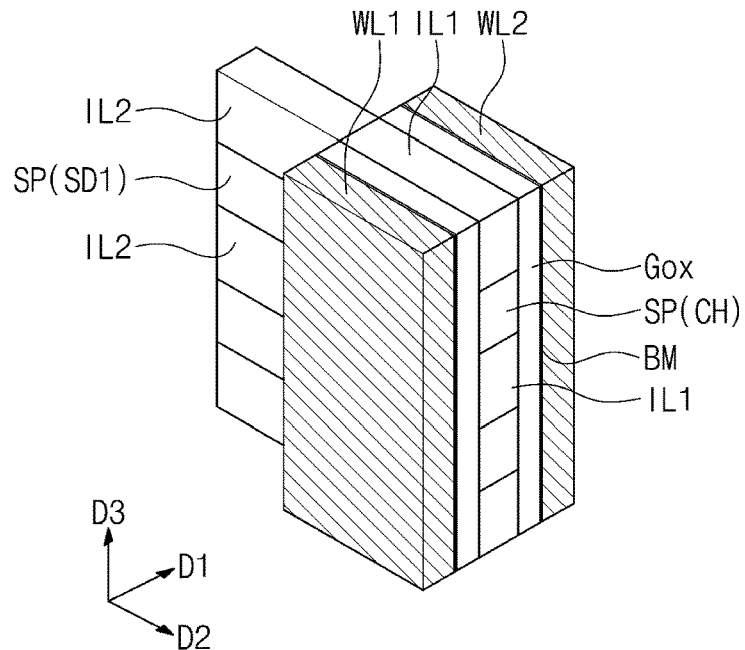
FIGS. 24A and 24B illustrate perspective views of three-dimensional semiconductor memory devices according to embodiments.
Figure 24B:
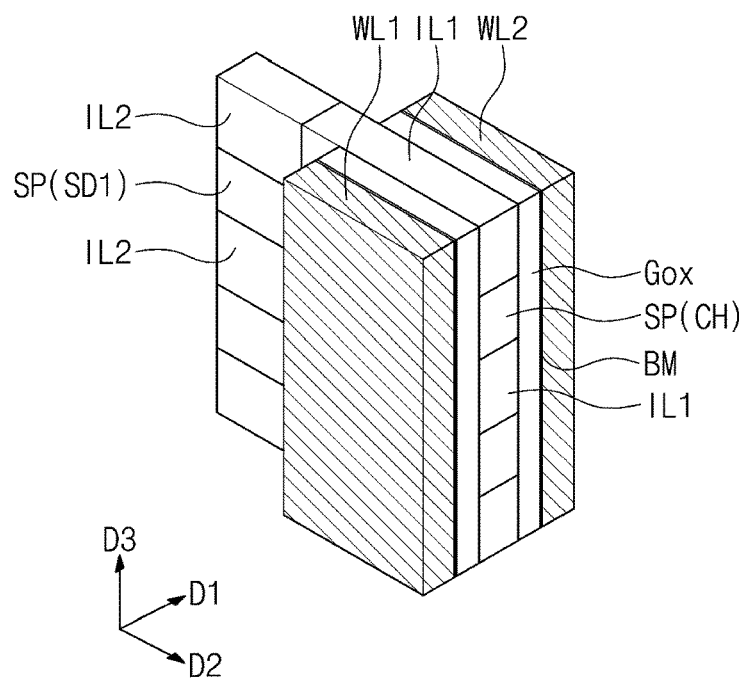

FIGS. 24A and 24B are perspective views, each of which illustrates a portion of a three-dimensional semiconductor memory device according to an embodiment.

Referring to FIGS. 24A and 24B, the first interlayered insulating layer IL1 may be interposed between the channel regions CH of the semiconductor patterns SP, and the second interlayered insulating layer IL2 may be interposed between the first source/drain regions SD1 of the semiconductor patterns SP. An interface between the first interlayered insulating layer IL1 and the second interlayered insulating layer IL2 at a specific height may be adjacent to top edge portions of the word lines WL1 and WL2, as shown in FIG. 24A. In an alternative example shown in FIG. 24B, the first interlayered insulating layer IL1 may protrude out of a region between the word lines WL1 and WL2. The top and bottom surfaces of the semiconductor patterns SP may be flat. The first and second interlayered insulating layers IL1 and IL2 may include the same material or different materials. Except for the afore-described differences, the three-dimensional semiconductor memory device according to the present embodiment may have substantially the same features as those described with reference to FIG. 22. In the three-dimensional semiconductor memory device of FIGS. 24A and 24B, the materials and positions of the first and second interlayered insulating layers IL1 and IL2 may be adjusted to optimize the performance of the three-dimensional semiconductor memory device. For example, the first interlayered insulating layer IL1 may be formed of an insulating material, whose dielectric constant is lower than that of the second interlayered insulating layer IL2, and in this case, it may be possible to reduce an interference issue between the semiconductor patterns SP. In addition, the second interlayered insulating layer IL2 may be formed of an insulating material, which has a mechanical strength higher than the first interlayered insulating layer IL1, and in this case, it may be possible to prevent a crack issue from occurring in the three-dimensional semiconductor memory device.

Figure 25A:
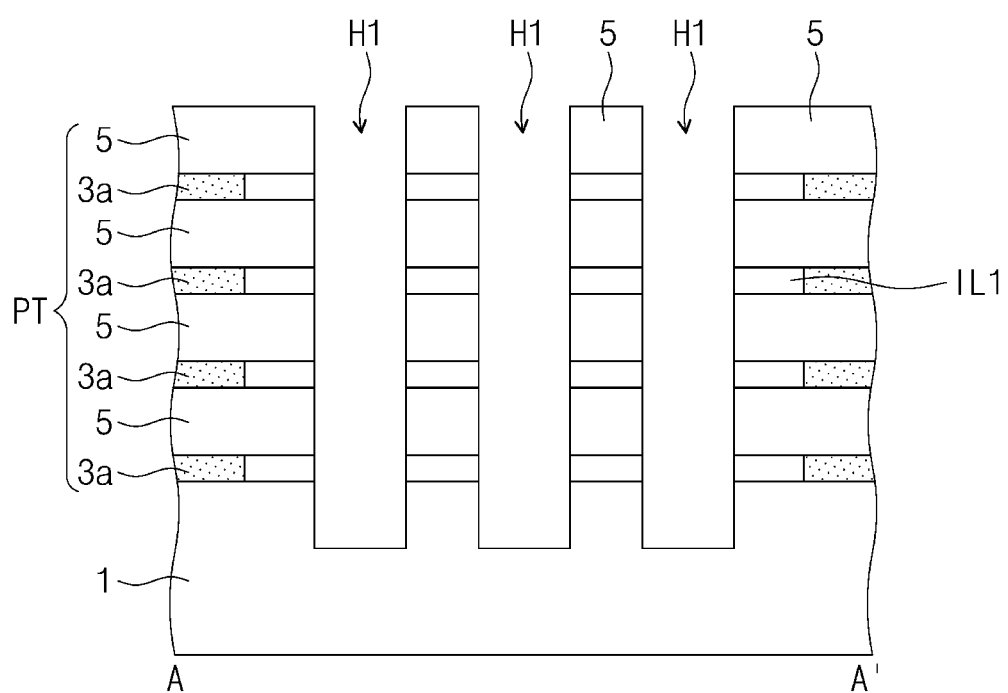
FIGS. 25A and 25B illustrate cross-sectional views of stages in a process of fabricating the three-dimensional semiconductor memory device of FIG. 24A or 24B.
Figure 25B:
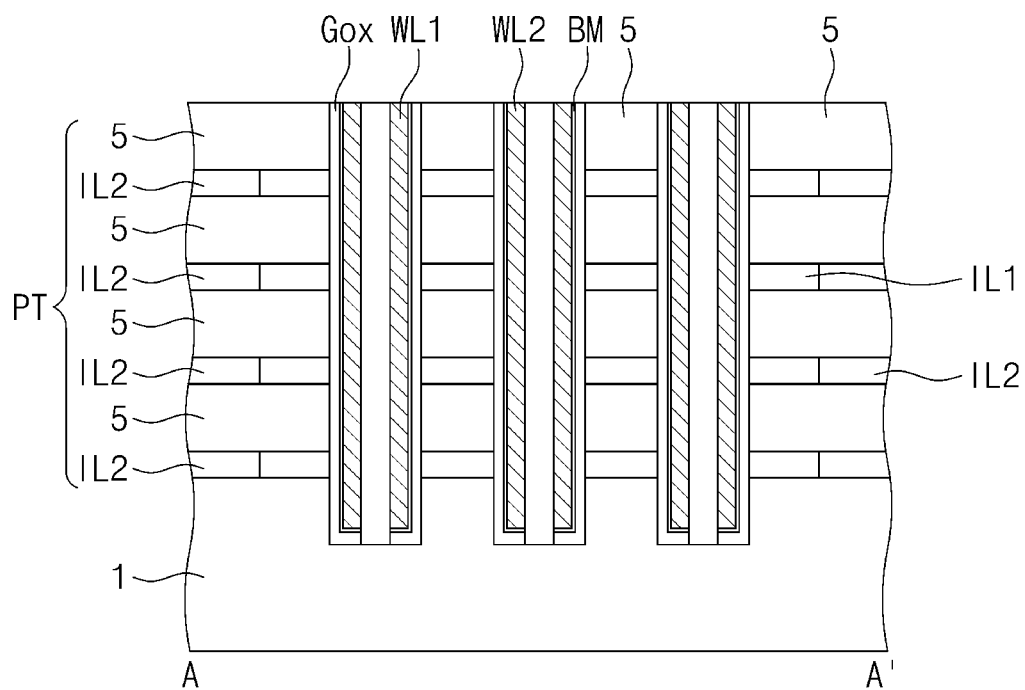

FIGS. 25A and 25B are sectional views illustrating a process of fabricating the three-dimensional semiconductor memory device of FIG. 24A or 24B.

As shown in FIG. 5B, the sacrificial layers 3 may be partially removed through the first holes H1 to form the first regions R1 and to leave the sacrificial patterns 3a. Next, as shown in FIG. 25A, an insulating layer may be deposited on the structure of FIG. 5B and may be anisotropically etched to form the first interlayered insulating layers IL1 in the first regions R1 or between the semiconductor layers 5. Thereafter, as shown in FIG. 25B, the gate insulating layer Gox and the diffusion barrier layer BM may be sequentially deposited by deposition processes to conformally cover the structure of FIG. 25A, and then, the word line layer may be deposited on the gate insulating layer Gox. Thereafter, an etching process steps may be performed on the word line layer to form the first and second word lines WL1 and WL2. The semiconductor device may have the structure of FIG. 24A or 24B, depending on a removal amount of the sacrificial layers 3 in the removal step of FIG. 5B.

Figure 26A:
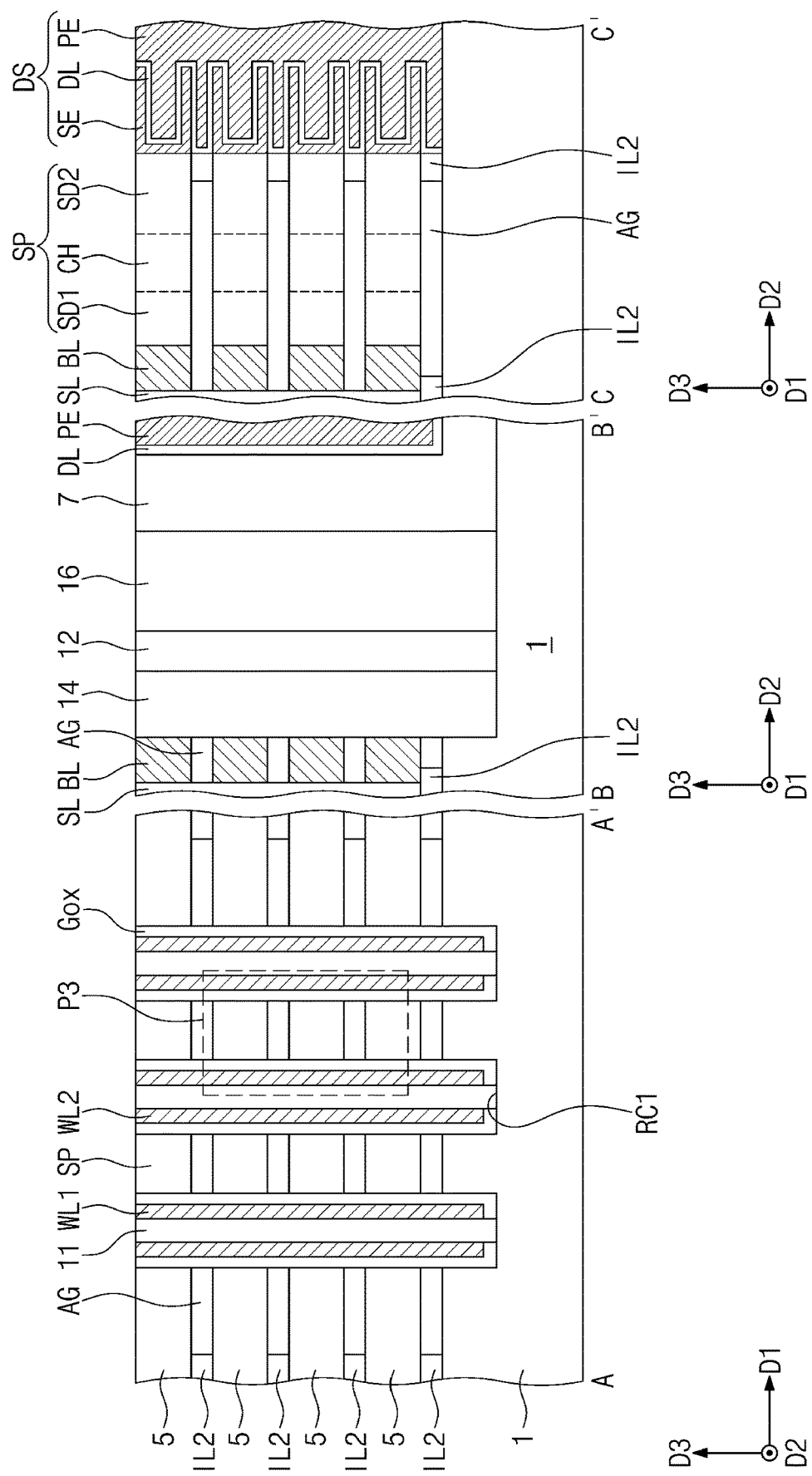
FIG. 26A illustrates a cross-sectional view along lines A-A', B-B', and C-C' of FIG. 14A.
Figure 26B:
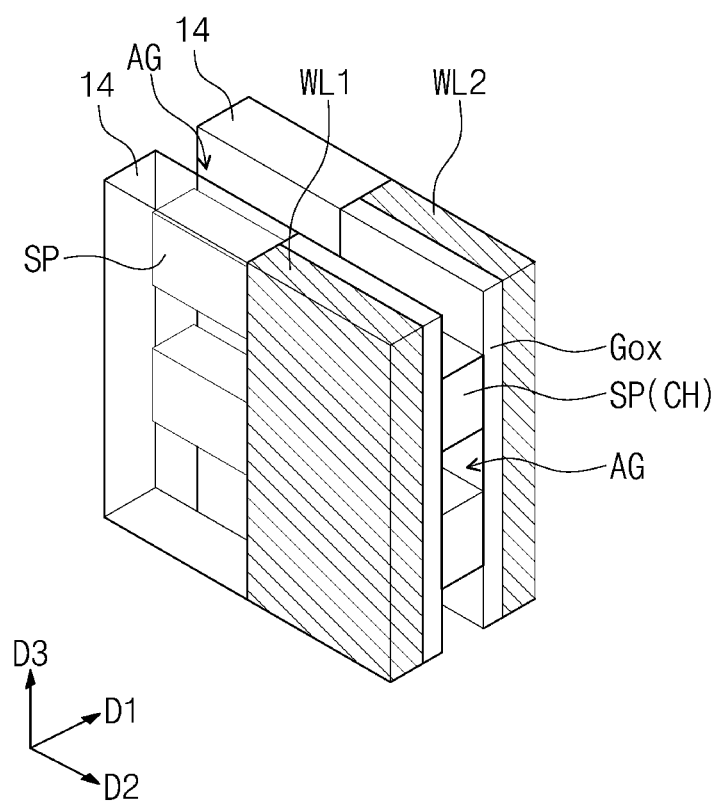
FIG. 26B illustrates a perspective view of portion 'P3' of FIG. 26A.

FIG. 26A is a sectional view illustrating cross-sections of a three-dimensional semiconductor memory device, taken along lines A-A', B-B', and C-C' of FIG. 14A. FIG. 26B is a perspective view illustrating a portion 'P3' of FIG. 26A.

Referring to FIGS. 26A and 26B, the air gap regions AG may be disposed between the semiconductor patterns SP and between the semiconductor layers 5. In this structure, the air gap region AG may be referred to as an 'empty space'. The air gap region AG may expose the top and bottom surfaces of the semiconductor patterns SP and the top and bottom surfaces of the semiconductor layers 5. The air gap region AG may be extended into regions between the bit lines BL to expose the top and bottom surfaces of the bit lines BL. As shown in the section A-A' of FIG. 26A, the second interlayered insulating layer IL2 may be interposed between edge portions of the semiconductor layers 5. As shown in the section C-C' of FIG. 26A, the second interlayered insulating layer IL2 may be interposed between edge portions of the semiconductor patterns SP. Referring to FIG. 26B, a side surface of the second interlayer insulating gap-filling pattern 14 may be exposed through the air gap region AG. Except for the afore-described differences, the three-dimensional semiconductor memory device according to the present embodiment may have substantially the same features as those described with reference to FIGS. 14A and 14B. Due to the air gap region AG, it may be possible to reduce a parasitic capacitance between the semiconductor patterns SP and between the first and second word lines WL1 and WL2 and to reduce interference between electrical signals.

Figure 27:
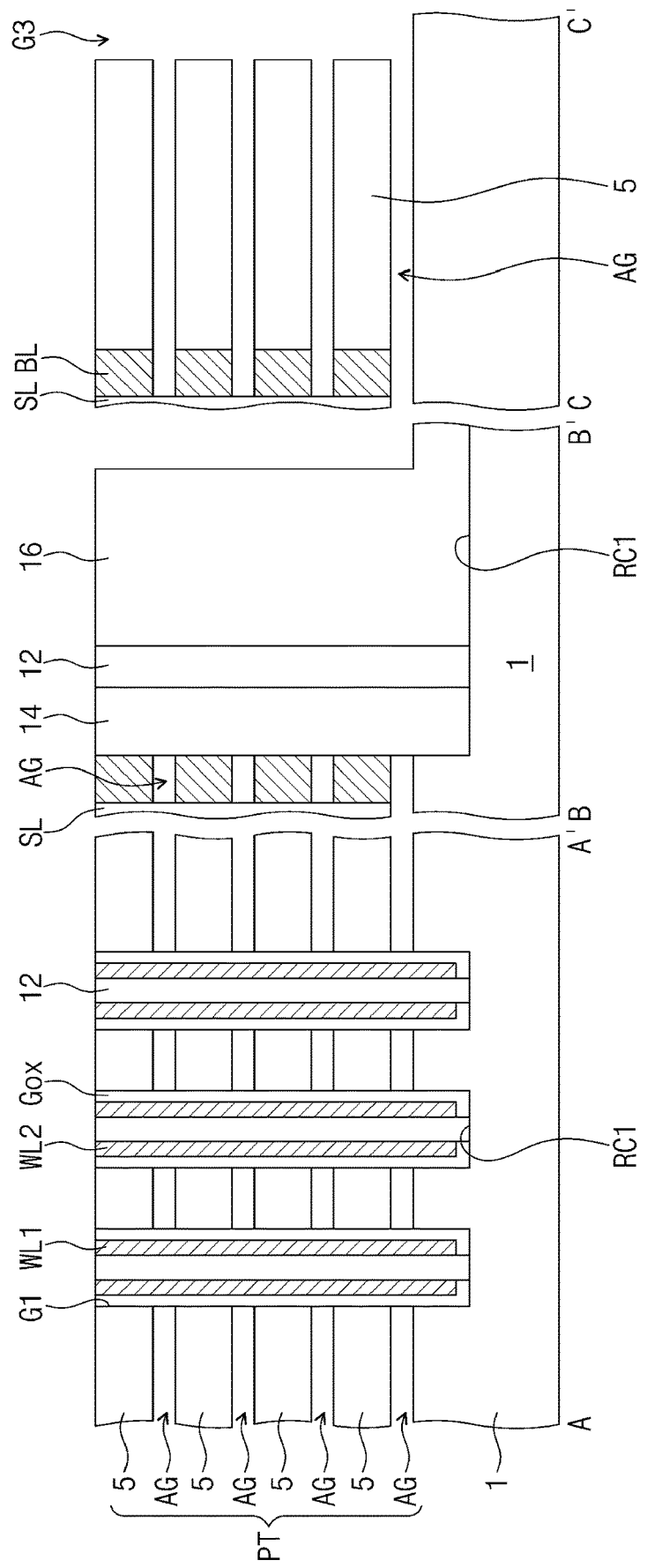
FIG. 27 illustrates a cross-sectional view of a process of fabricating a three-dimensional semiconductor memory device of FIG. 26A.

FIG. 27 is a sectional view illustrating a method of fabricating a three-dimensional semiconductor memory device having the sectional structure of FIG. 26A.

Referring to FIG. 27, the interlayered insulating layer IL, which is exposed through the third groove G3, may be fully removed from the structure of FIG. 18B to form the air gap regions AG. Here, the gate insulating layer Gox, the first and second word lines WL1 and WL2, and the first to third interlayer insulating gap-filling patterns 12, 14, and 16 may prevent the preliminary stack structure PT from leaning or collapsing. Referring back to FIG. 26A, the second interlayered insulating layers IL2 may be formed to close the entrances of the air gap regions AG, and in an embodiment, the second interlayered insulating layers IL2 may be formed by a deposition method with a poor step-coverage property or may be formed of an insulating material. Thereafter, the subsequent processes may be performed.

FIGS. 28 to 37 are perspective views, each of which illustrates a portion of a three-dimensional semiconductor memory device according to an embodiment.

Figure 28:
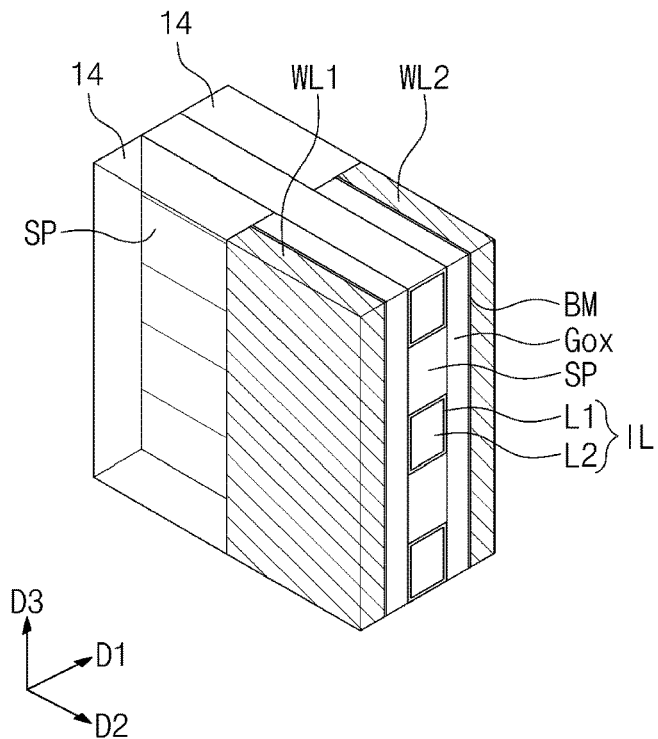
FIGS. 28 to 37 illustrate perspective views of three-dimensional semiconductor memory devices according to embodiment.

Referring to FIG. 28, the interlayered insulating layer IL may include a first insulating layer L1 and a second insulating layer L2. The first insulating layer L1 and the second insulating layer L2 may be formed of different materials. The first insulating layer L1 may cover the side surface of the gate insulating layer Gox, the top and bottom surfaces of the semiconductor patterns SP, and the side surface of the second interlayer insulating gap-filling pattern 14. The first insulating layer L1 may be a hollow closed-loop shape, when viewed in a cross-section parallel to the first direction D1. The second insulating layer L2 may fill spaces between the semiconductor patterns SP. The three-dimensional semiconductor memory device of FIG. 28 may be formed by forming the air gap region AG to have the structure shown in FIG. 27, thinly forming the first insulating layer L1 to conformally cover the air gap region AG, filling the air gap region AG with the second insulating layer L2, and then performing the subsequent processes. Except for the afore-described differences, the three-dimensional semiconductor memory device according to the present embodiment may have substantially the same features as those described with reference to FIG. 26B.

Figure 29:
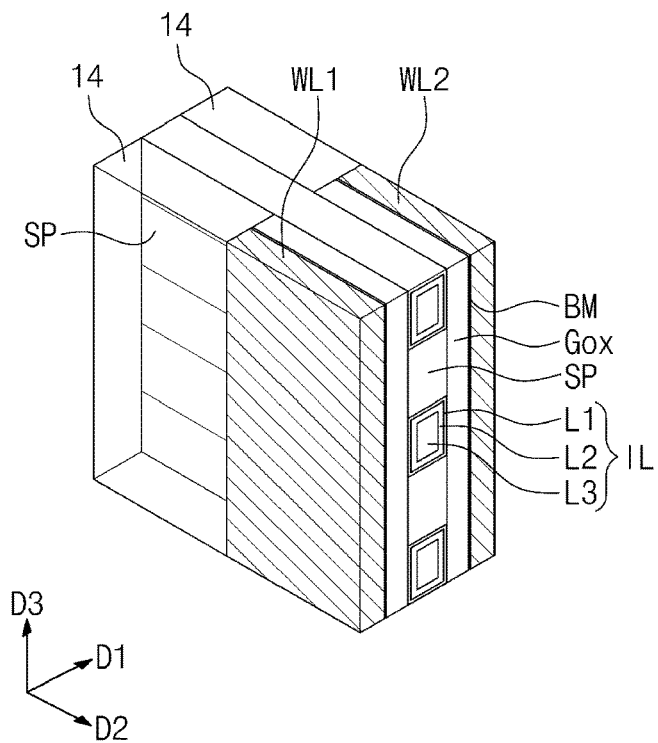

In an alternative example shown in FIG. 29, the interlayered insulating layer IL may include a first insulating layer L1, a second insulating layer L2, and a third insulating layer L3. The second insulating layer L2 may be formed of or include a material different from the first and third insulating layers L1 and L3. The first insulating layer L1 may cover the side surface of the gate insulating layer Gox, the top and bottom surfaces of the semiconductor patterns SP, and the side surface of the second interlayer insulating gap-filling pattern 14. The first insulating layer L1 may be a hollow closed-loop shape, when viewed in a cross-section parallel to the first direction D1. The third insulating layer L3 may be provided to fill spaces between the semiconductor patterns SP. The second insulating layer L2 may be interposed between the first insulating layer L1 and the third insulating layer L3. The process of fabricating the three-dimensional semiconductor memory device of FIG. 29 may be similar to that for the semiconductor memory device of FIG. 28, except that the third insulating layer L3 is additionally formed. Except for the afore-described difference, the three-dimensional semiconductor memory device according to the present embodiment may have substantially the same features as those described with reference to FIG. 28.

Figure 30:
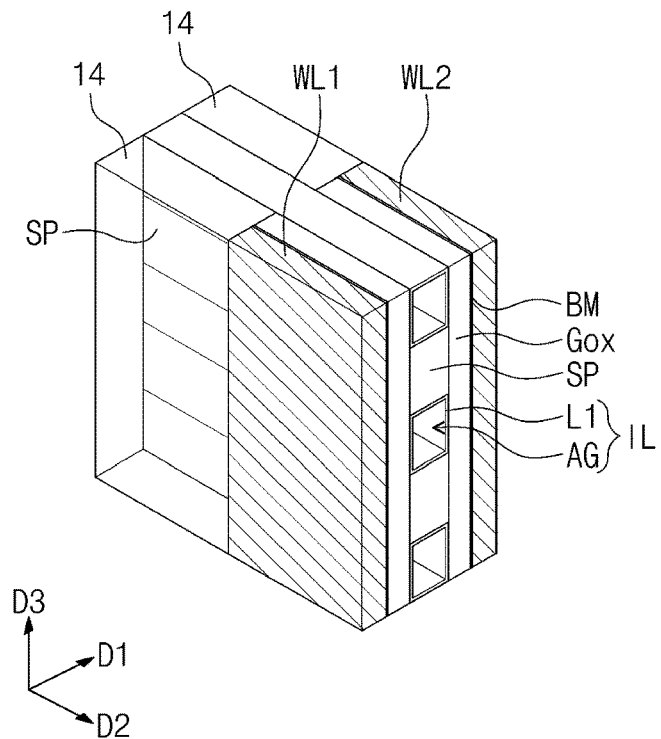

In an alternative example shown in FIG. 30, the interlayered insulating layer IL may include the first insulating layer L1 and the air gap region AG. The three-dimensional semiconductor memory device of FIG. 30 may be fabricated by omitting the process of forming the second insulating layer L2 from the process of fabricating the three-dimensional semiconductor memory device of FIG. 28. Except for the afore-described differences, the three-dimensional semiconductor memory device according to the present embodiment may have substantially the same features as those described with reference to FIG. 28.

Figure 31:
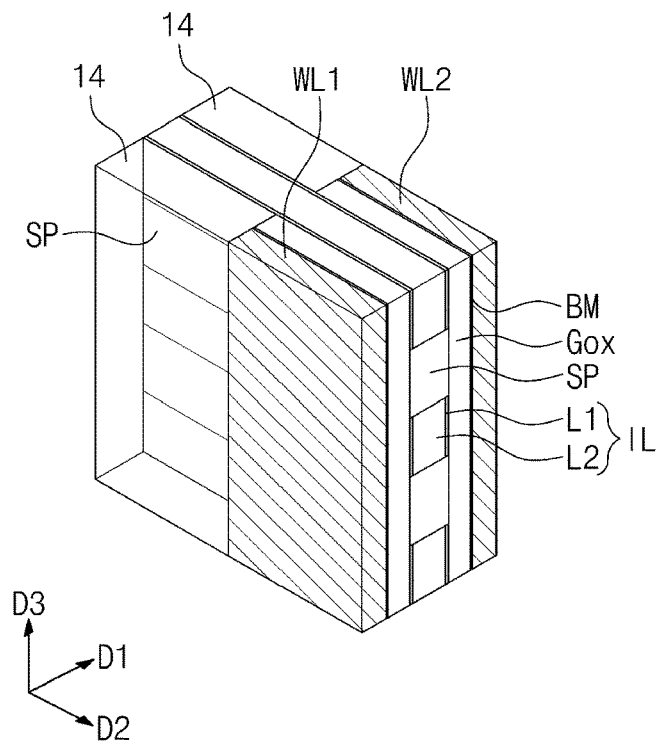

In an alternative example shown in FIG. 31, the interlayered insulating layer IL may include the first insulating layer L1 and the second insulating layer L2. The first insulating layer L1 may cover the side surface of the gate insulating layer Gox and the side surface of the second interlayer insulating gap-filling pattern 14 but may not cover the top surface of the semiconductor pattern SP. The second insulating layer L2 may fill spaces between the semiconductor patterns SP. The three-dimensional semiconductor memory device of FIG. 31 may be fabricated by partially recessing the side surface of the first interlayered insulating layer IL1 in the structure of FIG. 25A, depositing the first insulating layer L1, anisotropically etching the first insulating layer L1 to leave the first insulating layer L1 on the first interlayered insulating layer ILL and then performing the subsequent processes. Except for the afore-described differences, the three-dimensional semiconductor memory device according to the present embodiment may have substantially the same features as those described with reference to FIG. 28.

Figure 32:
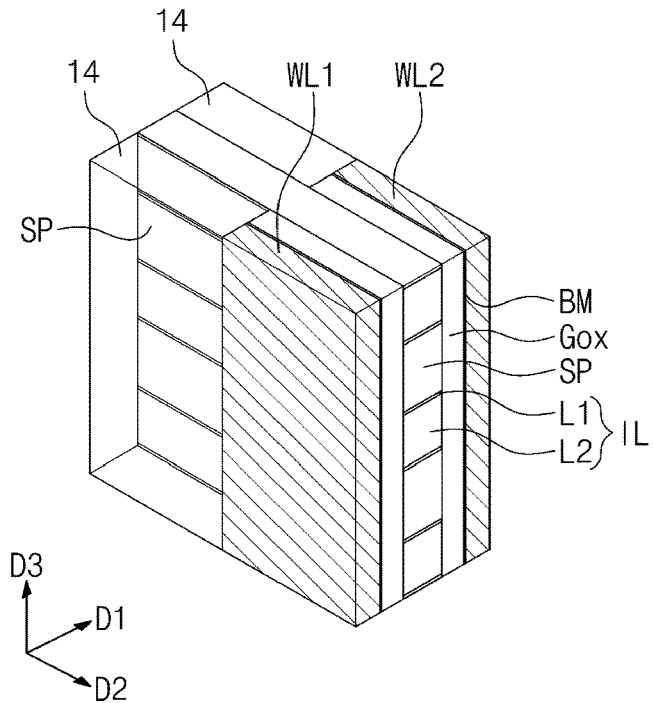

In an alternative example shown in FIG. 32, the interlayered insulating layer IL may include the first insulating layer L1 and the second insulating layer L2. The first insulating layer L1 may be formed on the top and bottom surfaces of the semiconductor pattern SP. The second insulating layer L2 may fill spaces between the semiconductor patterns SP. The three-dimensional semiconductor memory device of FIG. 32 may be fabricated by oxidizing the top and bottom surfaces of the semiconductor layers 5 in the structure of FIG. 27 to form the first insulating layer L1, filling the spaces between the semiconductor patterns SP with the second insulating layer L2, and then, performing the subsequent processes. Except for the afore-described differences, the three-dimensional semiconductor memory device according to the present embodiment may have substantially the same features as those described with reference to FIG. 28.

Figure 33:
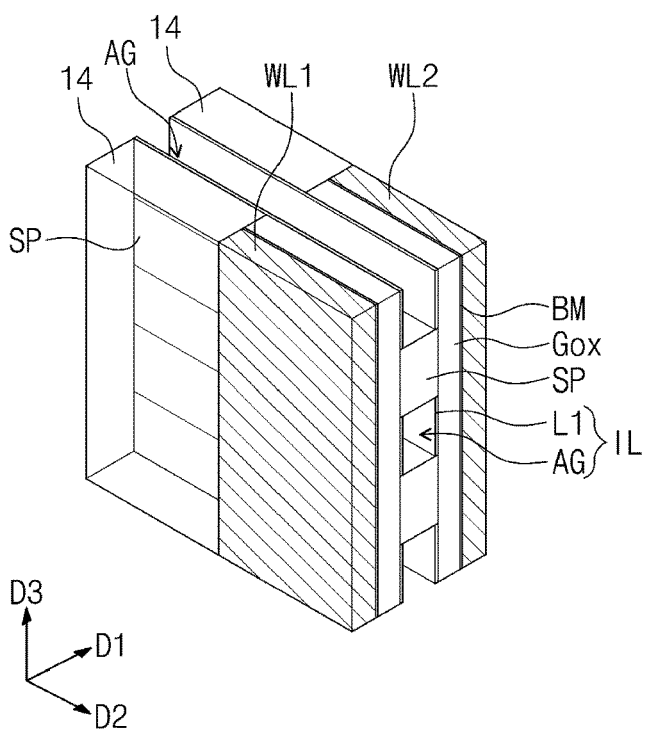

In an alternative example shown in FIG. 33, the interlayered insulating layer IL may include the first insulating layer L1 and the air gap region AG. The three-dimensional semiconductor memory device of FIG. 33 may be fabricated by omitting the process of forming the second insulating layer L2 from the process of fabricating the three-dimensional semiconductor memory device of FIG. 31. Except for the afore-described differences, the three-dimensional semiconductor memory device according to the present embodiment may have substantially the same features as those described with reference to FIG. 31.

Figure 34:
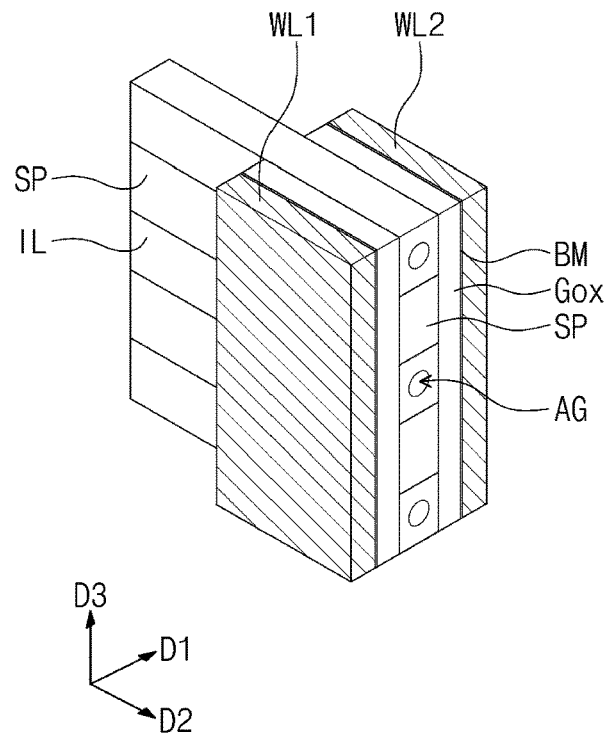
Figure 35:
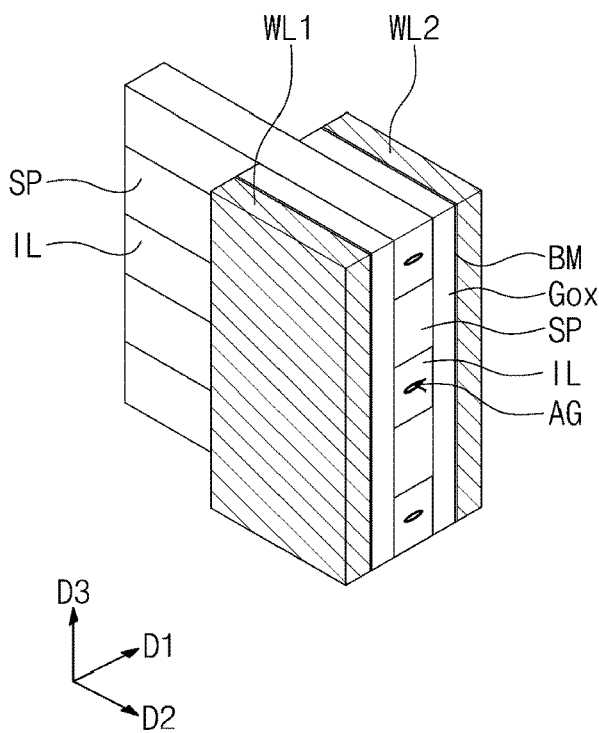
Figure 36:
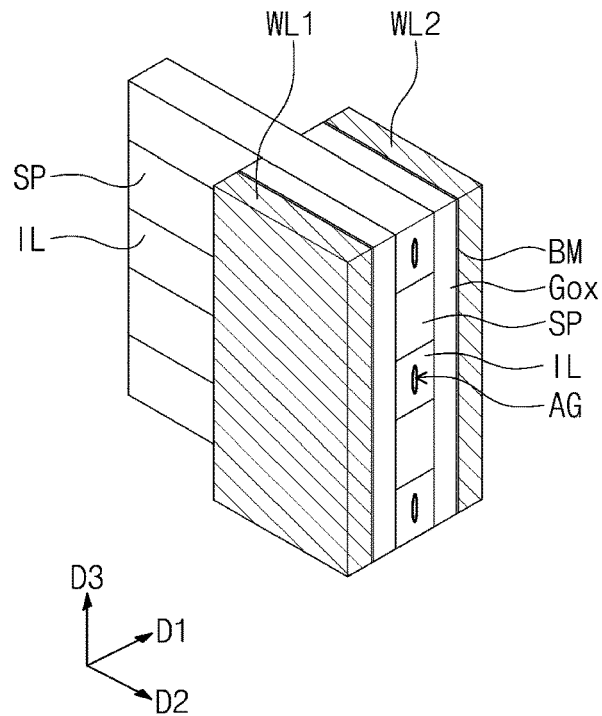
Figure 37:
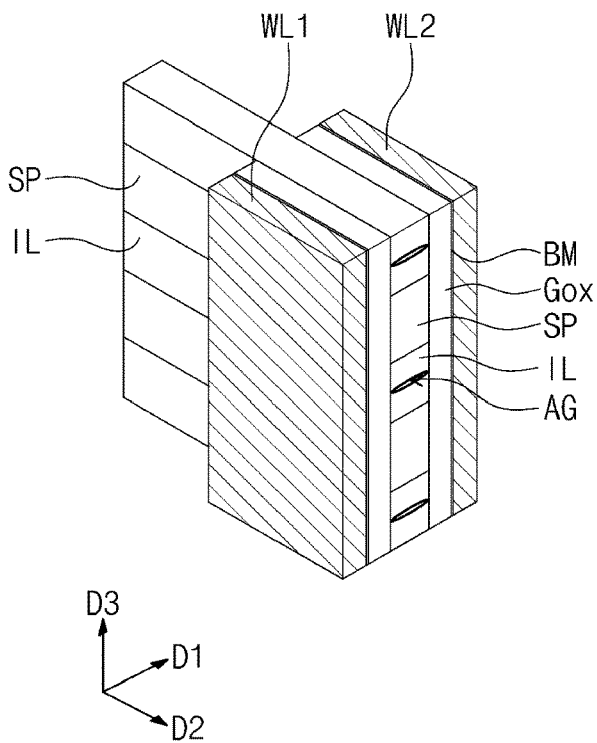

In an alternative example shown in FIGS. 34 to 37, the air gap region AG may be provided in the interlayered insulating layer IL. The air gap region AG may have a circular section, as shown in FIG. 34. In an embodiment, the air gap region AG may have an elliptical section, which is elongated in the first direction D1, as shown in FIG. 35. In an embodiment, the air gap region AG may have an elliptical section, which is elongated in the third direction D3, as shown in FIG. 36. In an embodiment, the air gap region AG may be elongated in the first direction D1 and may expose the side surface of the gate insulating layer Gox, as shown in FIG. 37.

In the three-dimensional semiconductor memory device described with reference to FIGS. 3A to 37, the structure of the interlayered insulating layer IL may be variously changed to realize various three-dimensional semiconductor memory devices with desired characteristics.

FIGS. 38 to 41 are perspective views, each of which illustrates a portion of a three-dimensional semiconductor memory device according to an embodiment.

Figure 38:
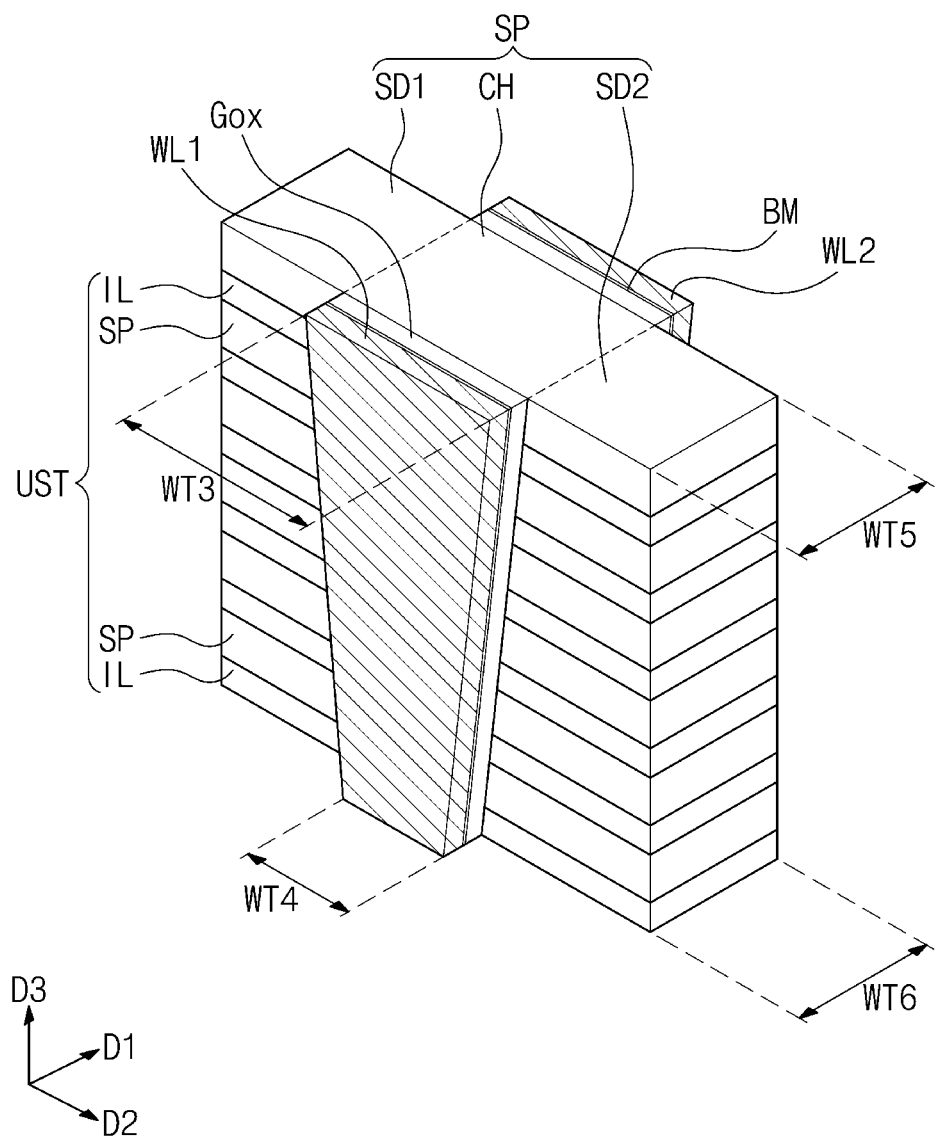
FIGS. 38 to 41 illustrate perspective views of three-dimensional semiconductor memory devices according to embodiments.

Referring to FIG. 38, a unit stack structure UST may include the interlayered insulating layers IL and the semiconductor patterns SP, which are sequentially and alternately stacked. The first and second word lines WL1 and WL2 may be respectively provided adjacent to both side surfaces of the unit stack structure UST and may be extended in the third direction. An upper width WT3 of the first and second word lines WL1 and WL2 measured in the second direction D2 may be greater than a lower width WT4 of the first and second word lines WL1 and WL2 measured in the second direction D2. An upper width WT5 of the unit stack structure UST measured in the first direction D1 may be substantially equal or similar to a lower width WT6 of the unit stack structure UST measured in the first direction D1. Widths of the first and second word lines WL1 and WL2 may increase with increasing distance from the top surface of the substrate 1.

Figure 39:
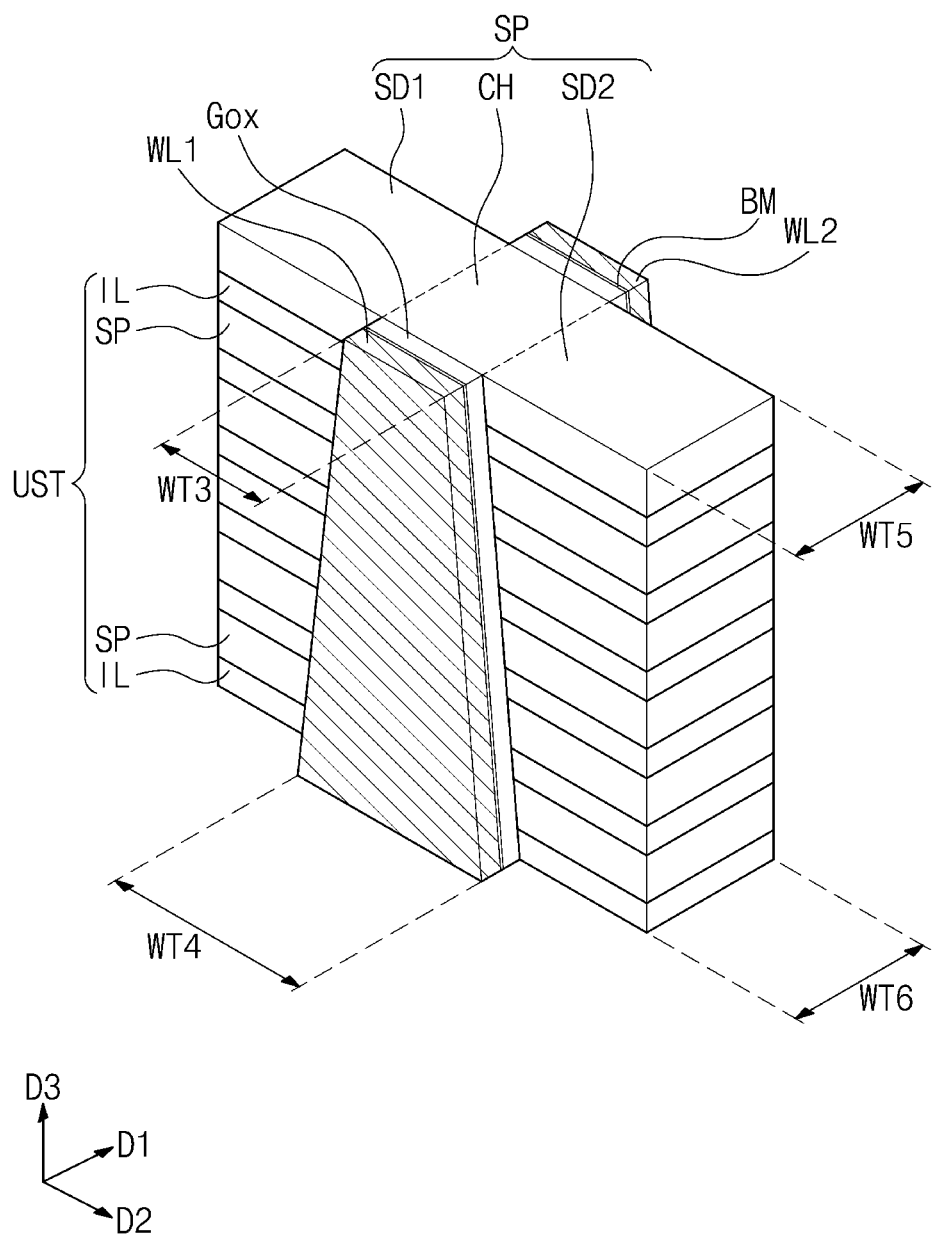

In an alternative example shown in FIG. 39, an upper width WT3 of the first and second word lines WL1 and WL2 measured in the second direction D2 may be smaller than a lower width WT4 of the first and second word lines WL1 and WL2 measured in the second direction D2. An upper width WT5 of the unit stack structure UST measured in the first direction D1 may be substantially equal or similar to a lower width WT6 of the unit stack structure UST measured in the first direction D1. Widths of the first and second word lines WL1 and WL2 may decrease with increasing distance from the top surface of the substrate 1.

Figure 40:
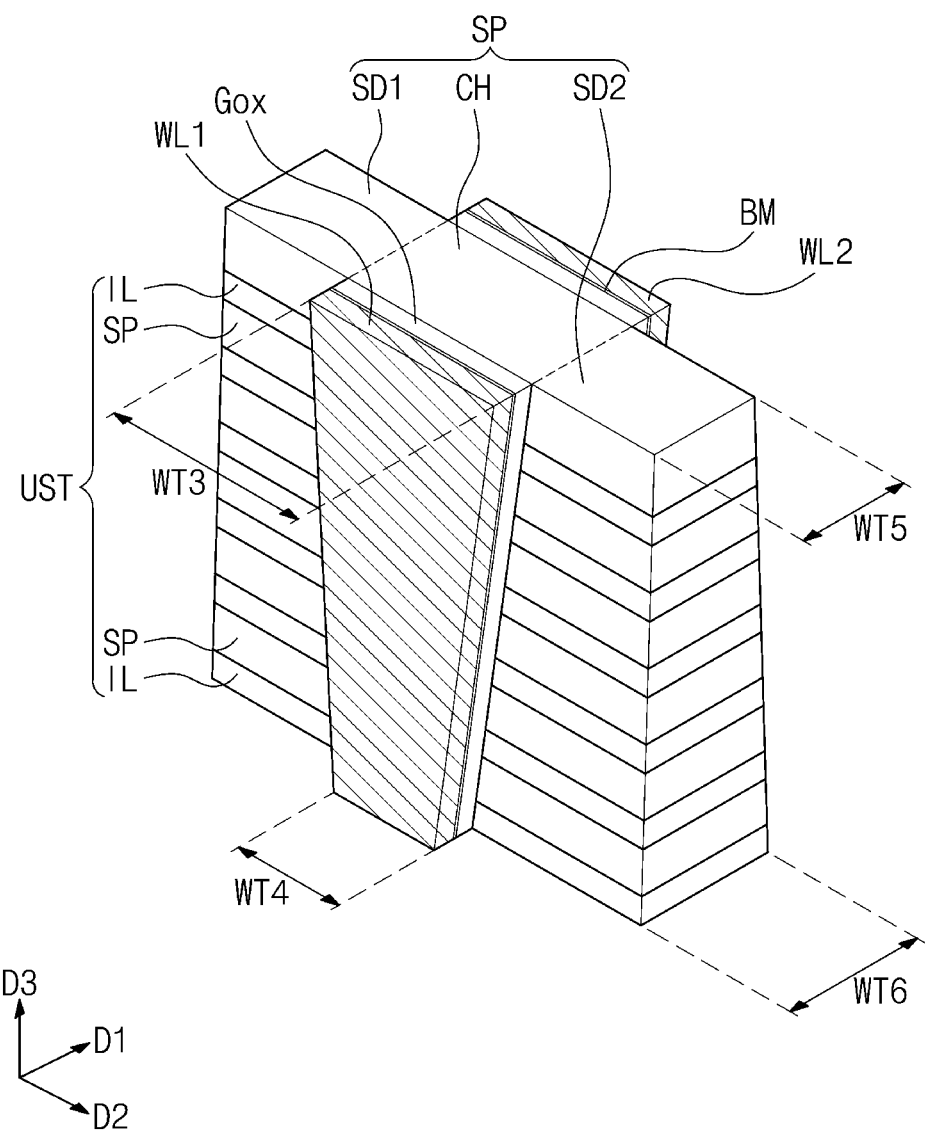

In an alternative example shown in FIG. 40, an upper width WT3 of the first and second word lines WL1 and WL2 measured in the second direction D2 may be greater than a lower width WT4 of the first and second word lines WL1 and WL2 measured in the second direction D2. An upper width WT5 of the unit stack structure UST measured in the first direction D1 may be smaller than a lower width WT6 of the unit stack structure UST measured in the first direction D1. Widths of the first and second word lines WL1 and WL2 may increase with increasing distance from the top surface of the substrate 1. A width of the lowermost one of the semiconductor patterns SP measured in the first direction D1 may be different from a width of the uppermost one of the semiconductor patterns SP measured in the first direction D1.

Figure 41:
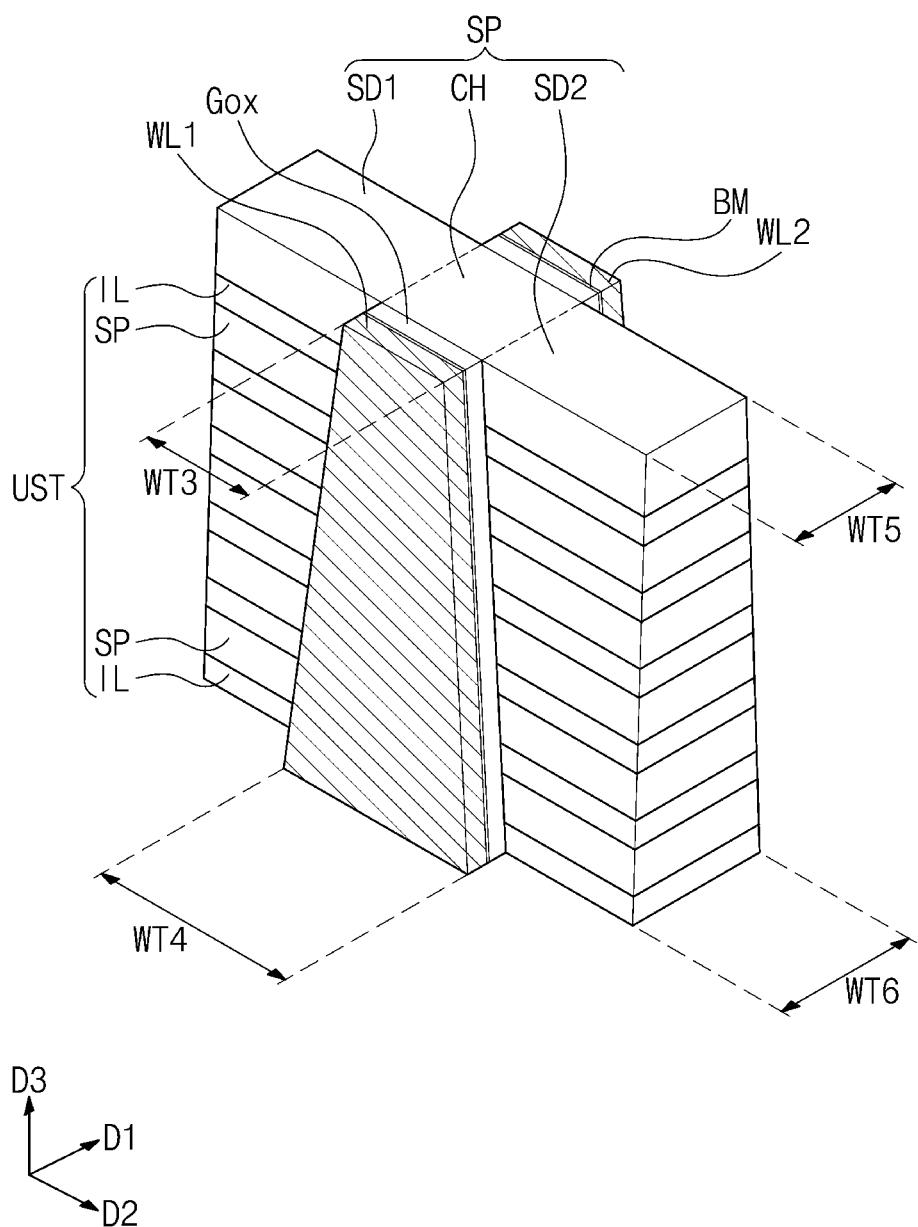

In an alternative example shown in FIG. 41, an upper width WT3 of the first and second word lines WL1 and WL2 measured in the second direction D2 may be smaller than a lower width WT4 of the first and second word lines WL1 and WL2 measured in the second direction D2. An upper width WT5 of the unit stack structure UST measured in the first direction D1 may be smaller than a lower width WT6 of the unit stack structure UST measured in the first direction D1. Widths of the first and second word lines WL1 and WL2 may decrease with increasing distance from the top surface of the substrate 1.

Figure 8A:
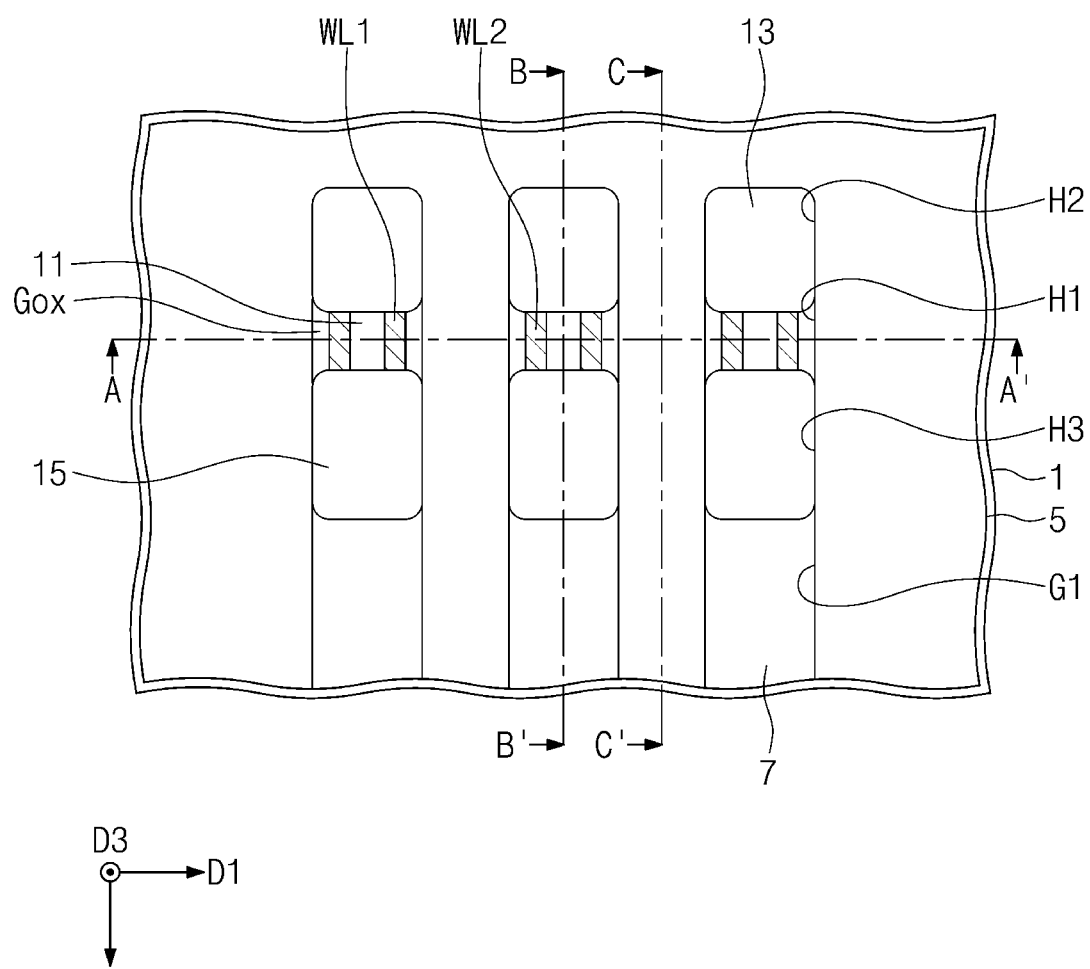
Figure 8B:
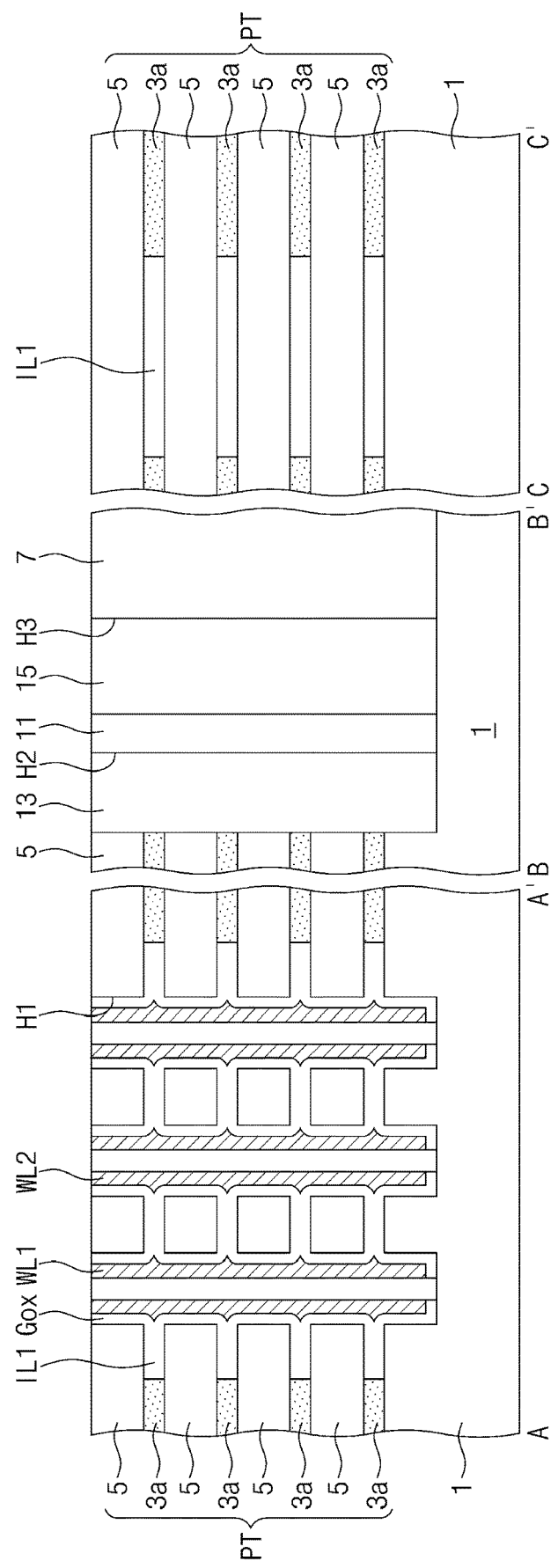
Figure 9A:
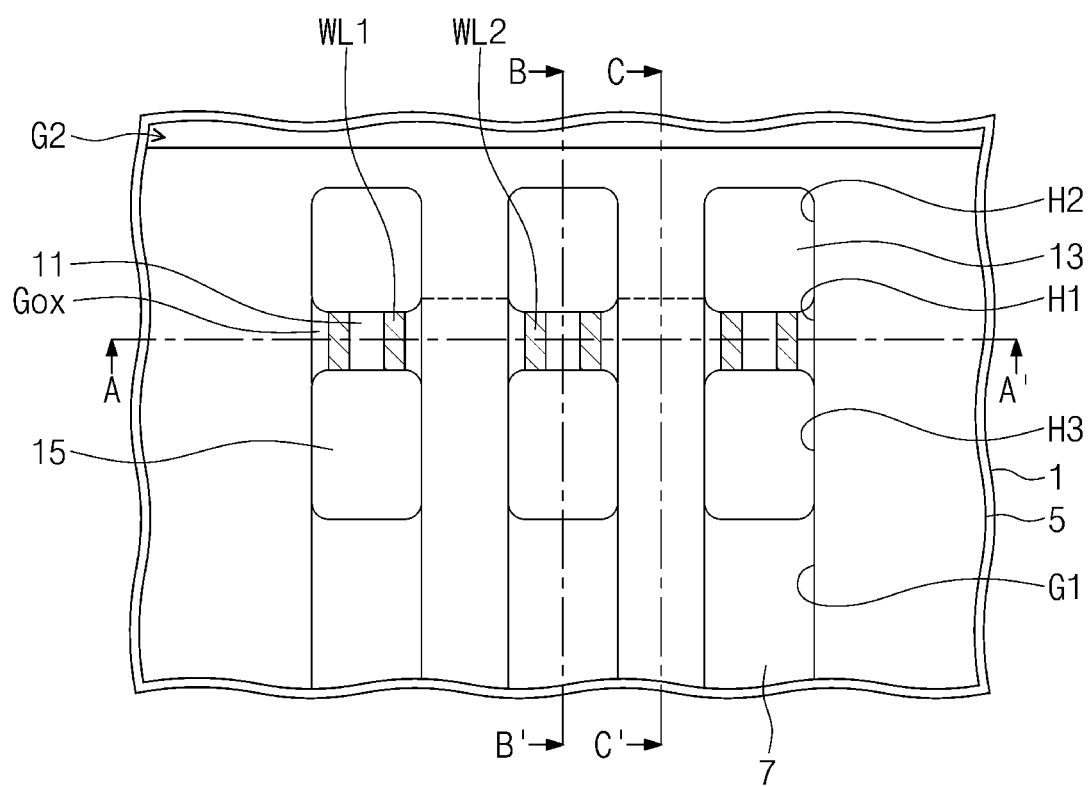
Figure 9A:
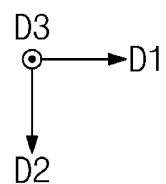
Figure 9B:
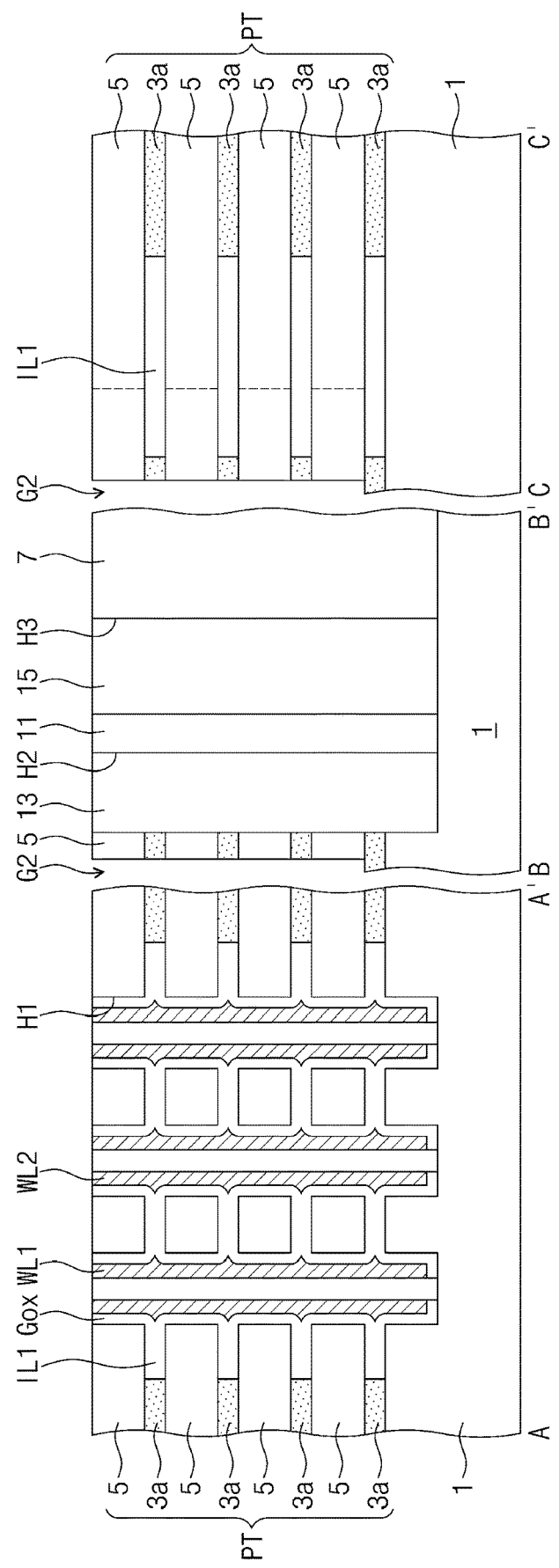
Figure 10A:
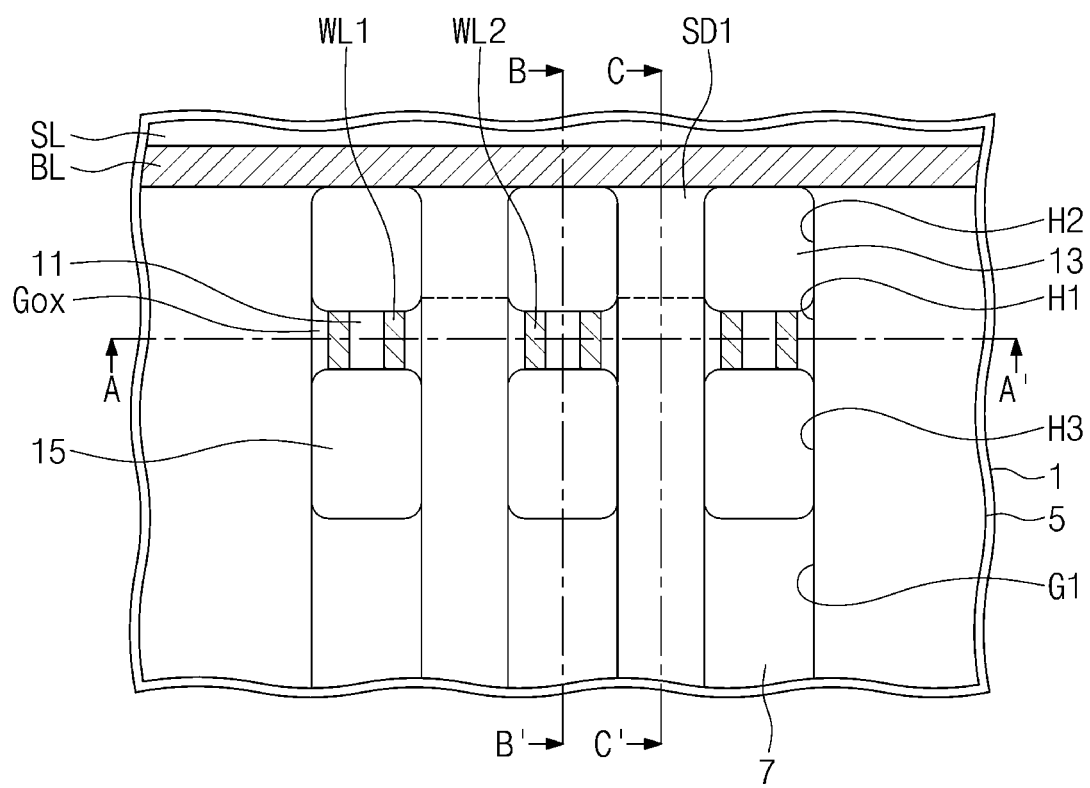
Figure 10A:
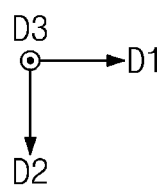
Figure 10B:
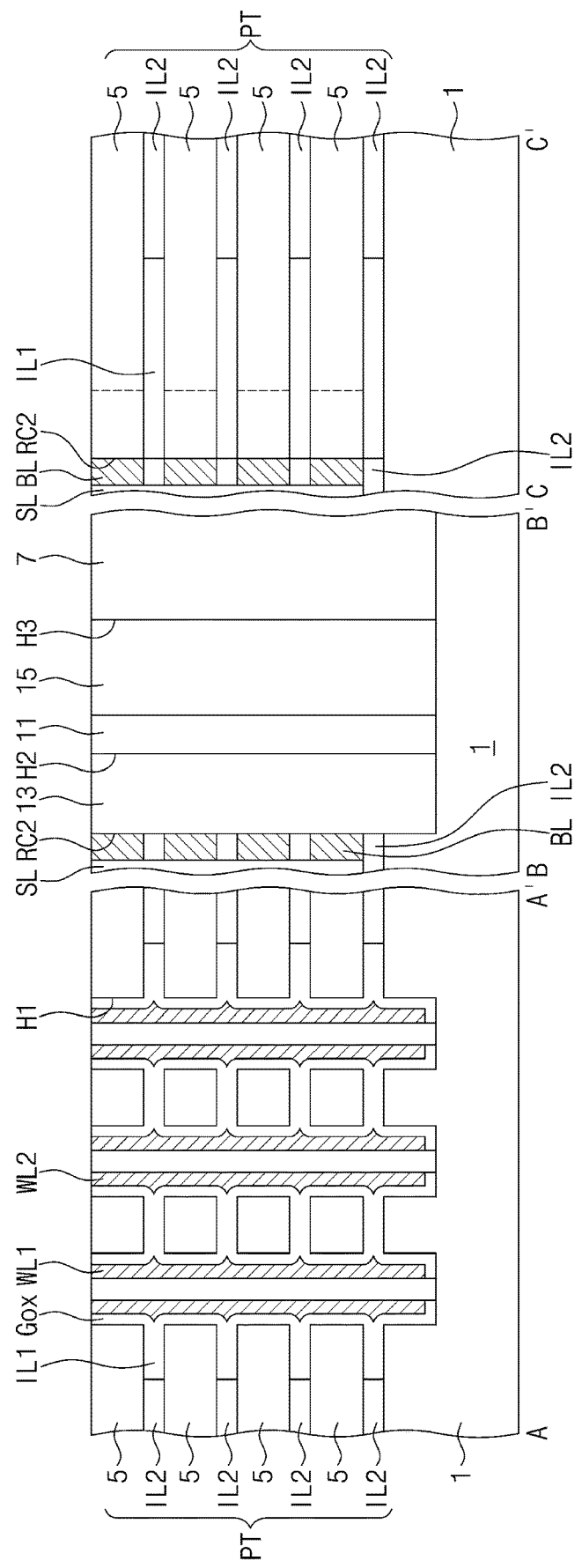

The relationship between the pattern widths in the three-dimensional semiconductor memory devices of FIGS. 38 to 41 may be determined by the process condition for the anisotropic etching process in FIGS. 4B and 8B.

Figure 42:
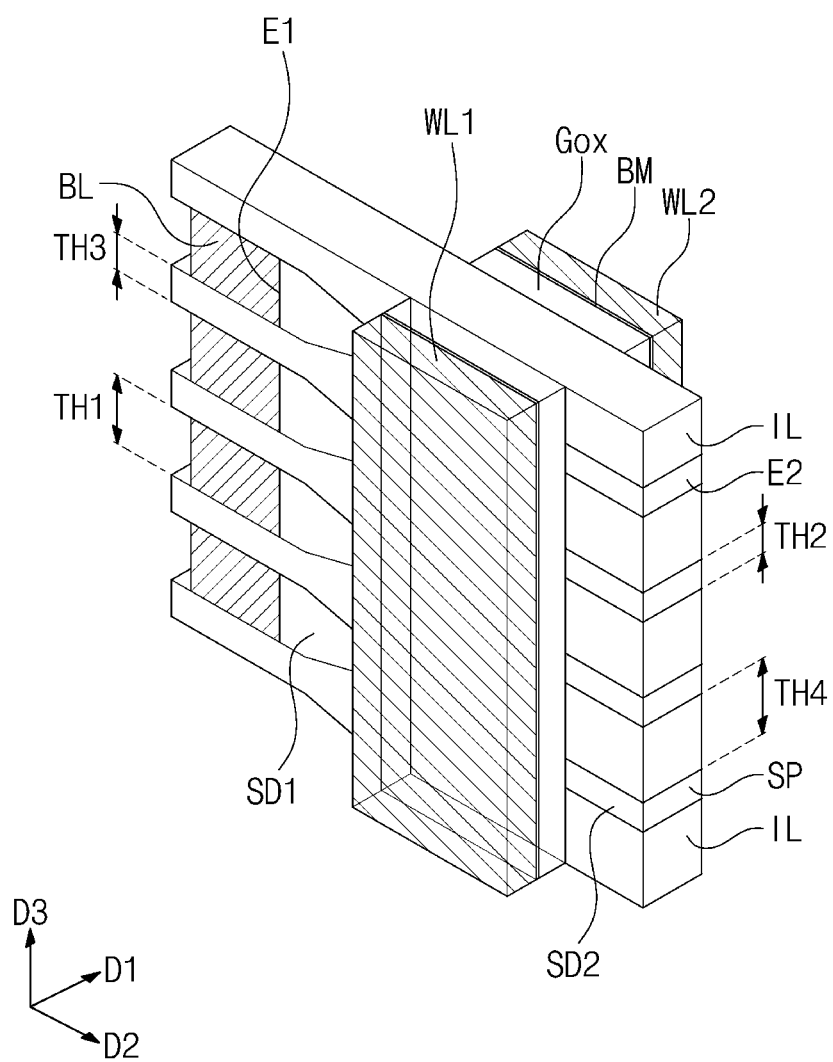
FIGS. 42 and 43 illustrate perspective views of three-dimensional semiconductor memory devices according to embodiment.
Figure 43:
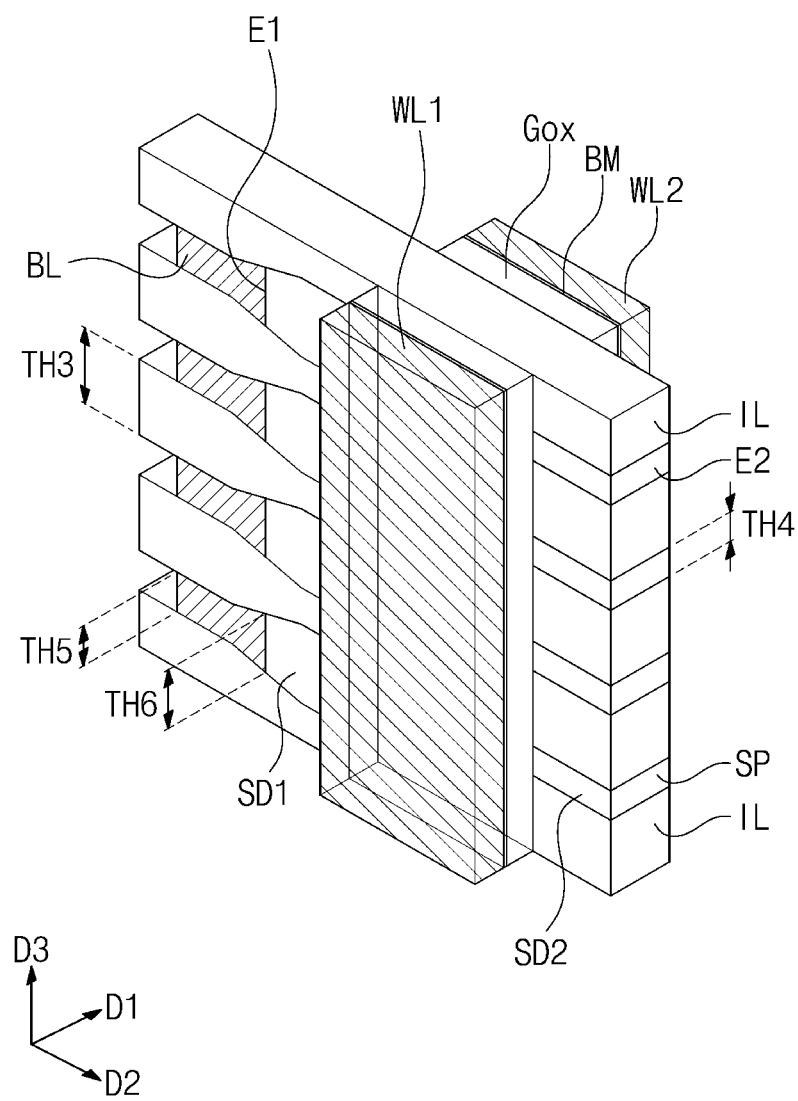

FIGS. 42 and 43 are perspective views, each of which illustrates a portion of a three-dimensional semiconductor memory device according to an embodiment.

Referring to FIG. 42, the bit line BL may have a first thickness TH1. The first end portion E1 of the semiconductor pattern SP, which is in contact with the bit line BL, may have the first thickness TH1. The second end portion E2 of the semiconductor pattern SP, which is opposite to the first end portion E1, may have a second thickness TH2. The first thickness TH1 may be greater than the second thickness TH2. The thickness of the semiconductor pattern SP may be reduced with increasing distance from the first end portion E1 in a direction toward the first and second word lines WL1 and WL2. The interlayered insulating layer IL may have a third thickness TH3 at a position adjacent to the bit line BL. The interlayered insulating layer IL may have a fourth thickness TH4 at a position adjacent to the second end portion E2. The third thickness TH3 may be smaller than the fourth thickness TH4. The three-dimensional semiconductor memory device of FIG. 42 may be fabricated by etching portions of the semiconductor layers 5 in the step of FIG. 27 and performing the subsequent processes.

In an alternative example shown in FIG. 43, the interlayered insulating layer IL may have a third thickness TH3 at a position adjacent to the bit line BL. The interlayered insulating layer IL may have a fourth thickness TH4 at a position adjacent to the second end portion E2. The third thickness TH3 may be greater than the fourth thickness TH4. The bit line BL may have a fifth thickness TH5 at a position spaced apart from the first end portion E1 of the semiconductor pattern SP. The bit line BL may have a sixth thickness TH6 at a position in contact with the first end portion E1 of the semiconductor pattern SP. The fifth thickness TH5 may be smaller than the sixth thickness TH6. The three-dimensional semiconductor memory device of FIG. 43 may be fabricated by thickly forming the first interlayered insulating layer IL1 or the second interlayered insulating layer IL2 in the step of FIG. 10B and performing the subsequent processes.

Figure 44:
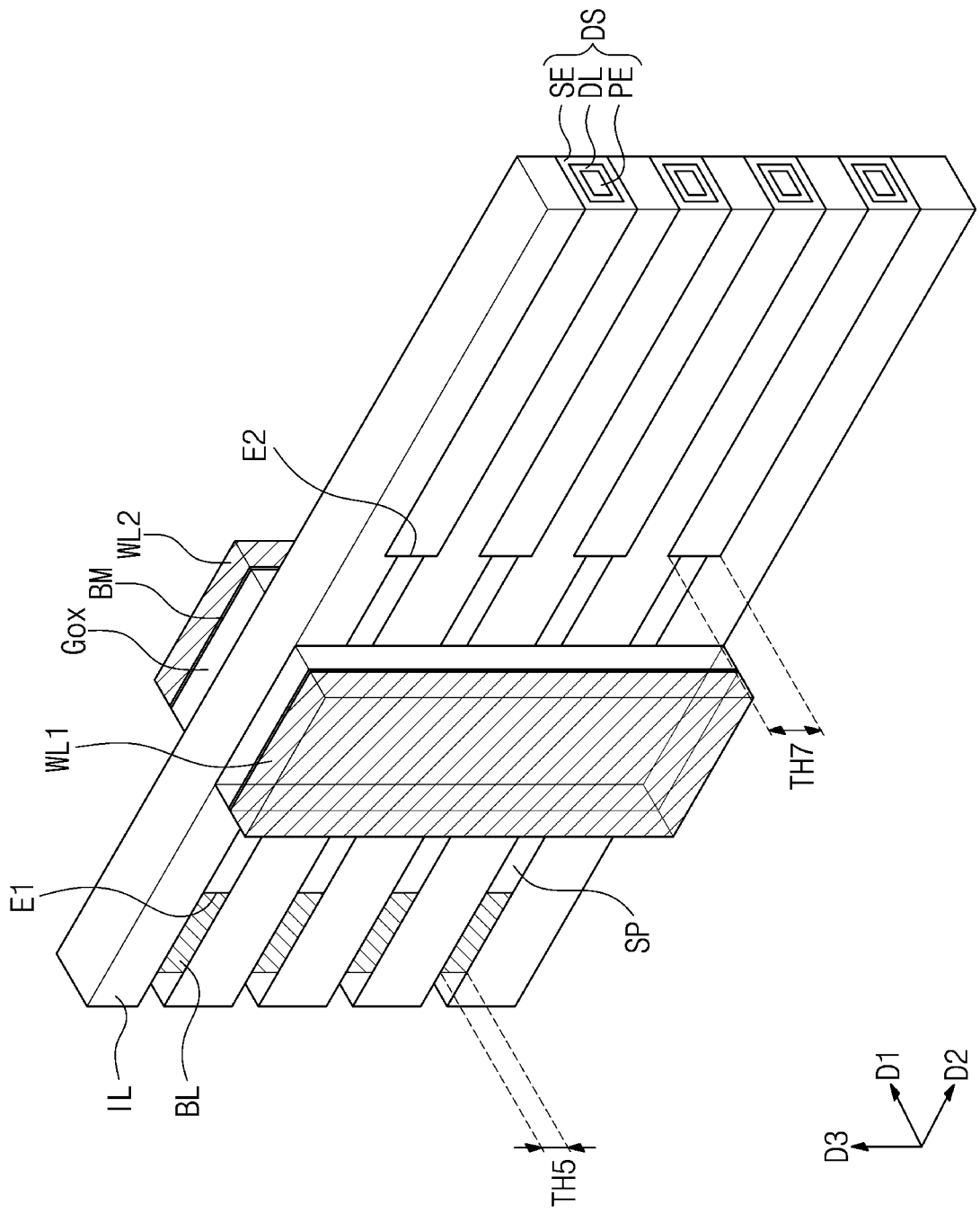
FIGS. 44 and 45 illustrate perspective views of three-dimensional semiconductor memory devices according to embodiment.
Figure 45:
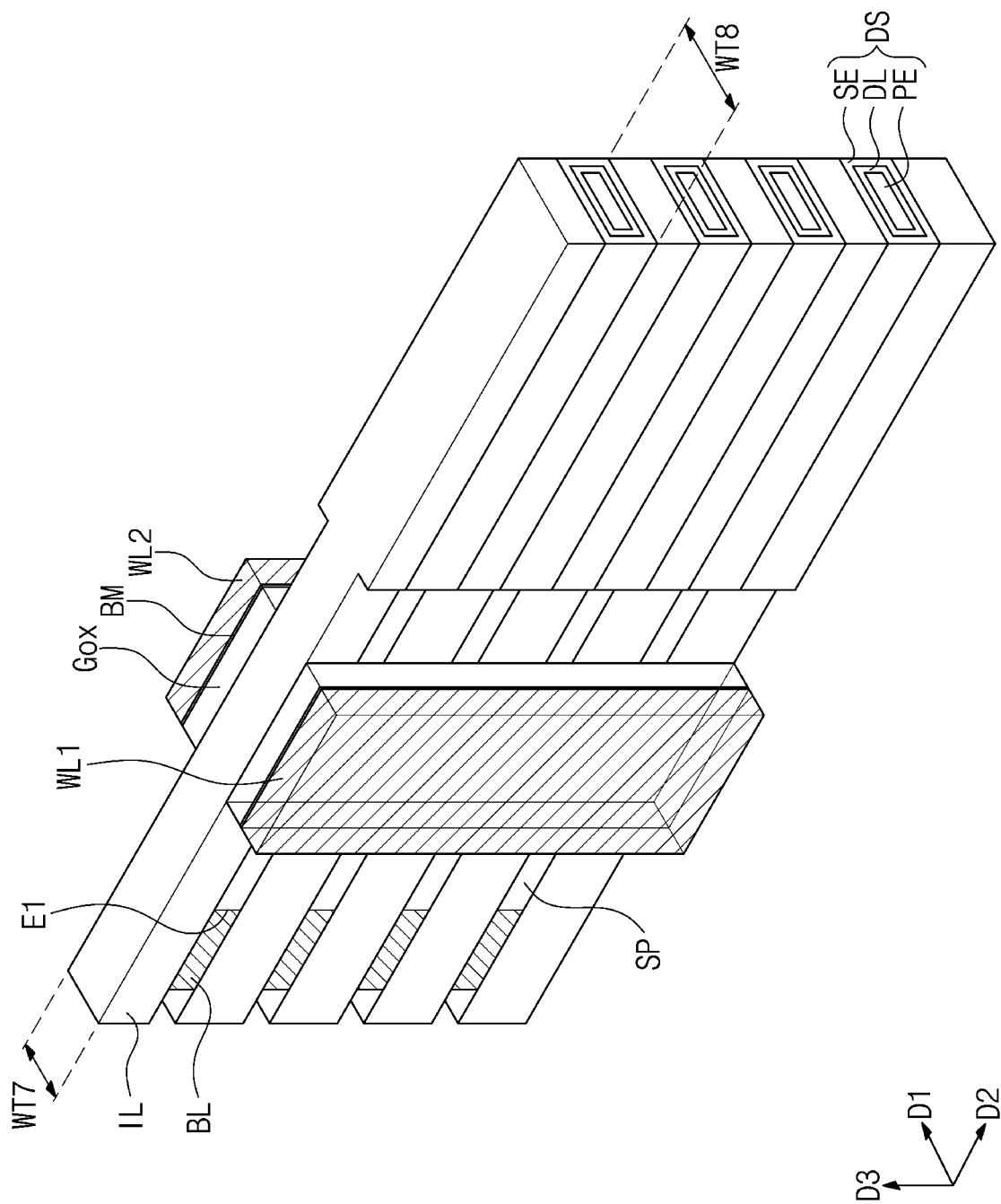

FIGS. 44 and 45 are perspective views, each of which illustrates a portion of a three-dimensional semiconductor memory device according to an embodiment.

Referring to FIG. 44, the first end portion E1 of the semiconductor pattern SP may be in contact with the bit line BL, and the second end portion E2 of the semiconductor pattern SP may be in contact with the data storage electrode SE. The data storage electrode SE may have a hollow cylinder shape. An internal space of the data storage electrode SE may be conformally covered with the dielectric layer DL and may be filled with the plate electrode PE. The bit line BL may have a fifth thickness TH5 at a position spaced apart from the first end portion E1. The data storage electrode SE may have a seventh thickness TH7 at a position in contact with the second end portion E2. The seventh thickness TH7 may be greater than the fifth thickness TH5. The three-dimensional semiconductor memory device of FIG. 44 may be fabricated by removing portions of the interlayered insulating layer IL through an isotropic etching process in the step of FIG. 19B and performing the subsequent processes.

In an alternative example shown in FIG. 45, the bit line BL may have a seventh width WT7 at a position spaced apart from the first end portion E1, when measured in the first direction D1. The data storage electrode SE may have an eighth width WT8, when measured in the first direction D1. The eighth width WT8 may be greater than the seventh width WT7.

Figure 46:
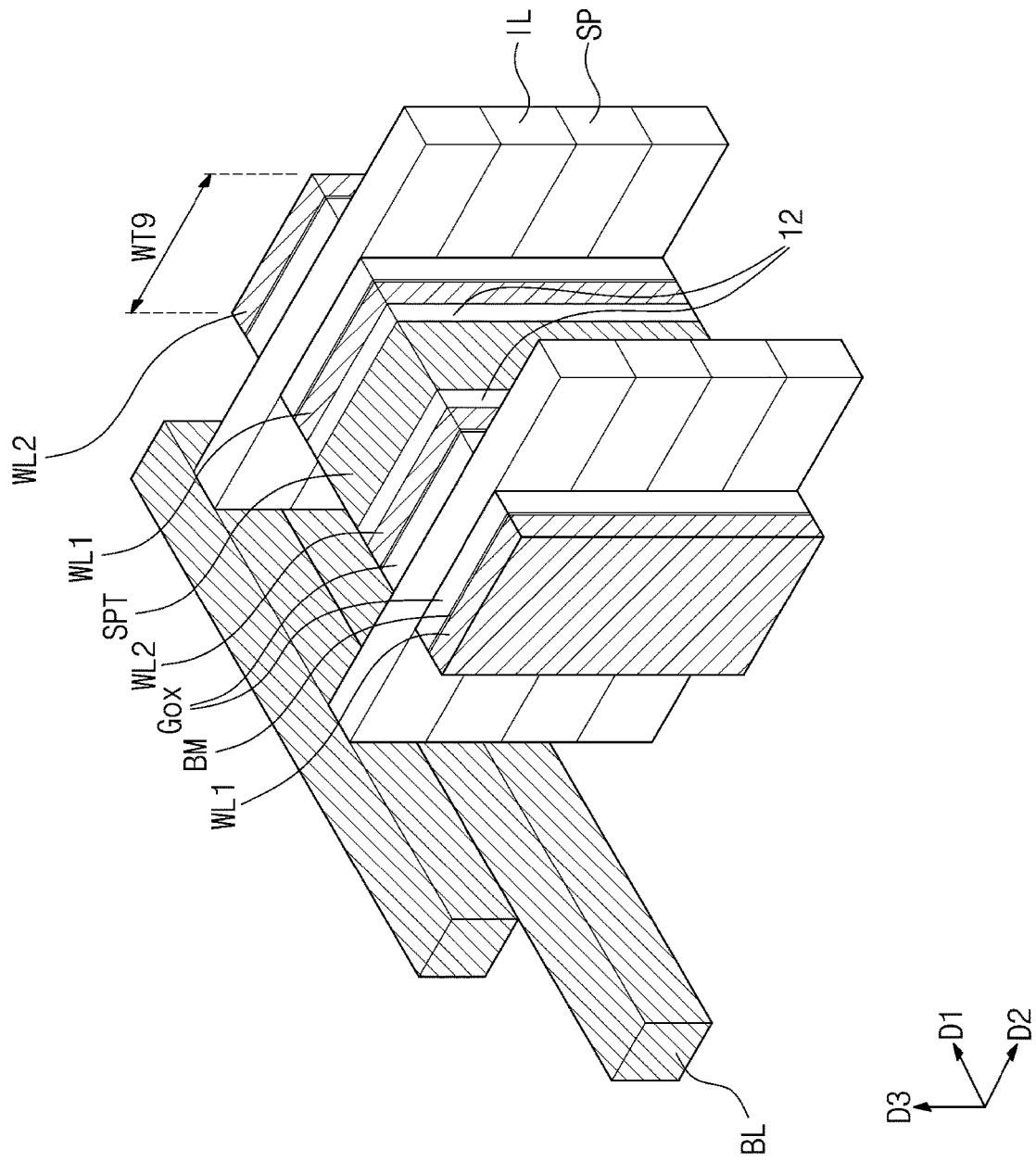
FIG. 46 illustrates a perspective view of a portion of a three-dimensional semiconductor memory device according to an embodiment.

FIG. 46 is a perspective view illustrating a portion of a three-dimensional semiconductor memory device according to an embodiment.

Referring to FIG. 46, a shielding line SPT may be interposed between the first and second word lines WL1 and WL2 which are adjacent to each other. The shielding line SPT may be formed of or include at least one of metallic materials, such as tungsten, copper, and aluminum. The shielding line SPT may include a poly-silicon layer that is doped with impurities. The shielding line SPT may be formed of or include a conductive material. The shielding line SPT may be electrically disconnected from the first and second word lines WL1 and WL2 by the first interlayer insulating gap-filling pattern 12. The shielding line SPT may be applied with a ground voltage or a voltage of 0 V. The shielding line SPT may suppress or reduce an electric interference issue between the first and second word lines WL1 and WL2 which are adjacent to each other. The side surface of the shielding line SPT may be aligned to the side surfaces of the first word line WL1, the second word line WL2, and the first interlayer insulating gap-filling pattern 12. The shielding line SPT, the first word line WL1, the second word line WL2, and the first interlayer insulating gap-filling pattern 12 may be parallel to the second direction D2 and may have the same width W9.

Figure 47A:
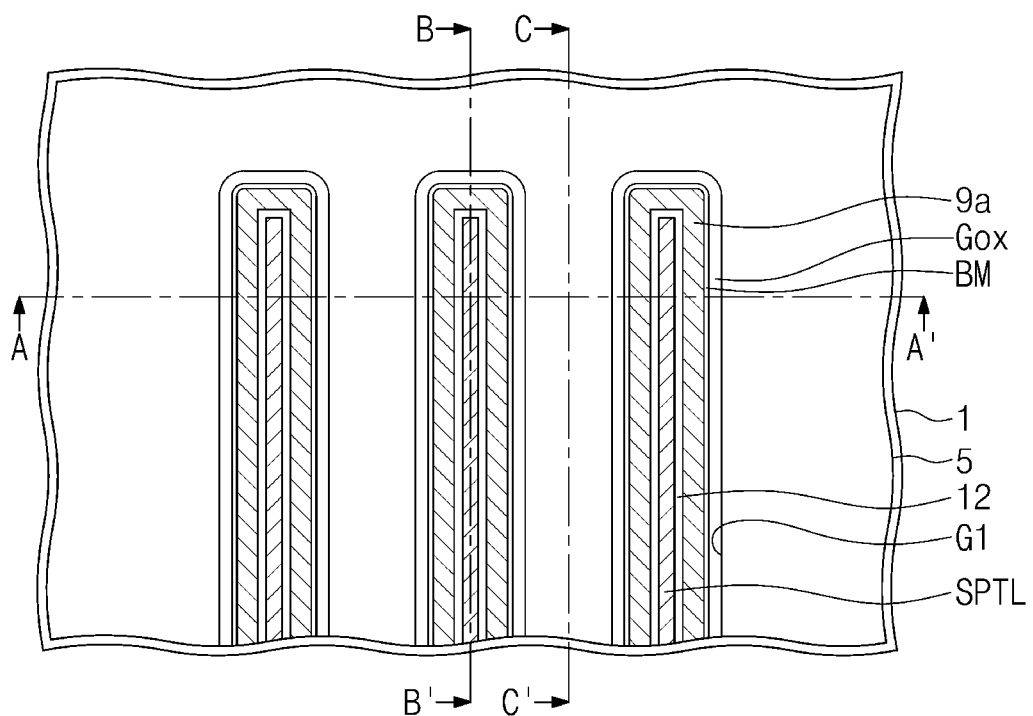
FIG. 47A illustrates a plan view of a process of fabricating the three-dimensional semiconductor memory device of FIG. 46.
Figure 47A:
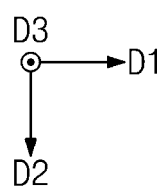
Figure 47B:
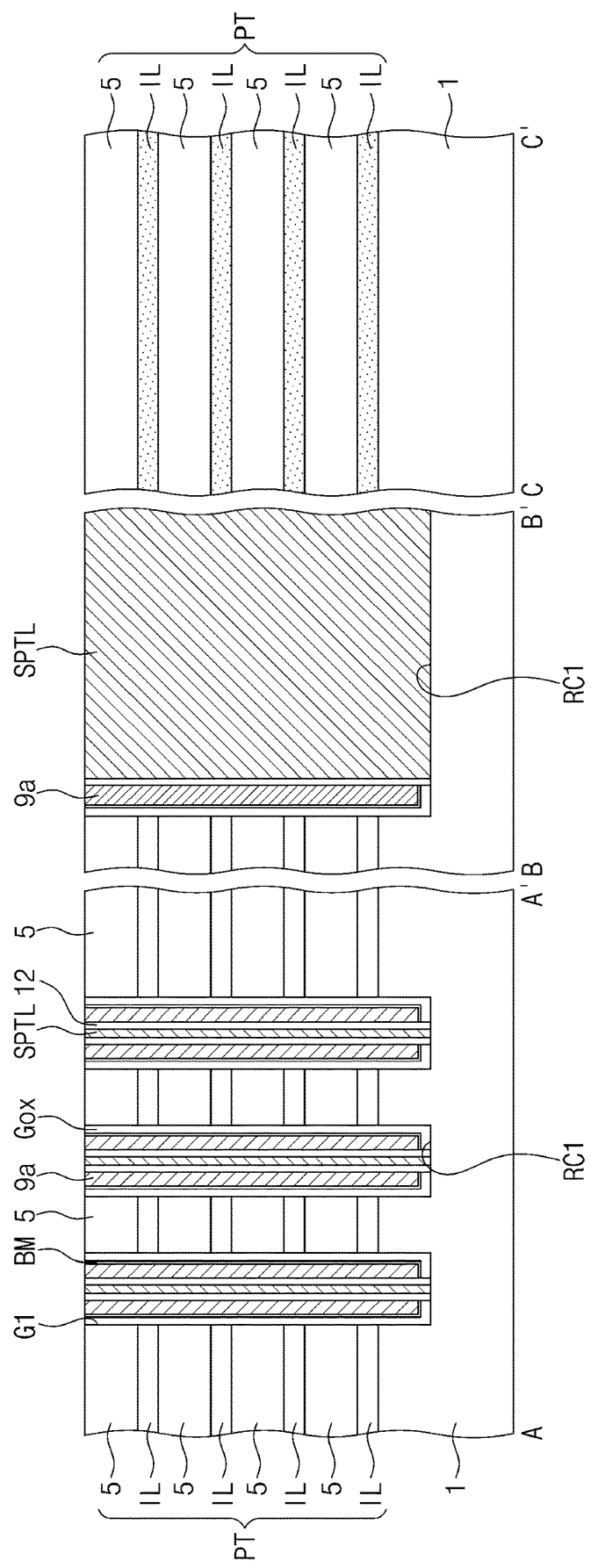
FIG. 47B illustrates a cross-sectional view along lines A-A', B-B', and C-C' of FIG. 47A.

FIG. 47A is a plan view illustrating a process of fabricating the three-dimensional semiconductor memory device of FIG. 46. FIG. 47B is a sectional view illustrating cross-sections of a three-dimensional semiconductor memory device, taken along lines A-A', B-B', and C-C' of FIG. 47A.

Referring to FIGS. 47A and 47B, the gate insulating layer Gox, the diffusion barrier layer BM, and the word line layer may be formed to conformally cover the first grooves G1, which are formed to have the structure shown in FIGS. 15A and 15B, and an anisotropic etching process may be performed to form the preliminary word line pattern 9a and to expose a central region of a bottom surface of the first recess region RC1. The first interlayer insulating gap-filling pattern 12 may be formed to cover an inner side surface of the preliminary word line pattern 9a and to expose the central region of the bottom surface of the first recess region RC1. Thereafter, a shielding layer SPTL in contact with the first interlayer insulating gap-filling pattern 12 may be formed to fill the first groove G1. Next, during the process of etching the preliminary word line pattern 9a to form the word lines WL1 and WL2 (e.g., see FIGS. 17A and 17B), the shielding layer SPTL, along with the preliminary word line pattern 9a, may be etched to form the shielding line SPT.

Figure 48A:
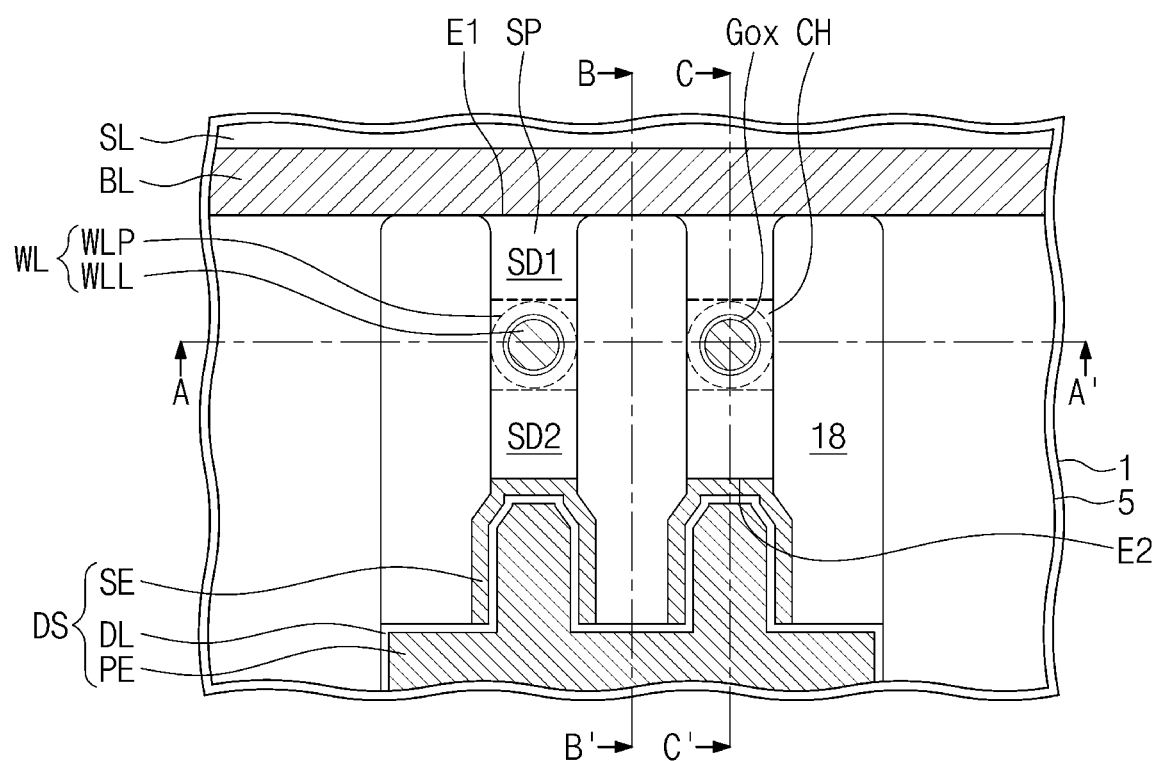
FIG. 48A illustrates a plan view of a three-dimensional semiconductor memory device according to an embodiment.
Figure 48A:
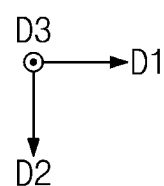
Figure 48B:
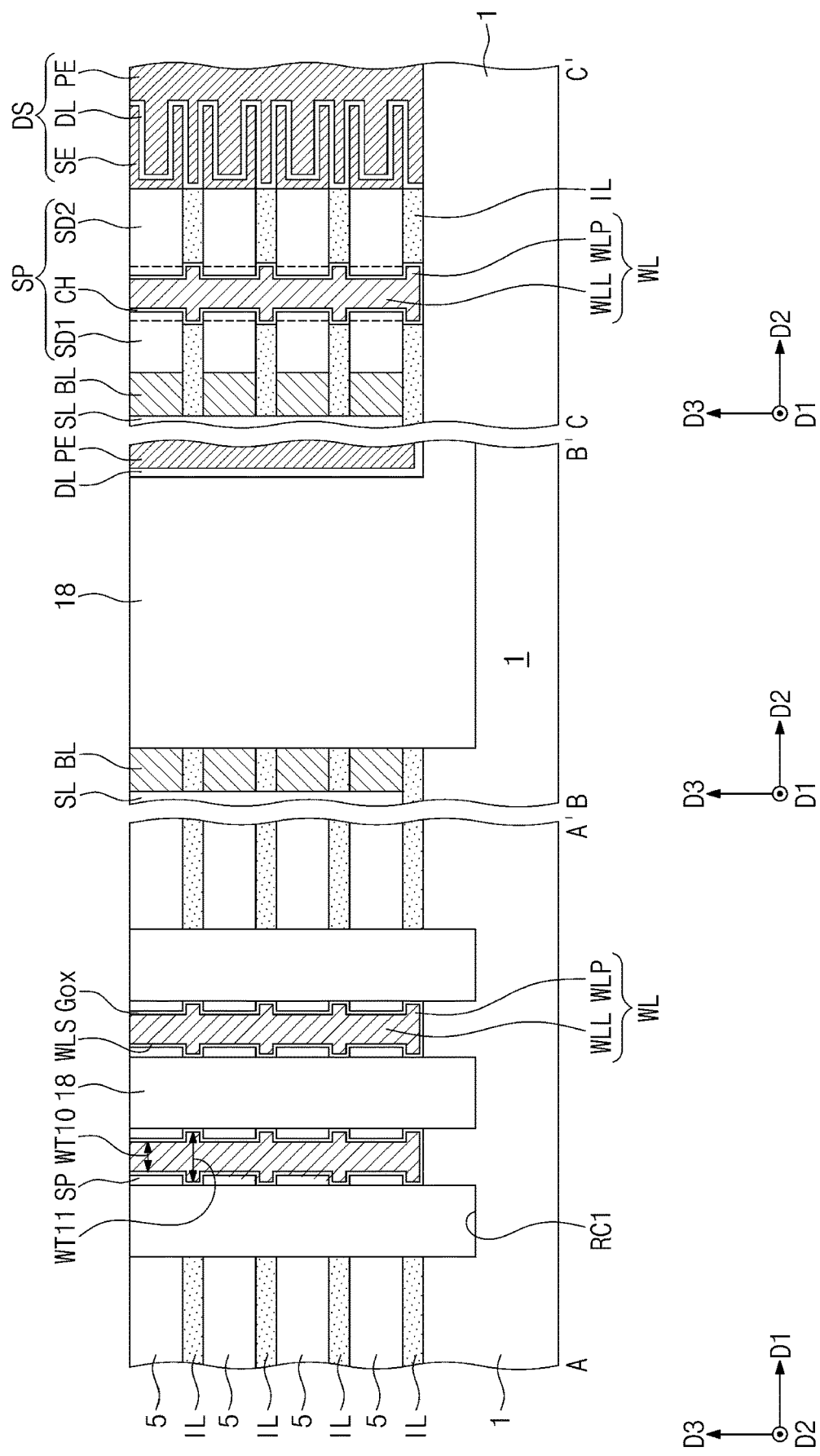
FIG. 48B illustrates a cross-sectional view along lines A-A', B-B', and C-C' of FIG. 48A.
Figure 48C:
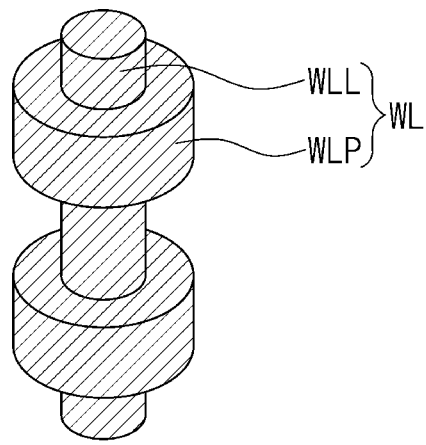
FIG. 48C illustrates a perspective view of a word line in FIG. 48B.

FIG. 48A is a plan view illustrating a three-dimensional semiconductor memory device according to an embodiment. FIG. 48B is a sectional view illustrating cross-sections of a three-dimensional semiconductor memory device, taken along lines A-A', B-B', and C-C' of FIG. 48A. FIG. 48C is a perspective view illustrating a word line of FIG. 48B, according to an embodiment.

Referring to FIGS. 48A to 48C, the word line WL may penetrate the channel regions CH of the semiconductor patterns SP and the interlayered insulating layers IL interposed therebetween. The gate insulating layer Gox may be interposed between the word line WL and the semiconductor patterns SP and between the word line WL and the interlayered insulating layers IL. The word line WL may include a word line portion WLL, which is extended from the top surface of the substrate 1 in the third direction D3, and word line protruding portions WLP, which protrude from a side surface WLS of the word line portion WLL toward the interlayered insulating layers IL and are spaced apart from each other. When viewed in a plan view, the word line portion WLL may have a circular shape (e.g., see FIG. 48A) or an elliptical, square, or rectangular shape. When viewed in a plan view, the word line protruding portion WLP may have a ring shape, as shown in FIG. 48A or 48C. In the section A-A' of FIG. 48B, the word line WL may have a tenth width WT10 at heights of the semiconductor patterns SP and may have an eleventh width WT11, which is larger than the tenth width WT10, at heights of the interlayered insulating layers IL.

As shown in FIG. 48A, an insulating gap-filling pattern 18 may be interposed between the semiconductor patterns SP in the first direction D1. Except for the afore-described differences, the three-dimensional semiconductor memory device according to the present embodiment may have substantially the same features as those described with reference to FIGS. 3A to 3C. Since the word line WL has the word line protruding portion WLP, the channel controllability may be improved.

Figure 49A:
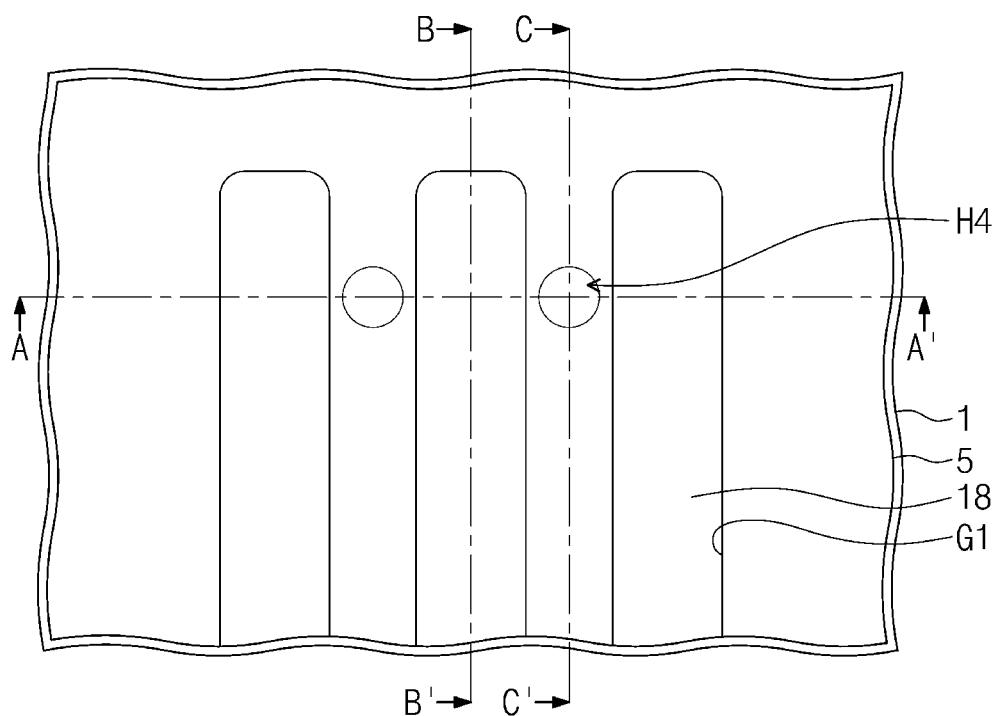
FIGS. 49A and 50A illustrate plan views of stages in a process of fabricating the three-dimensional semiconductor memory device in FIG. 48A.
Figure 49A:
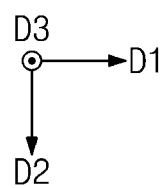
Figure 49B:
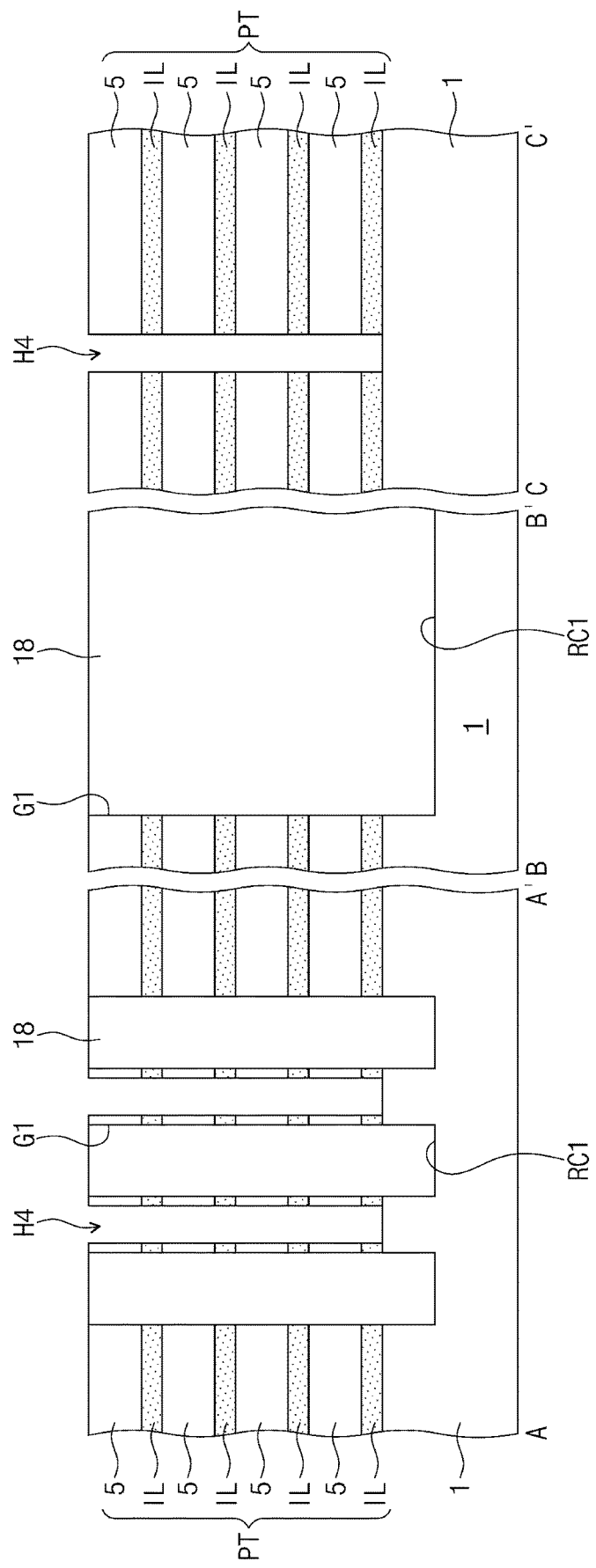
FIGS. 49B and 50B illustrate cross-sectional views along lines A-A', B-B', and C-C' of FIGS. 49A and 50A, respectively.
Figure 50A:
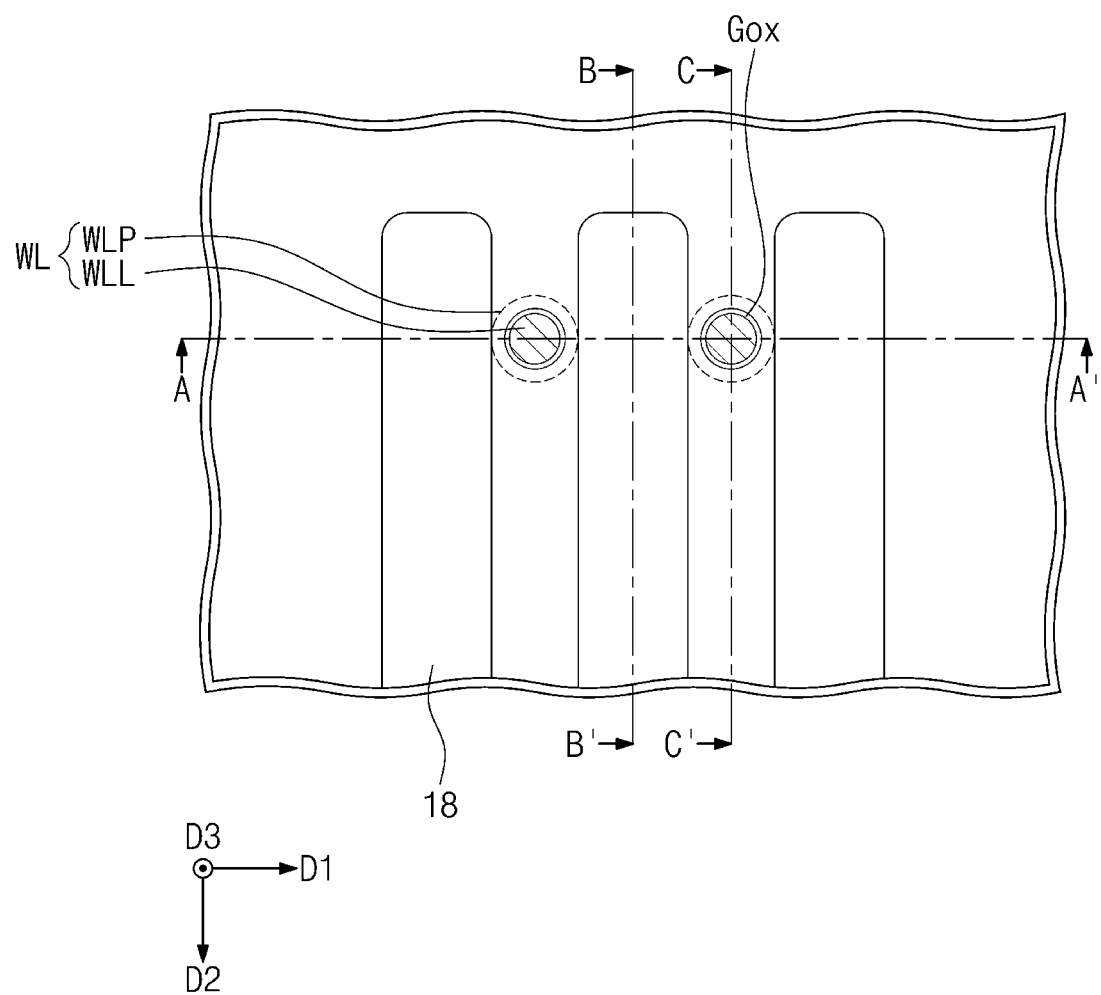
Figure 50B:
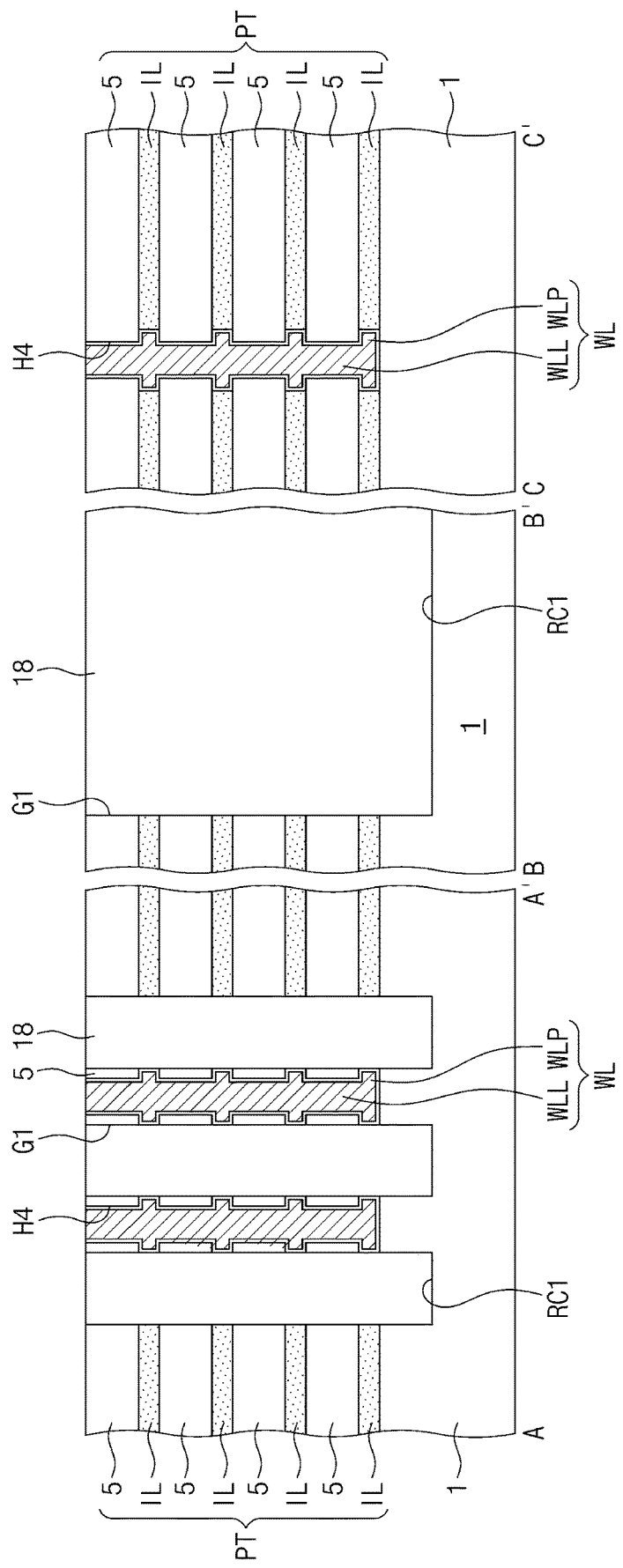

FIGS. 49A and 50A are plan views sequentially illustrating a process of fabricating a three-dimensional semiconductor memory device having the planar structure shown in FIG. 48A. FIGS. 49B and 50B are sectional views, each of which illustrates cross-sections of a three-dimensional semiconductor memory device, taken along lines A-A', B-B', and C-C' of FIGS. 49A and 50A, respectively.

Referring to FIGS. 49A and 49B, the first grooves G1 may be formed to have the same structure as that shown in FIGS. 15A and 15B. The first grooves G1 may be filled with the insulating gap-filling pattern 18. The preliminary stack structure PT between the insulating gap-filling patterns 18 may be etched to form a fourth hole H4 exposing the top surface of the substrate 1. The fourth hole H4 may be formed to be spaced apart from the insulating gap-filling pattern 18.

Referring to FIGS. 49A, 49B, 50A, and 50B, an isotropic etching process may be performed to partially remove the interlayered insulating layers IL exposed through the fourth hole H4. Then, the gate insulating layer Gox may be conformally formed, and the word line WL may be formed by filling the fourth hole H4 with a conductive layer. Except for the afore-described differences, the fabrication process according to the present embodiment may have substantially the same features as those described above process.

The embodiments described with reference to FIGS. 2 to 50B may be combined. For example, the shielding line SPT of FIG. 46 may be provided between adjacent ones of the first and second word lines WL1 and WL2 in the embodiments of FIGS. 3A to 45 or adjacent ones of the word lines WL in the embodiments of FIG. 48A. The width and thickness relationships described with reference to FIGS. 38 to 45 may be applied to the embodiments described with reference to FIGS. 3A to 37 and FIGS. 46 and 48A. In the embodiments of FIGS. 38 to 48B, the interlayered insulating layers IL may have the same structure as one of the structures described with reference to FIGS. 3A to 37.

In a three-dimensional semiconductor memory device according to an embodiment, an interlayered insulating layer may be provided in various structures, and this makes it possible to diversify the performance of the three-dimensional semiconductor memory device. Furthermore, word lines may be provided adjacent to top and bottom surfaces of a semiconductor pattern to improve a channel controllability property. Accordingly, it may be possible to improve the reliability of the three-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a substrate;
   first semiconductor patterns, which are vertically stacked on the substrate and are spaced apart from each other along a vertical direction, each of the first semiconductor patterns including:
      a first end portion and a second end portion spaced apart from each other, and
      a first side surface and a second side surface spaced apart from each other, each of the first and second sides surfaces connecting the first end portion to the second end portion;
   a first source/drain region and a second source/drain region in each of the first semiconductor patterns, the first and second source/drain regions being respectively adjacent to the first and second end portions;
   a channel region in each of the first semiconductor patterns, the channel region being between the first and second source/drain regions;
   a first word line adjacent to the first side surfaces of the first semiconductor patterns and the channel regions, the first word line extending in the vertical direction perpendicular to a top surface of the substrate;
   a gate insulating layer between the first word line and the first side surfaces of the first semiconductor patterns, the gate insulating layer extending between first source/drain regions of adjacent first semiconductor patterns;
   second semiconductor patterns, which are vertically stacked on the substrate and are spaced apart from each other and from the first semiconductor patterns, the second semiconductor patterns including third side surfaces, respectively, which are adjacent to the first side surfaces of the first semiconductor patterns;
   a second word line adjacent to the third side surfaces of the second semiconductor patterns, the second word line extending in the vertical direction perpendicular to the top surface of the substrate; and
   a shielding line between the first and second word lines, the shielding line being spaced apart from the first and second word lines.

2. The device as claimed in claim 1, wherein the gate insulating layer fills a space between the adjacent first semiconductor patterns.

3. The device as claimed in claim 1, further comprising an air gap region, the air gap region being between the adjacent first semiconductor patterns to expose the gate insulating layer.

4. The device as claimed in claim 1, wherein a portion of the first word line extends between the adjacent first semiconductor patterns.

5. The device as claimed in claim 4, wherein the first word line includes a void between the adjacent first semiconductor patterns.

6. The device as claimed in claim 1, further comprising an interlayered insulating layer between the adjacent first semiconductor patterns, the interlayered insulating layer being in contact with the gate insulating layer, and is formed of a material different from the gate insulating layer.

7. The device as claimed in claim 1, wherein the first word line, the second word line, and the shielding line are parallel to the vertical direction and have a same width.

8. The device as claimed in claim 1, wherein an upper width of the first word line measured in a first direction is different from a lower width of the first word line measured in the first direction, the first direction being parallel to the top surface of the substrate.

9. The device as claimed in claim 8, wherein a width of a lowermost one of the first semiconductor patterns measured in a second direction is different from a width of an uppermost one of the first semiconductor patterns measured in the second direction, the second direction being parallel to the top surface of the substrate and different from the first direction.

10. The device as claimed in claim 1, wherein, in each of the first semiconductor patterns, the first end portion has a first thickness, the second end portion has a second thickness, and the first thickness is different from the second thickness in the vertical direction.

11. The device as claimed in claim 1, further comprising bit lines in contact with the first end portions of the first semiconductor patterns, respectively, the bit lines extending in a second direction parallel to the top surface of the substrate, wherein each of the bit lines has a first thickness at a position in contact with the first end portions and has a second thickness, which is different from the first thickness, at a position spaced apart from the first end portions.

12. The device as claimed in claim 1, further comprising data storage electrodes in contact with the second end portions of the first semiconductor patterns, respectively, a thickness of the data storage electrodes being different from a thickness of the first semiconductor patterns.

13. The device as claimed in claim 1, wherein:

the third side surfaces of the second semiconductor patterns and the first side surfaces of the first semiconductor patterns face each other without other semiconductor patterns therebetween, the third side surfaces being spaced apart from the first side surfaces along a first direction parallel to the substrate, and the first and second word lines are spaced apart from each other along the first direction, while being between the third side surfaces and the first side surfaces.

14. A three-dimensional semiconductor memory device, comprising:

at least one first semiconductor pattern and at least one second semiconductor pattern on a substrate, the at least one first semiconductor pattern and the at least one second semiconductor pattern being spaced apart from each other in a first direction;

a first word line between the at least one first semiconductor pattern and the at least one second semiconductor pattern, the first word line being adjacent to the at least one first semiconductor pattern;

a second word line between the at least one first semiconductor pattern and the at least one second semiconductor pattern, the second word line being adjacent to the at least one second semiconductor pattern; and a shielding line between the first and second word lines, the shielding line being insulated from the first and second word lines.

15. The device as claimed in claim 14, wherein each of the first word line, the second word line, and the shielding line extends from a top surface of the substrate in a vertical direction, and a side surface of the shielding line is aligned with side surfaces of the first and second word lines.

16. The device as claimed in claim 14, wherein:

the at least one first semiconductor pattern includes a plurality of first semiconductor patterns stacked on the substrate and spaced apart from each other, each of the plurality of first semiconductor patterns includes a first end portion and a second end portion, which are spaced apart from each other, the device further includes:

a first source/drain region and a second source/drain region in each of the plurality of first semiconductor patterns, the first and second source/drain regions being adjacent to the first and second end portions, respectively;

a channel region in each of the plurality of first semiconductor patterns, the channel region being between the first and second source/drain regions;

a first interlayered insulating layer between the channel regions of the plurality of first semiconductor patterns; and a second interlayered insulating layer between the first source/drain regions or between the second source/drain regions of the plurality of first semiconductor patterns, the first interlayered insulating layer including a material different from that of the second interlayered insulating layer.

17. The device as claimed in claim 14, wherein the at least one first semiconductor pattern includes a plurality of first semiconductor patterns, which are stacked on the substrate and are spaced apart from each other, and the device further includes spaces between adjacent ones of the plurality of first semiconductor patterns, the spaces exposing top and bottom surfaces of the first semiconductor patterns.

18. The device as claimed in claim 14, wherein the at least one first semiconductor pattern includes a plurality of first semiconductor patterns, which are stacked on the substrate and are spaced apart from each other, and the device further includes a gate insulating layer covering top, bottom, and side surfaces of the plurality of first semiconductor patterns.

19. The device as claimed in claim 18, wherein the gate insulating layer fills a space between adjacent ones of the plurality of first semiconductor patterns.

* * * * *